US011380803B2

(12) United States Patent
Chen et al.

(10) Patent No.: US 11,380,803 B2
(45) Date of Patent: Jul. 5, 2022

(54) SEMICONDUCTOR DEVICE STRUCTURE AND METHOD FOR FORMING THE SAME

(71) Applicant: TAIWAN SEMICONDUCTOR MANUFACTURING CO., LTD., Hsinchu (TW)

(72) Inventors: Hou-Yu Chen, Zhubei (TW); Chao-Ching Cheng, Hsinchu (TW); Tzu-Chiang Chen, Hsinchu (TW); Yu-Lin Yang, Baoshan Township, Hsinchu County (TW); I-Sheng Chen, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 97 days.

(21) Appl. No.: 16/837,051

(22) Filed: Apr. 1, 2020

(65) Prior Publication Data
US 2020/0227570 A1    Jul. 16, 2020

Related U.S. Application Data

(63) Continuation-in-part of application No. 15/798,228, filed on Oct. 30, 2017, now Pat. No. 10,868,127.

(51) Int. Cl.
*H01L 29/78* (2006.01)
*H01L 29/786* (2006.01)
(Continued)

(52) U.S. Cl.
CPC .. *H01L 29/78696* (2013.01); *H01L 29/42392* (2013.01); *H01L 29/66795* (2013.01); *H01L 29/785* (2013.01)

(58) Field of Classification Search
CPC ........... H01L 27/0924; H01L 21/31051; H01L 27/0207; H01L 29/0649; H01L 21/32115; H01L 21/823828; H01L 29/66681; H01L 21/823821; H01L 29/0657; H01L 29/4966; H01L 29/0882; H01L 29/66545;
(Continued)

(56) References Cited

U.S. PATENT DOCUMENTS 8,536,029 B1   9/2013 Chang et al.
9,209,247 B2   12/2015 Colinge et al.
(Continued)

OTHER PUBLICATIONS

U.S. Appl. No. 15/798,228, filed Oct. 30, 2017.
(Continued)

*Primary Examiner* — Moin M Rahman
(74) *Attorney, Agent, or Firm* — Birch, Stewart, Kolasch & Birch, LLP

(57) ABSTRACT

A semiconductor device structure is provided. The semiconductor device structure includes an isolation layer formed over a substrate, and a plurality of nanostructures formed over the isolation layer. The semiconductor device structure includes a gate structure wrapped around the nanostructures, and an S/D structure wrapped around the nanostructures. The semiconductor device structure includes a first oxide layer between the substrate and the S/D structure. The first oxide layer and the isolation layer are made of different materials. The first oxide layer is in direct contact with the isolation layer.

20 Claims, 43 Drawing Sheets

(51) Int. Cl.
*H01L 29/66* (2006.01)
*H01L 29/423* (2006.01)

(58) Field of Classification Search
CPC ............... H01L 29/4983; H01L 29/785; H01L 29/1037; H01L 29/0653; H01L 29/66659; H01L 29/7835; H01L 29/66689; H01L 29/7816; H01L 21/28088; H01L 21/76846; H01L 21/76849; H01L 29/7845; H01L 21/76834; H01L 29/41791; H01L 21/76801; H01L 21/0337; H01L 21/28247; H01L 21/28568; H01L 21/3086; H01L 21/31105; H01L 21/31144; H01L 21/76224; H01L 21/823481; H01L 21/823807; H01L 21/823814; H01L 21/823842; H01L 21/823857; H01L 21/823871; H01L 21/823878; H01L 23/5283; H01L 23/53266; H01L 27/1104; H01L 28/24; H01L 29/0847; H01L 29/516; H01L 29/6653; H01L 29/7854; H01L 21/28518; H01L 23/5329; H01L 28/20; H01L 29/41783; H01L 21/02532; H01L 21/02636; H01L 21/76802; H01L 21/76877; H01L 23/528; H01L 27/0922; H01L 29/167; H01L 29/66636; H01L 29/7851; H01L 29/66795; H01L 29/7846; H01L 29/165; H01L 21/76897; H01L 23/5226; H01L 23/53209; H01L 23/53238; H01L 21/76816; H01L 9/66818; H01L 29/7848; H01L 29/7843; H01L 27/0886; H01L 21/76232; H01L 29/6656; H01L 21/823431; H01L 21/76883; H01L 21/76885; H01L 29/665; H01L 21/02164; H01L 21/0217; H01L 21/0332; H01L 21/823437; H01L 21/823475; H01L 24/16; H01L 29/7842; H01L 29/7853; H01L 2224/16227; H01L 24/32; H01L 24/73; H01L 2224/3225; H01L 2224/73204; H01L 23/485; H01L 29/66803; H01L 21/02167; H01L 21/02126; H01L 21/3247; H01L 21/2236; H01L 21/2254; H01L 29/66818; H01L 29/42356; H01L 29/1033; H01L 29/0673; H01L 21/845; H01L 27/10826; H01L 27/10879; H01L 27/1211; H01L 2924/13067

See application file for complete search history.

(56) References Cited

U.S. PATENT DOCUMENTS

| | | | |
|---|---|---|---|
| 9,219,154 | B1 | 12/2015 | Cheng et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,853,114 | B1 * | 12/2017 | Rodder ............ H01L 29/42364 |
| 2011/0079857 | A1 | 4/2011 | Lee et al. |
| 2013/0105906 | A1 | 5/2013 | Yin et al. |
| 2013/0341704 | A1 | 12/2013 | Rachmady et al. |
| 2015/0104918 | A1 | 4/2015 | Liu et al. |
| 2015/0162403 | A1 | 6/2015 | Oxland |
| 2015/0340457 | A1 | 11/2015 | Xie et al. |
| 2016/0027871 | A1 | 1/2016 | Oxland et al. |
| 2016/0365411 | A1 | 12/2016 | Yeh et al. |
| 2017/0040321 | A1 | 2/2017 | Mitard |
| 2017/0154973 | A1 * | 6/2017 | Ching ................. H01L 29/0673 |
| 2018/0076225 | A1 | 3/2018 | Bergendahl et al. |
| 2018/0138266 | A1 | 5/2018 | Smith et al. |
| 2018/0240652 | A1 | 8/2018 | Ching et al. |

OTHER PUBLICATIONS

U.S. Office Action for U.S. Application No. 16/681,102, dated Oct. 14, 2020.
U.S. Notice of Allowance dated Aug. 21, 2020 for U.S. Appl. No. 15/798,228.
U.S. Office Action dated Jun. 2, 2020 for U.S. Appl. No. 15/798,228.
U.S. Office Action for U.S. Appl. No. 17/071,110, dated Apr. 14, 2022.

* cited by examiner

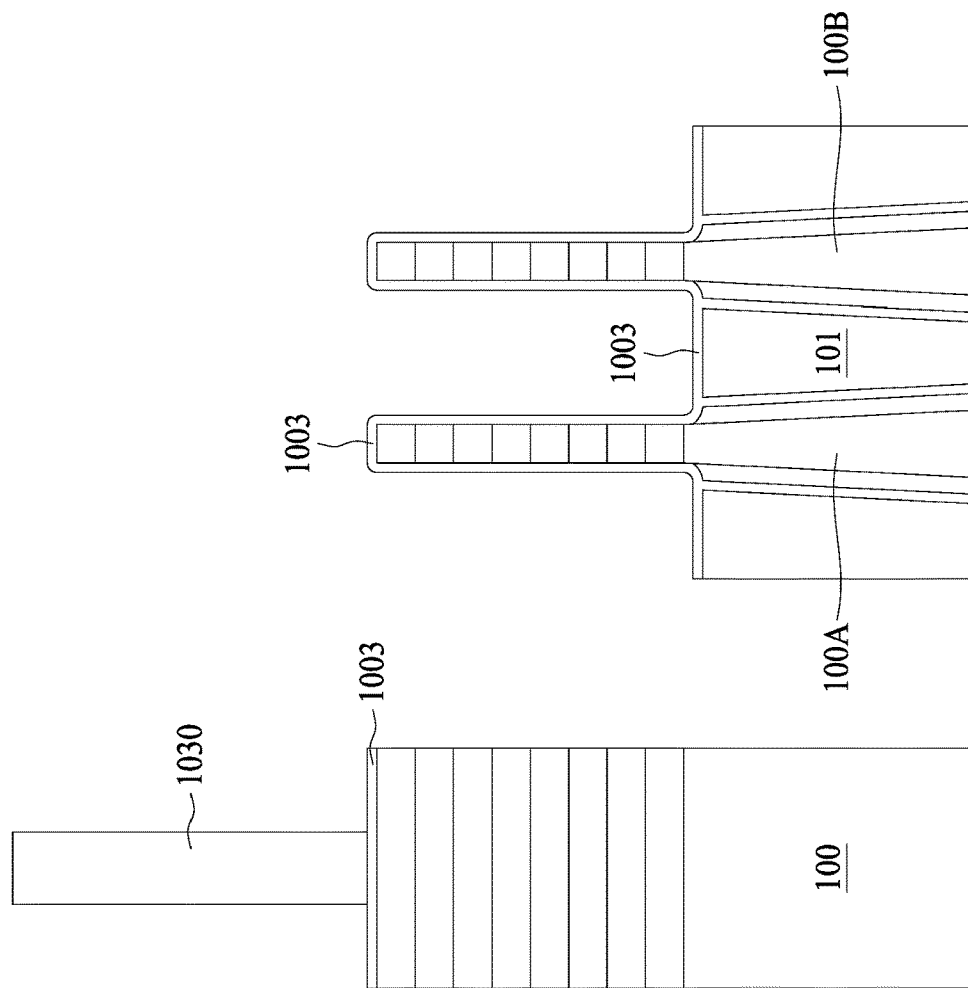
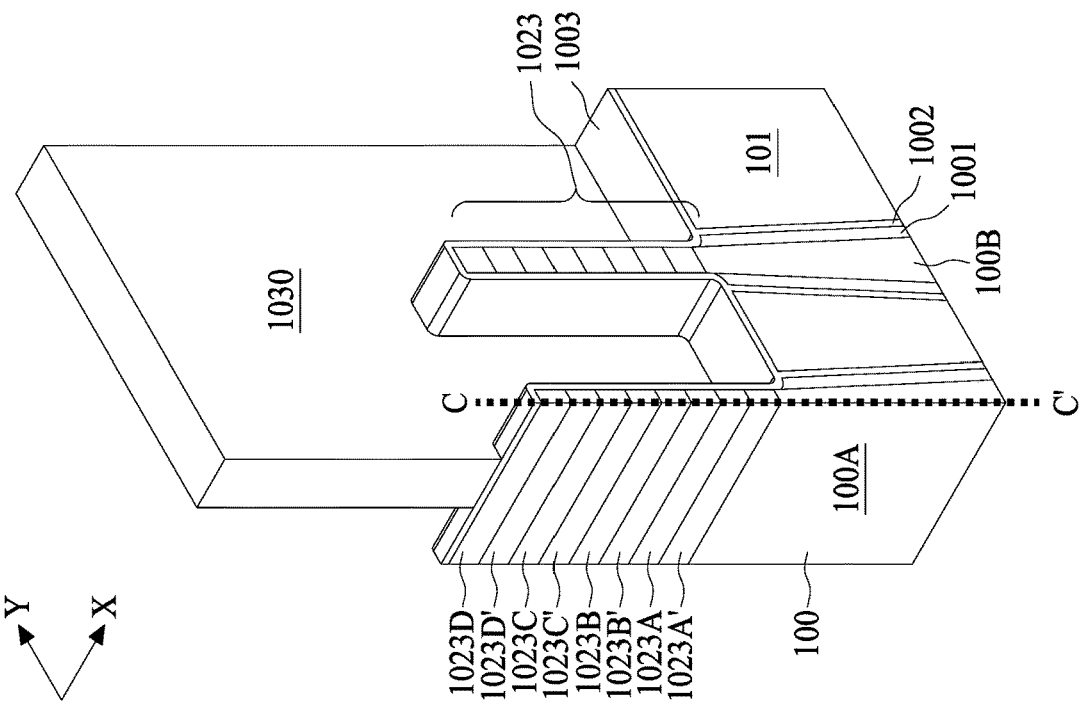
FIG. 6A  FIG. 6B  FIG. 6C

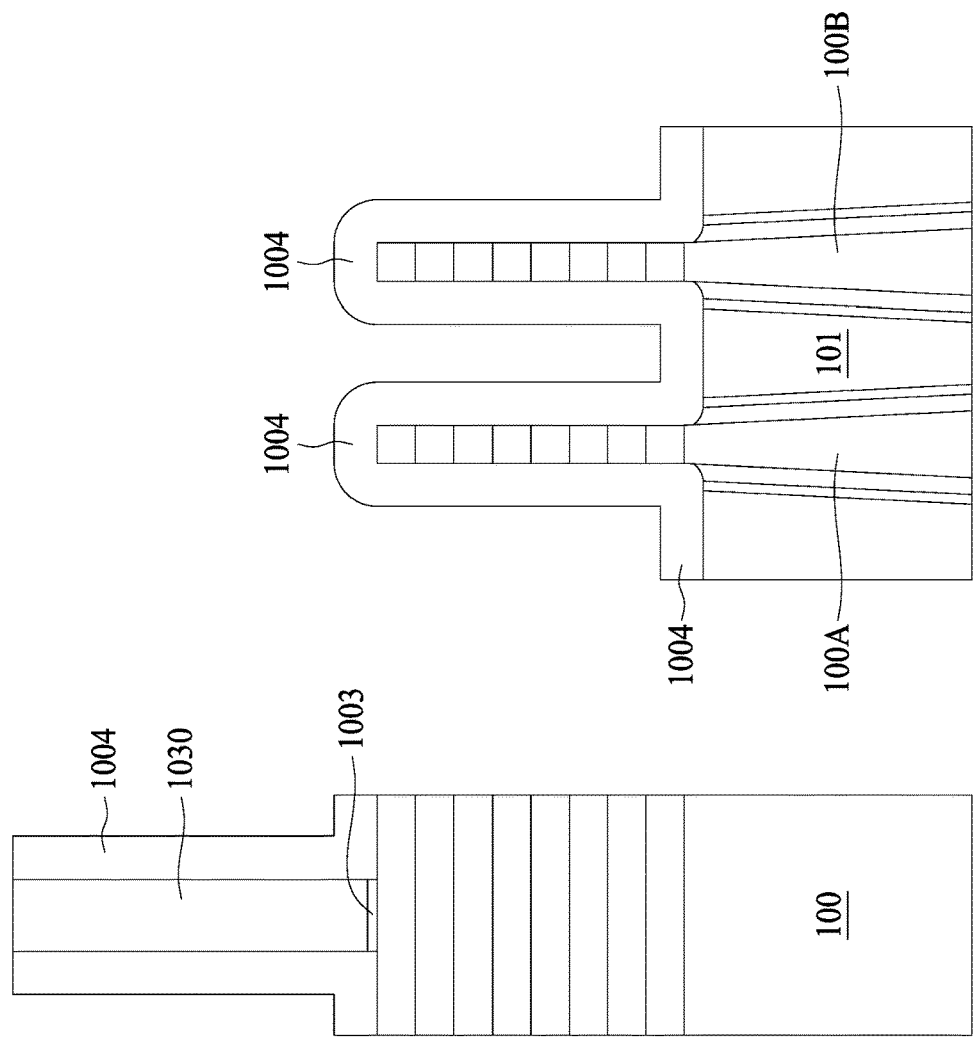
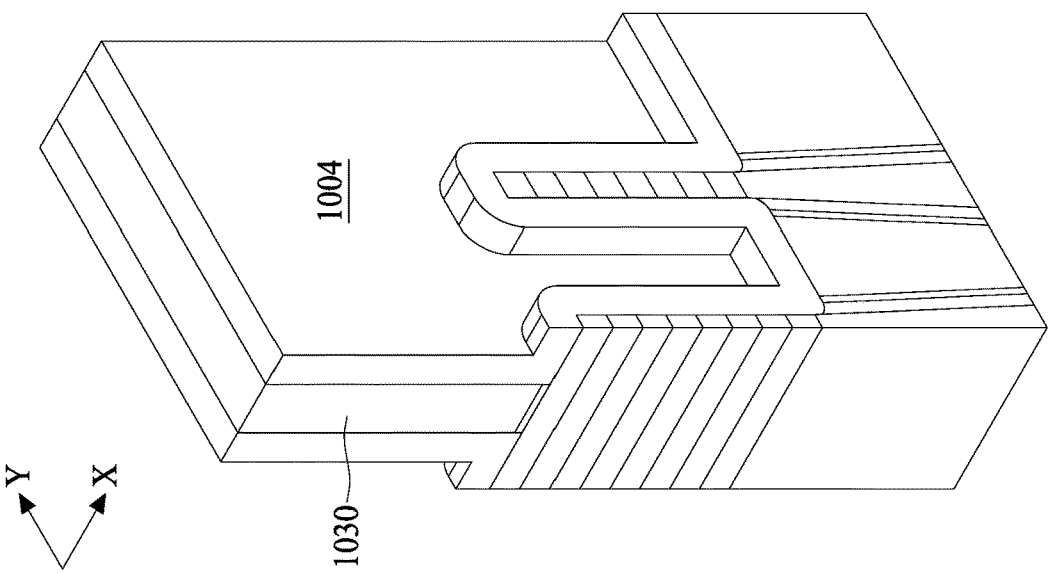
FIG. 8A
FIG. 8B
FIG. 8C

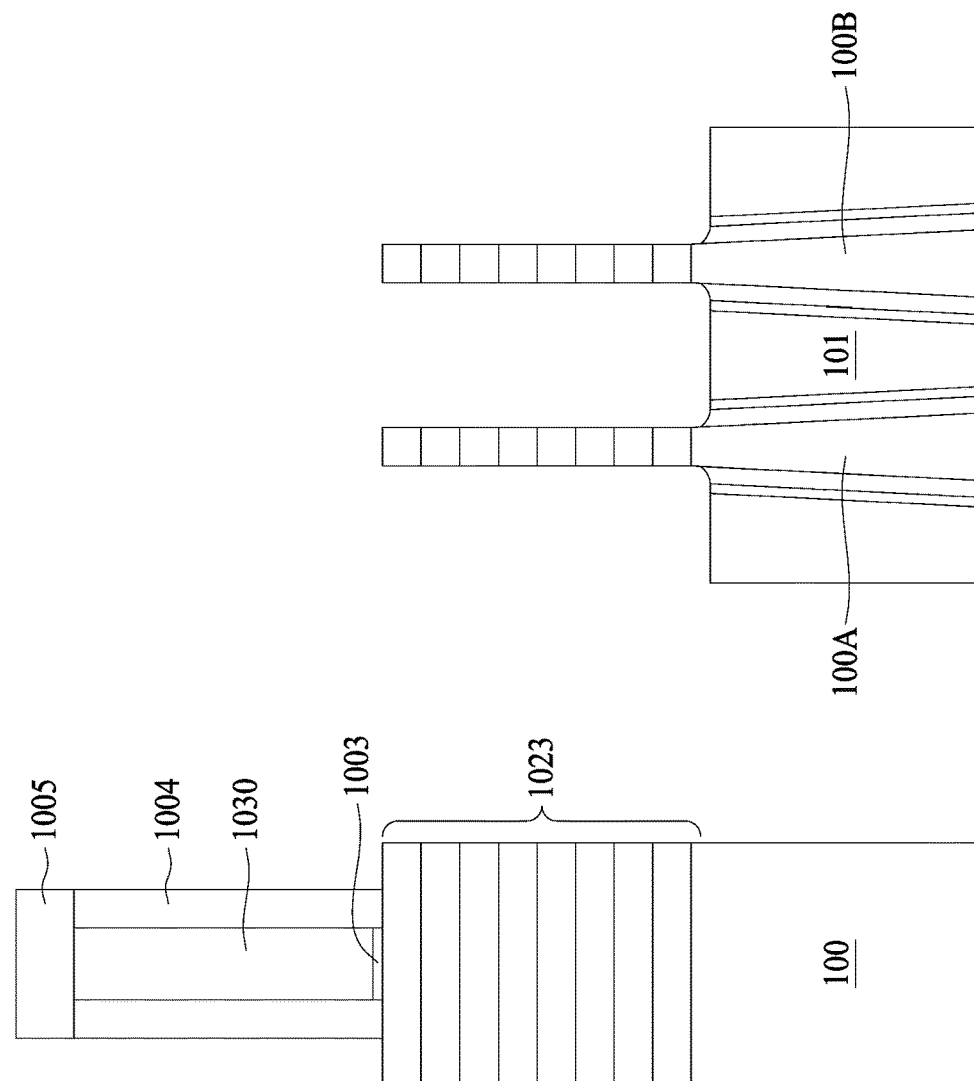
FIG. 9C
FIG. 9B
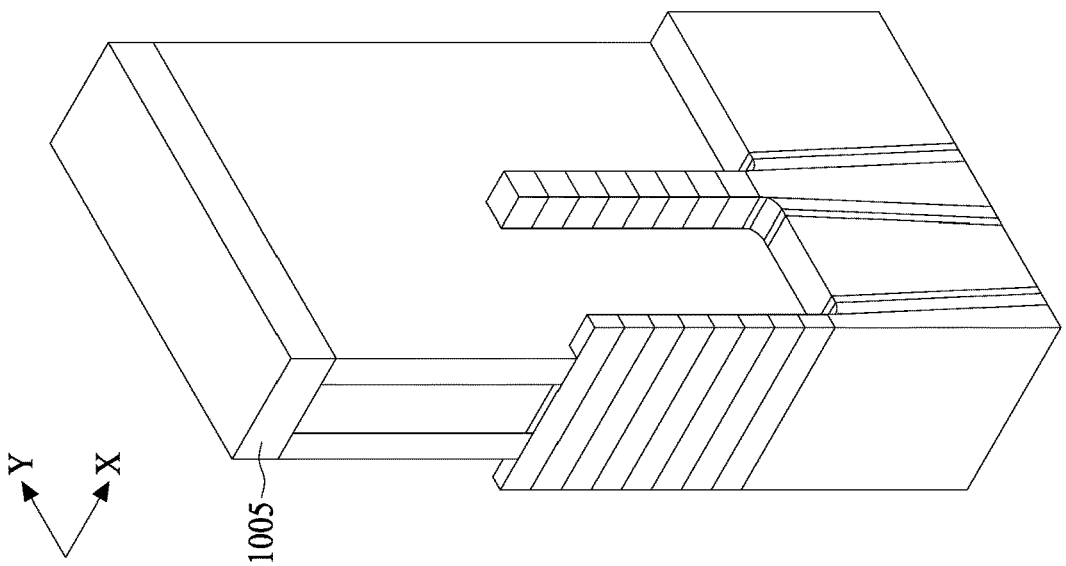
FIG. 9A

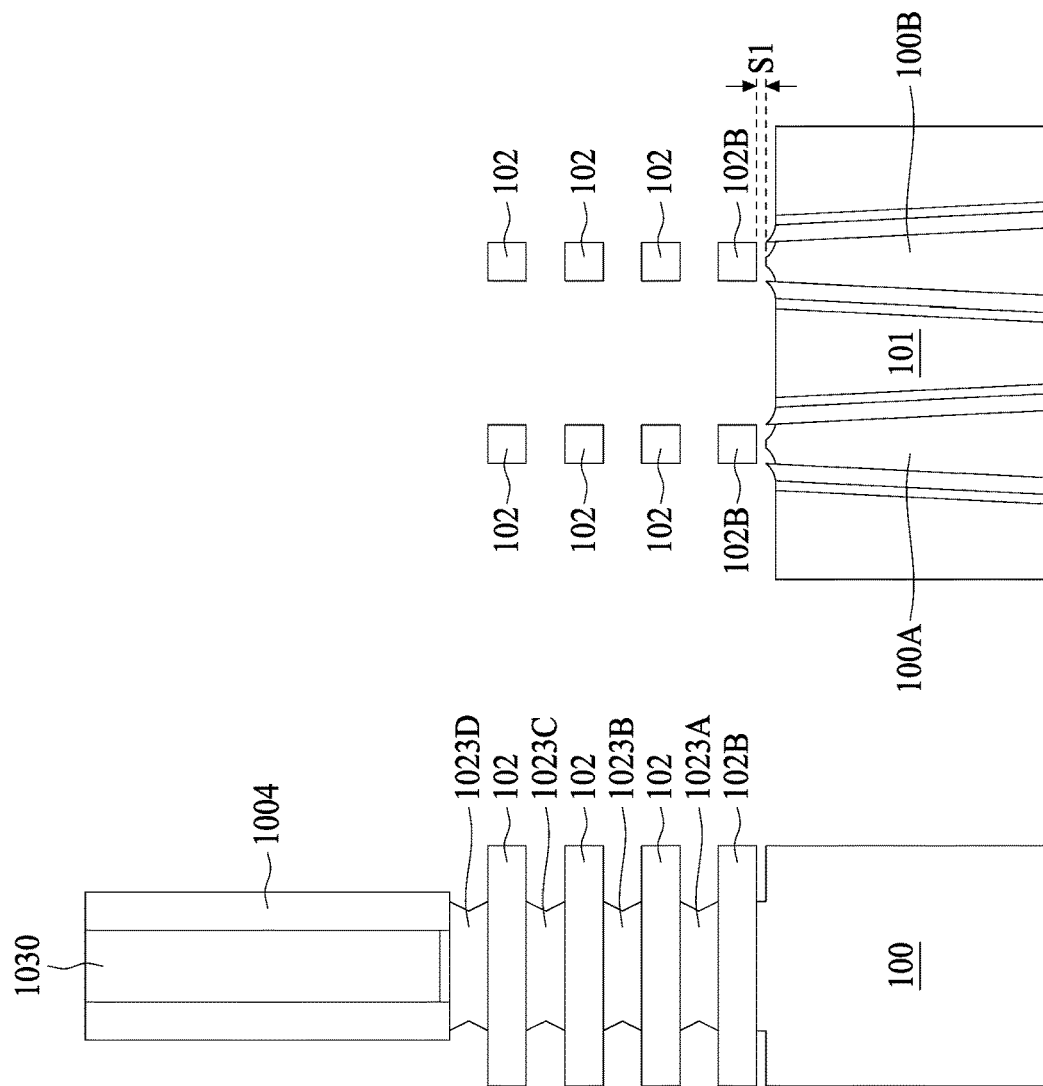
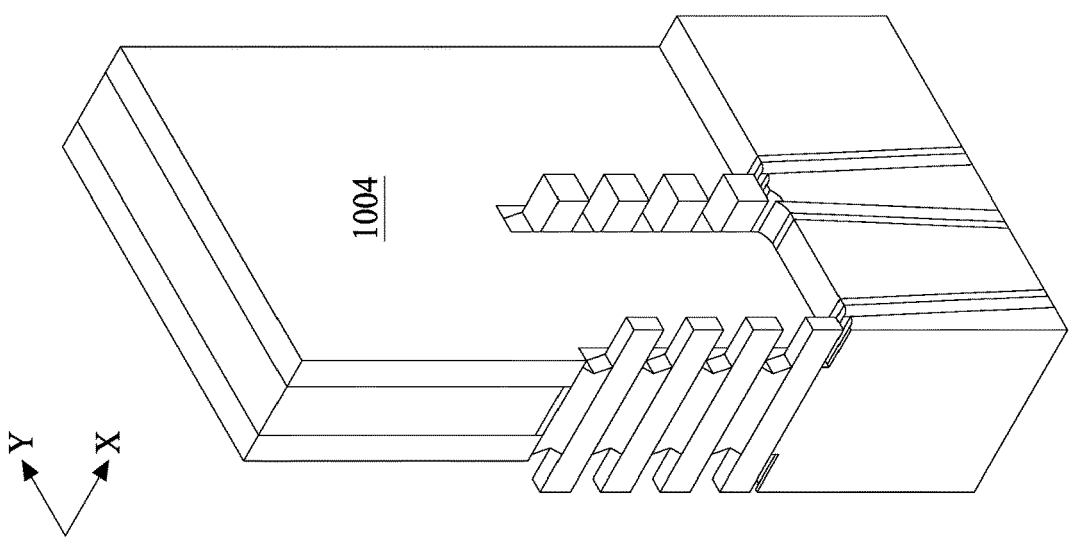
FIG. 10A

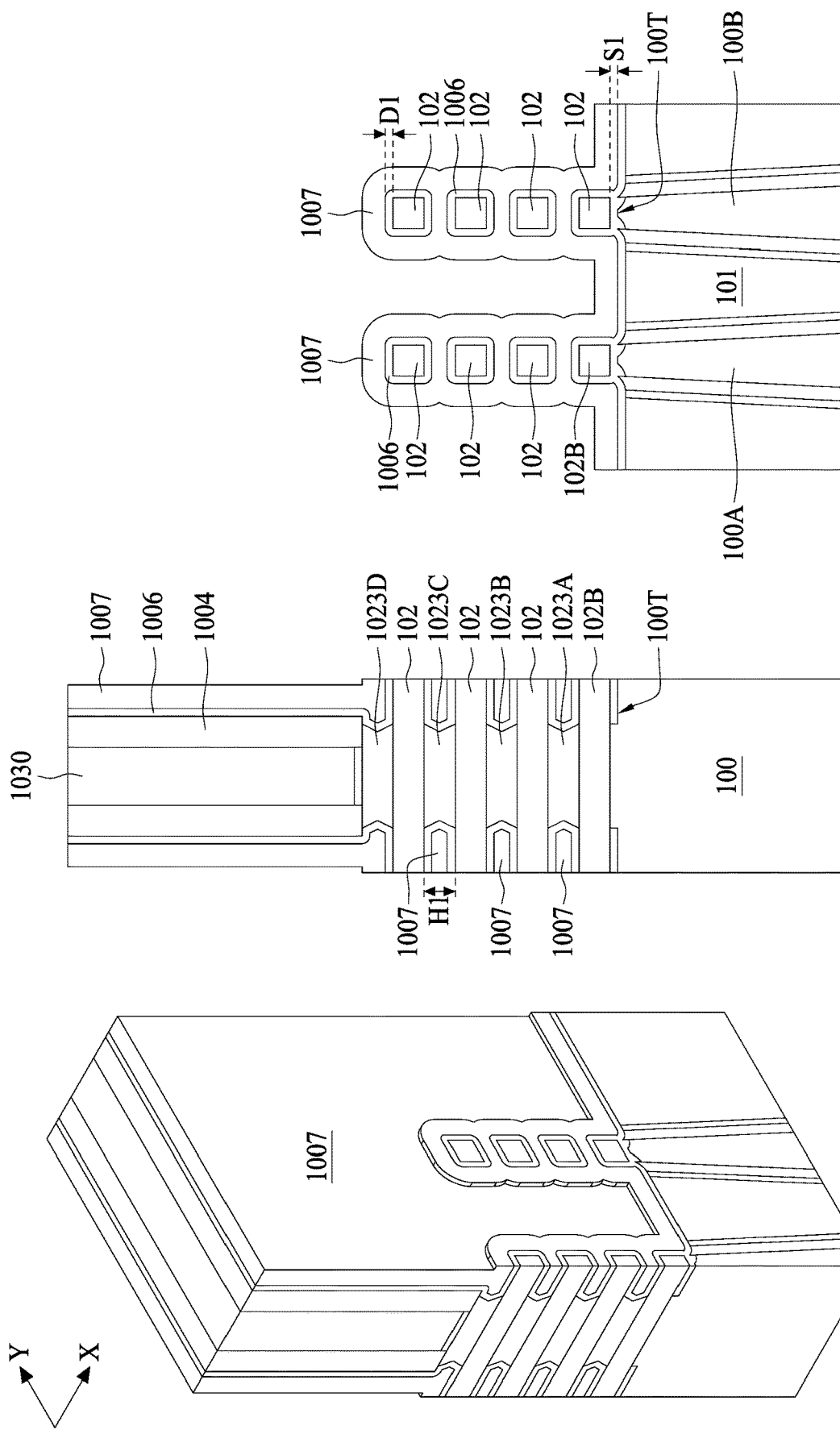

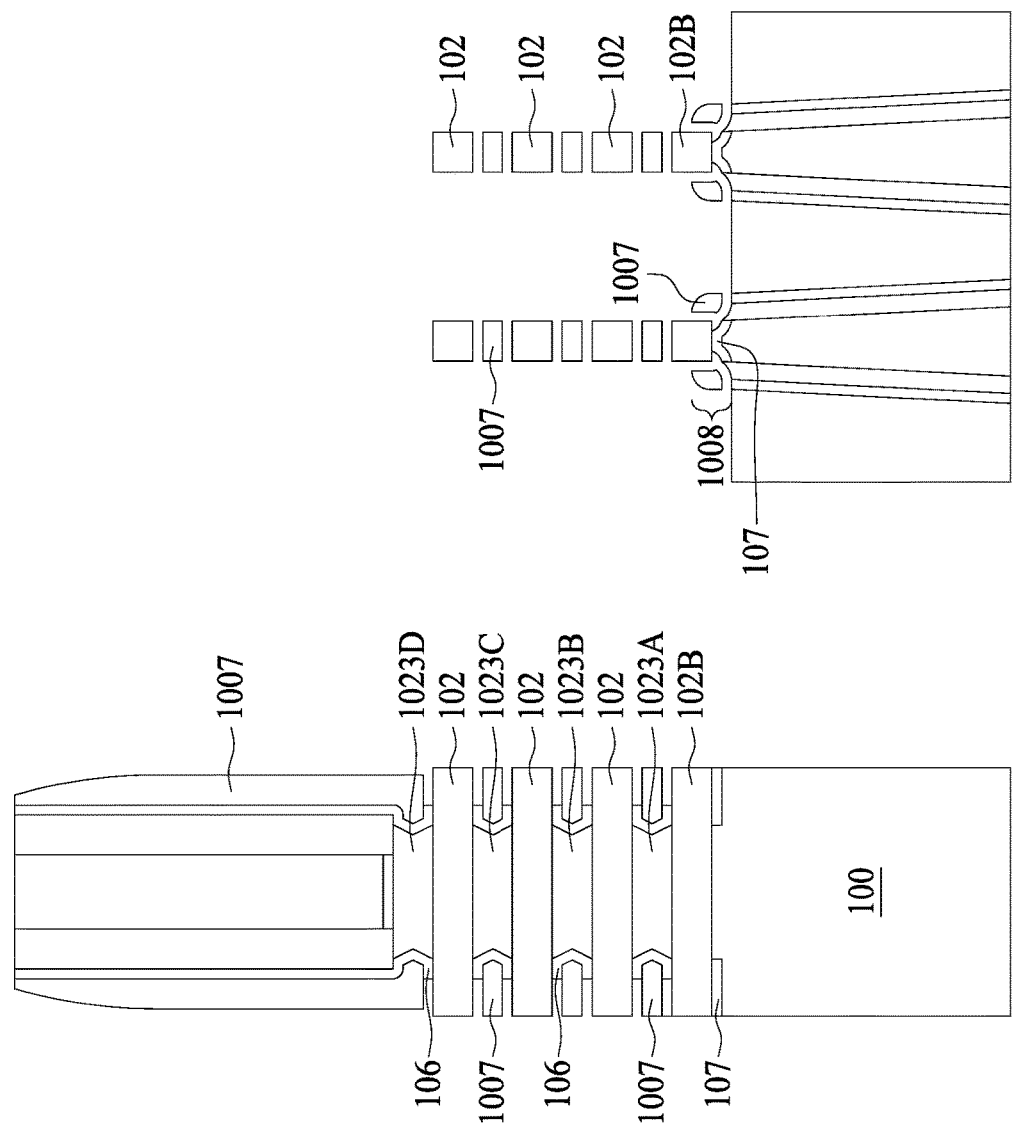
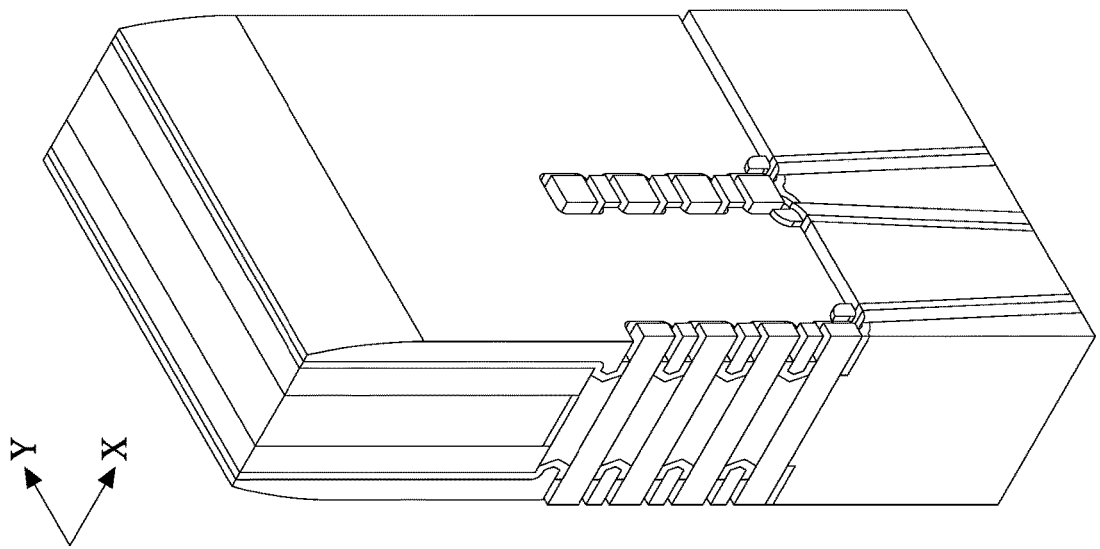
FIG. 14C
FIG. 14B
FIG. 14A

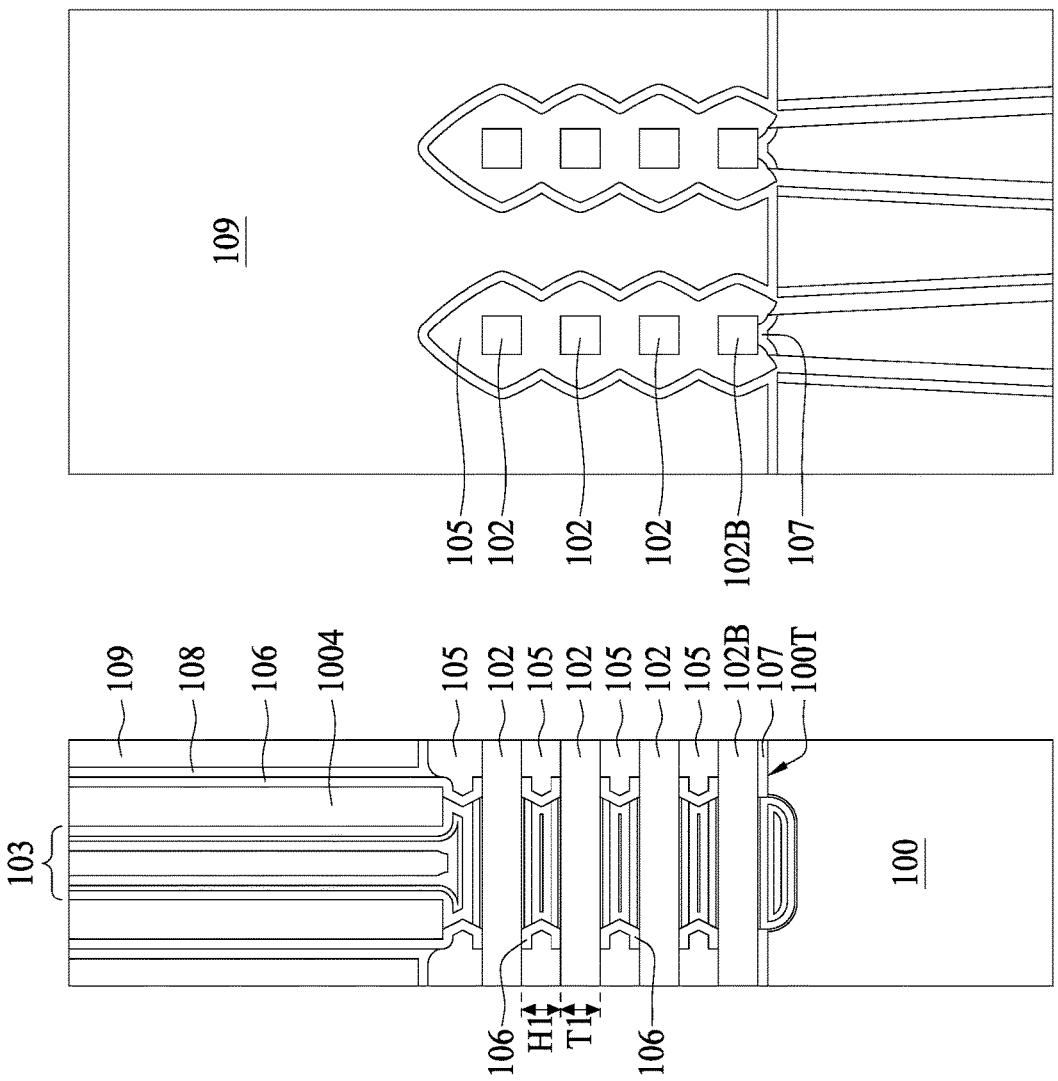
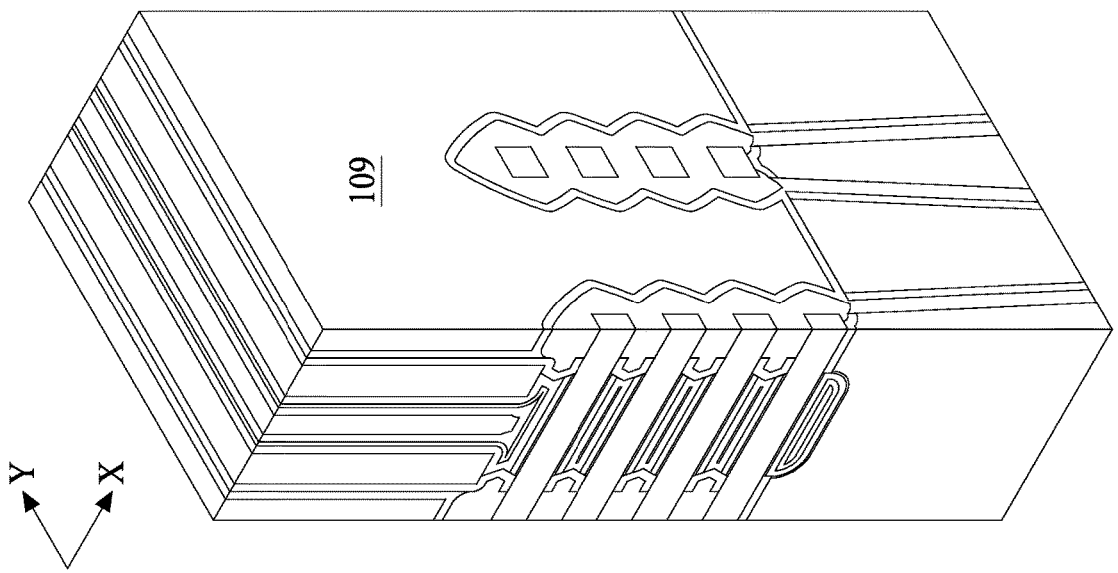
FIG. 17A  FIG. 17B  FIG. 17C

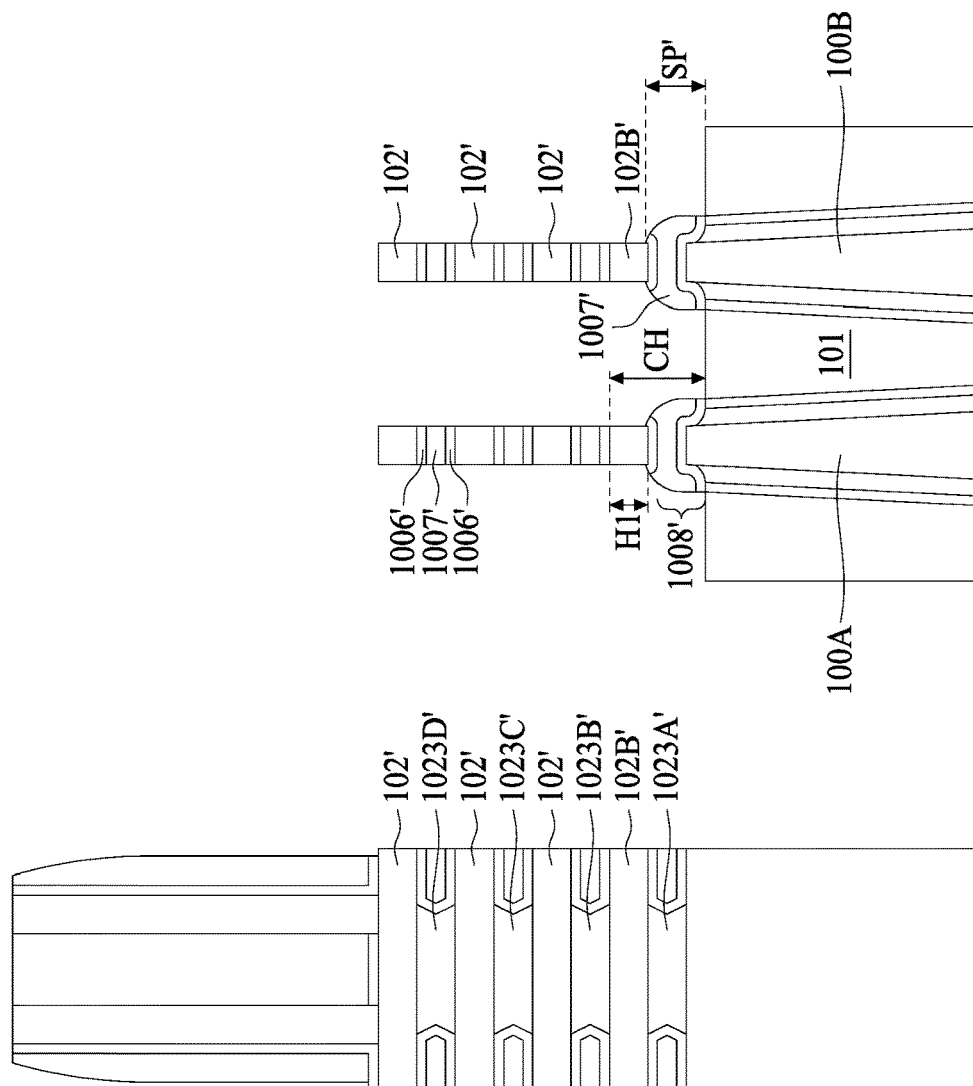
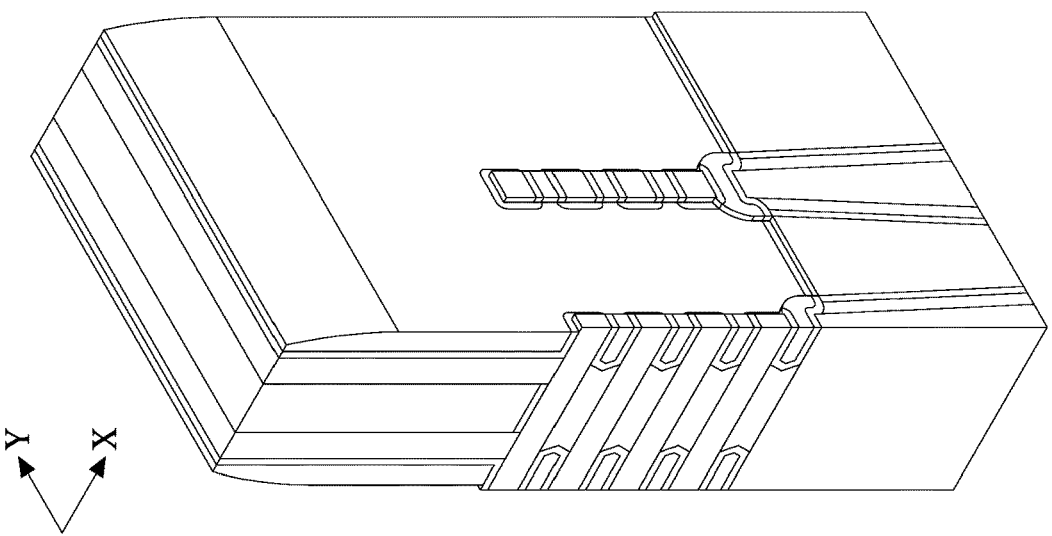
FIG. 21A  FIG. 21B  FIG. 21C

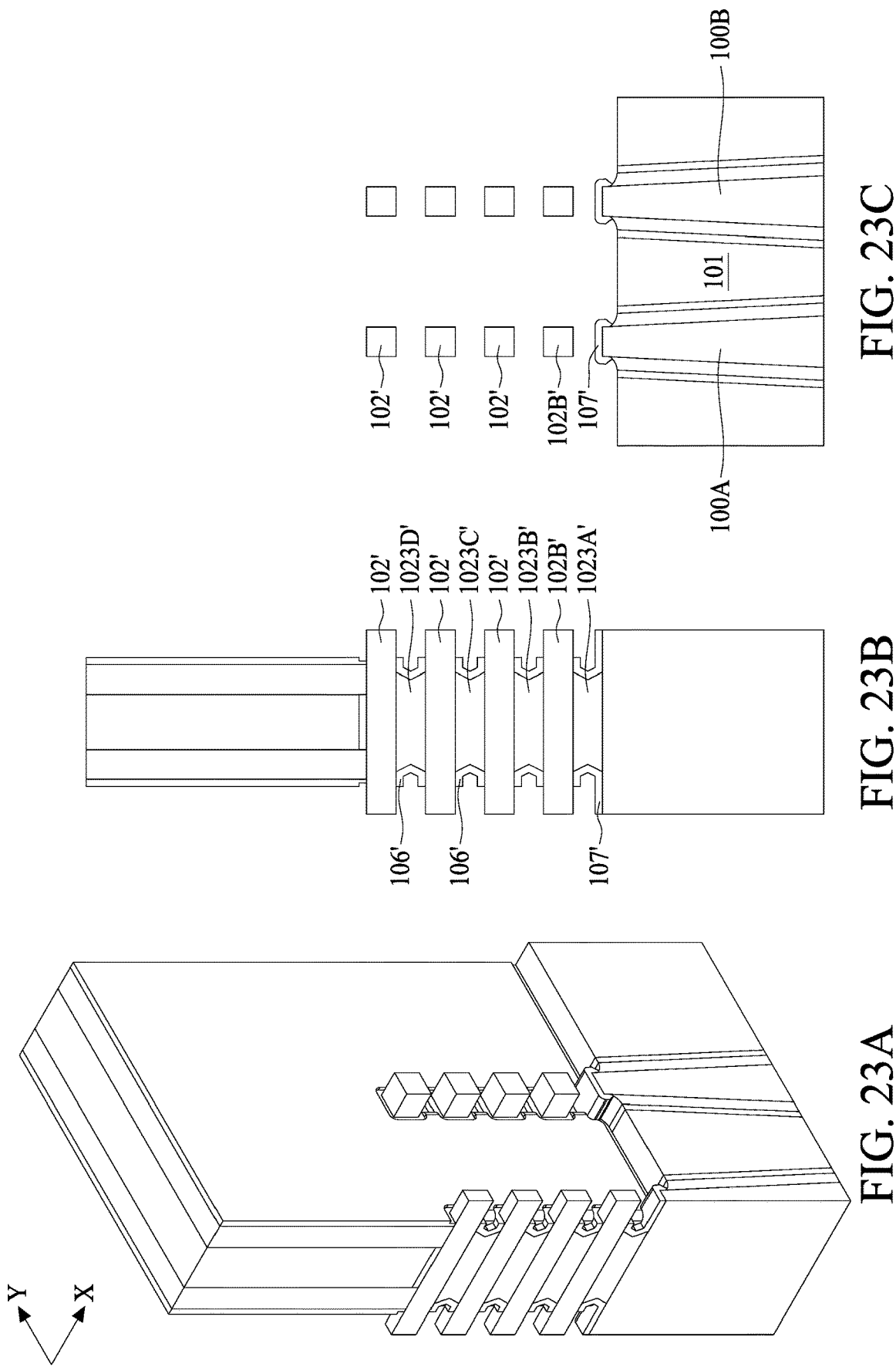

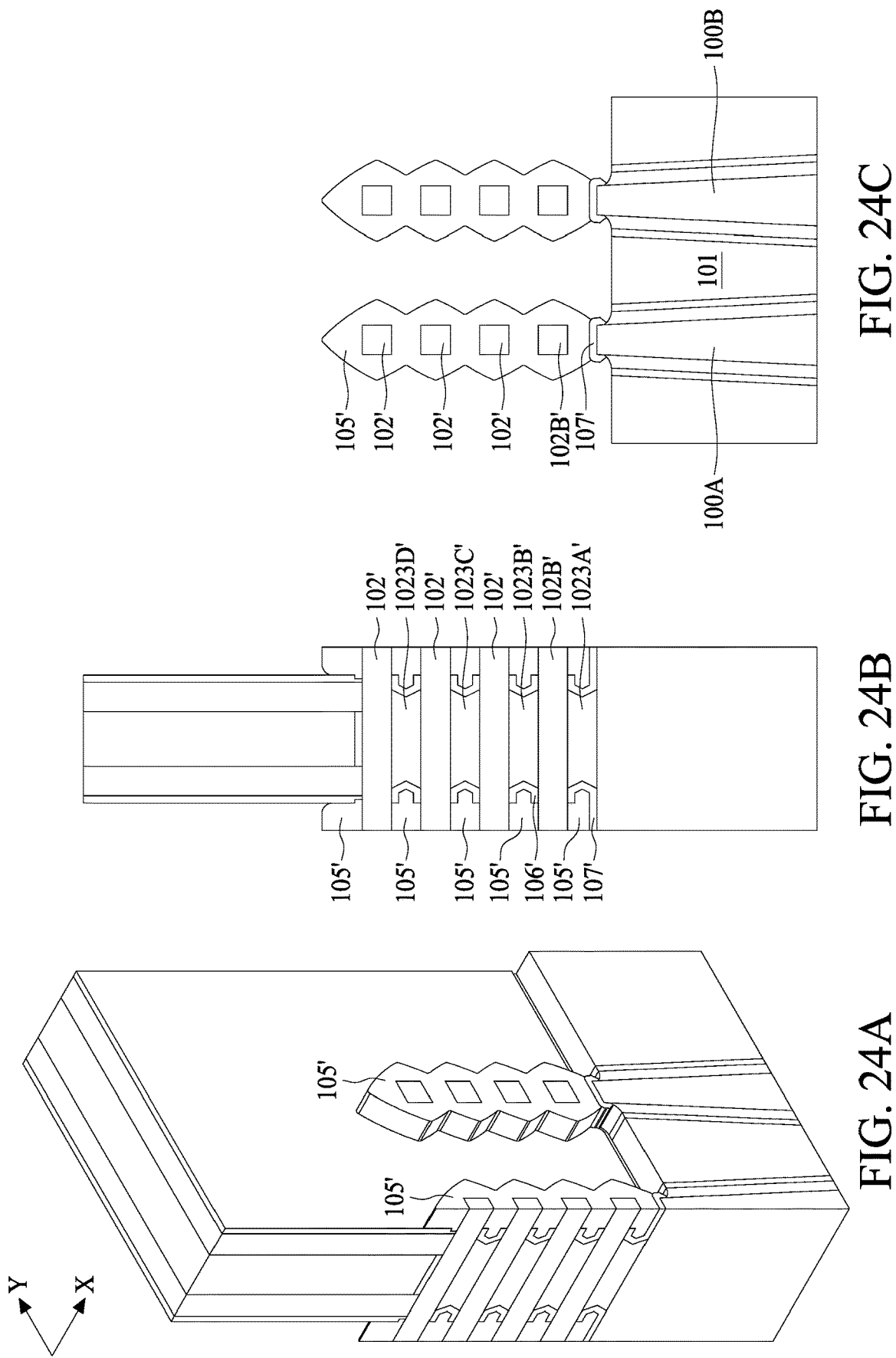

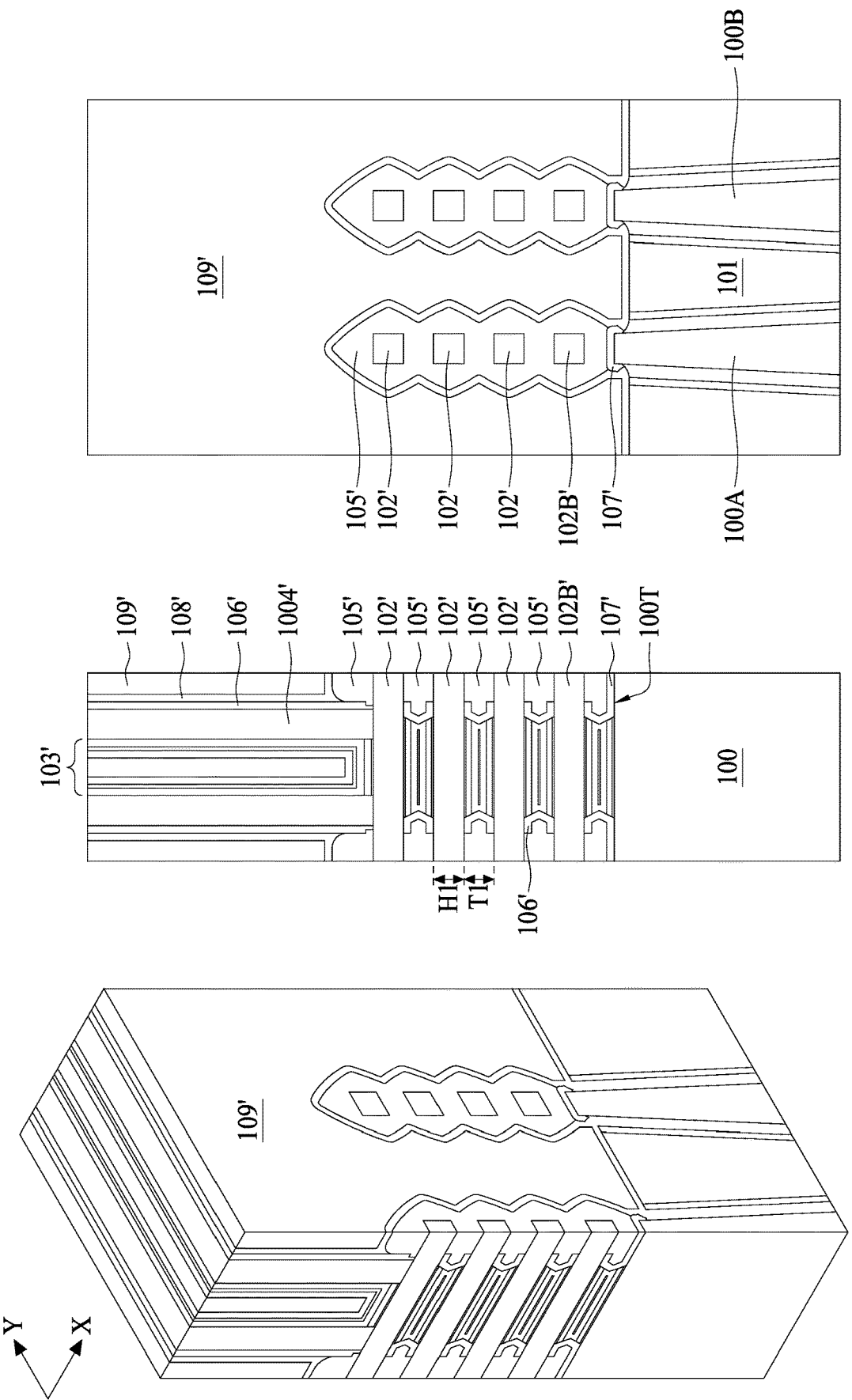

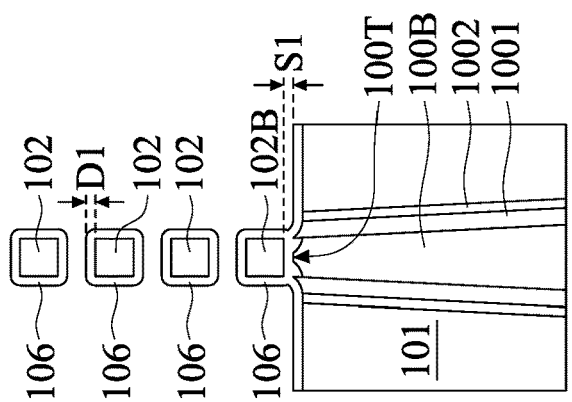
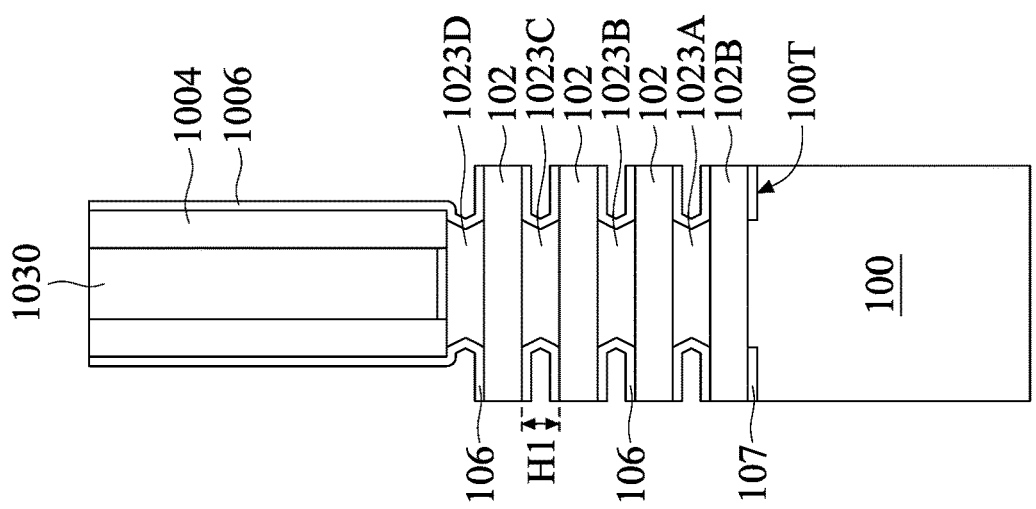
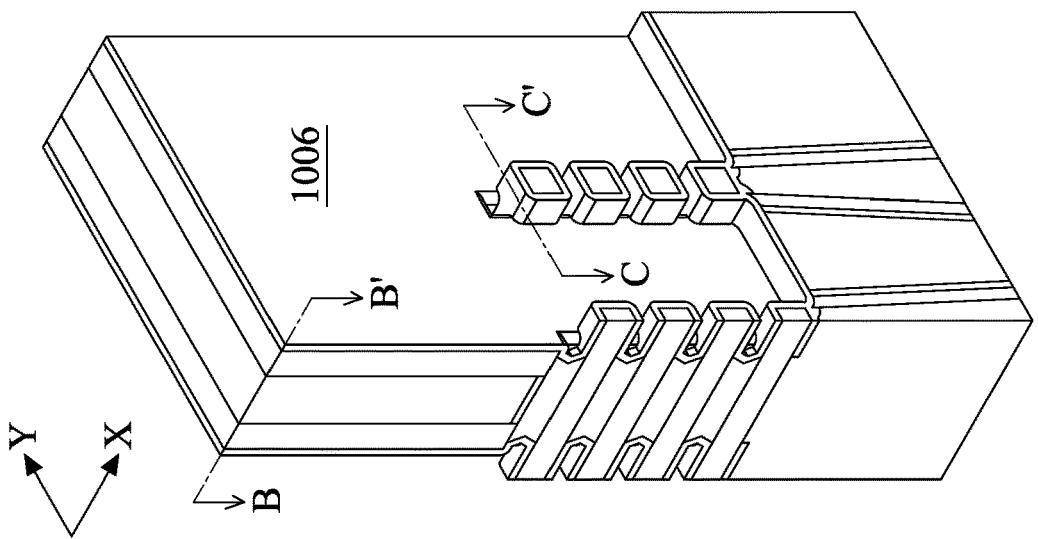
FIG. 26A
FIG. 26B
FIG. 26C

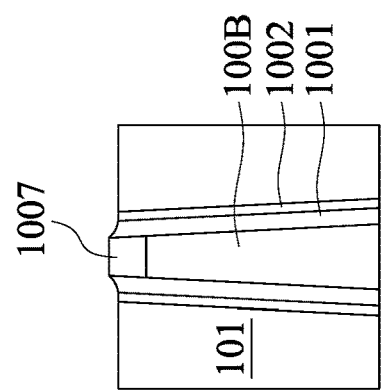
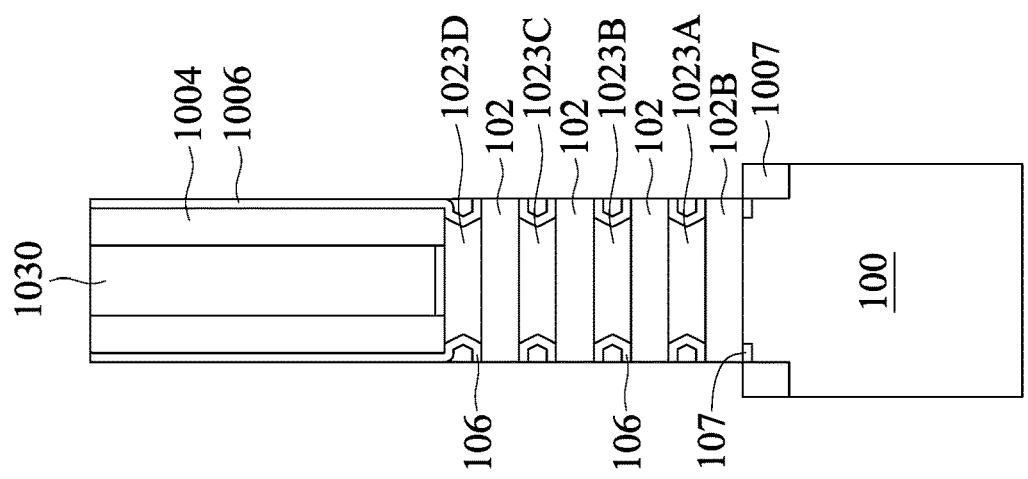
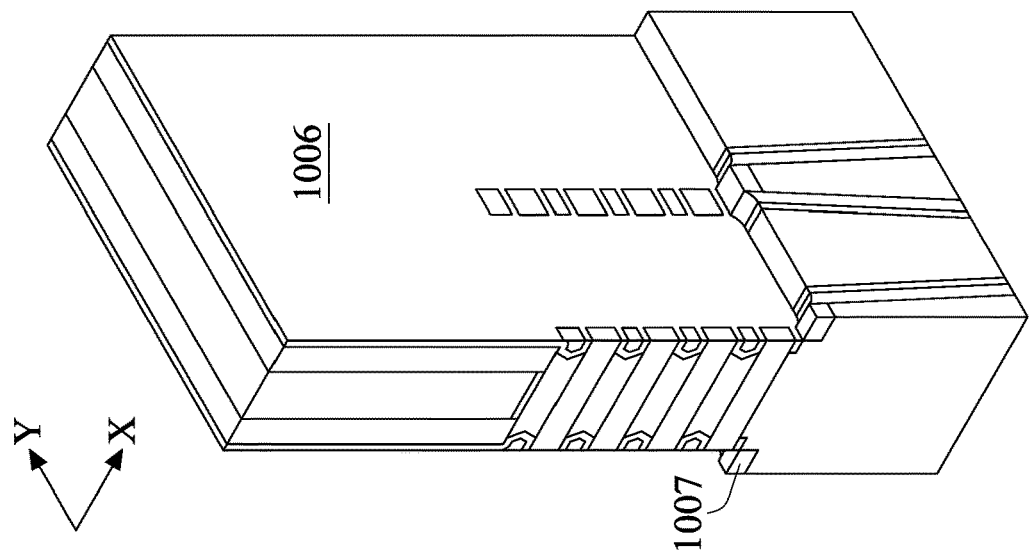

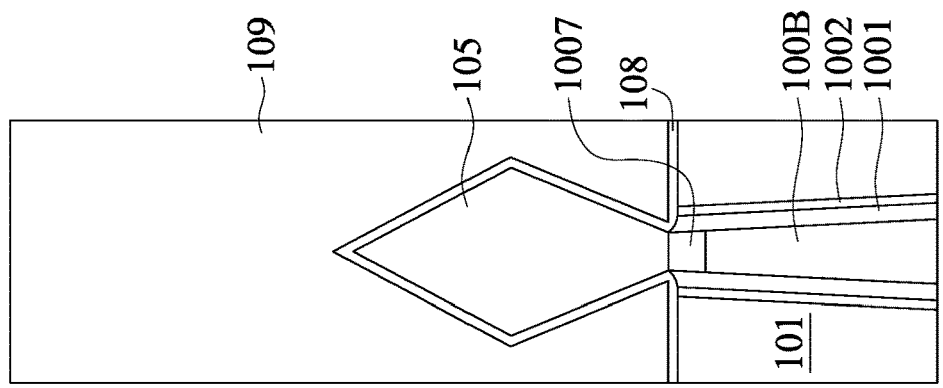
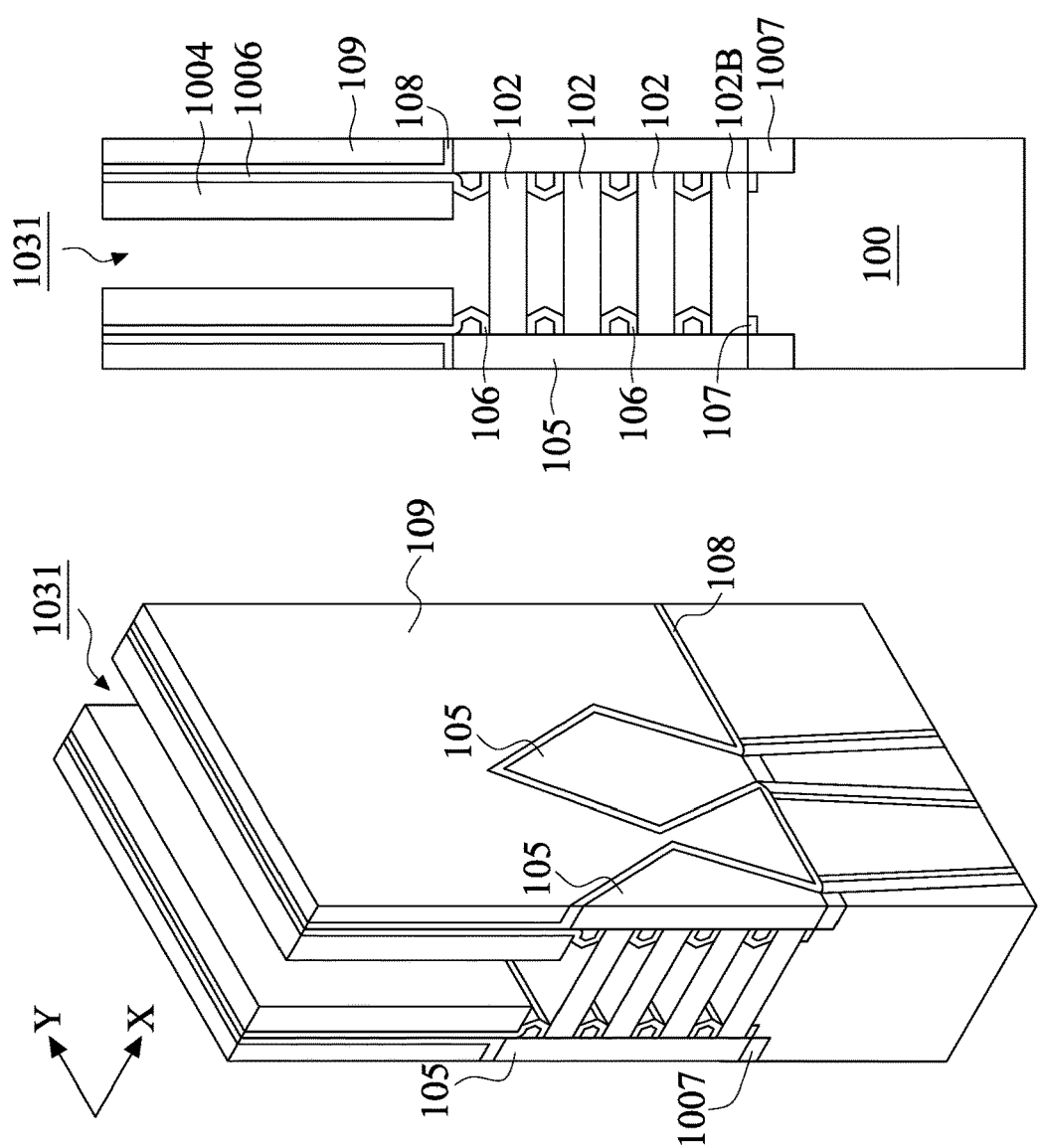

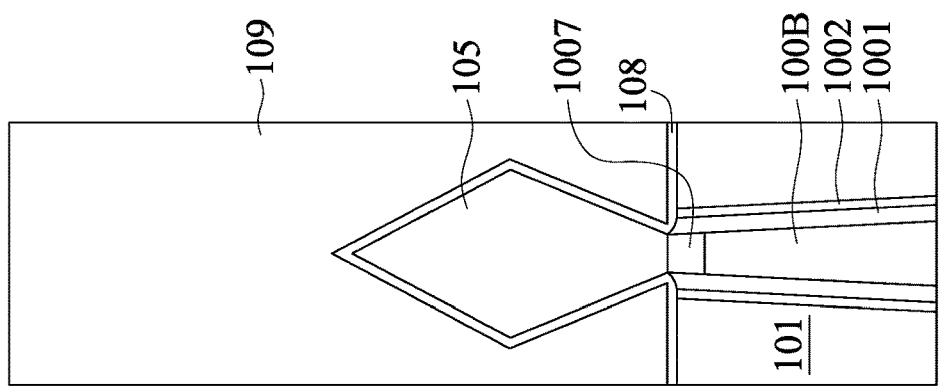
FIG. 33C
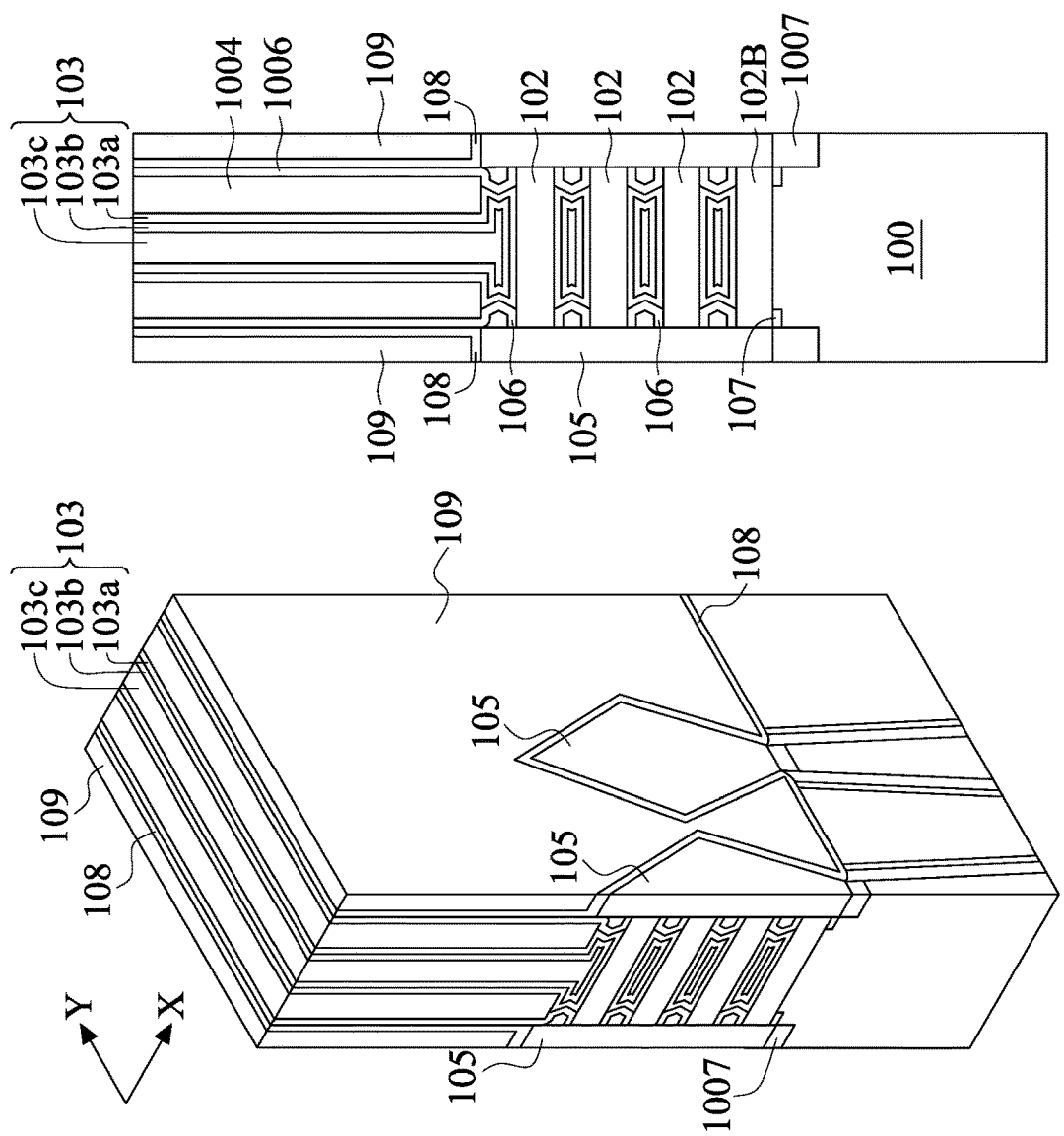
FIG. 33B
FIG. 33A

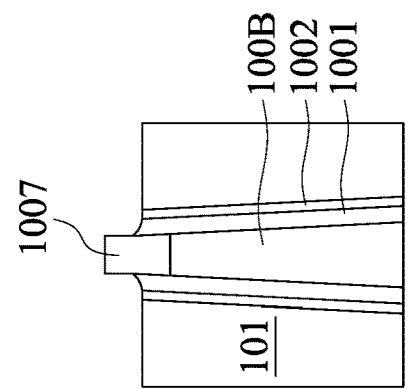
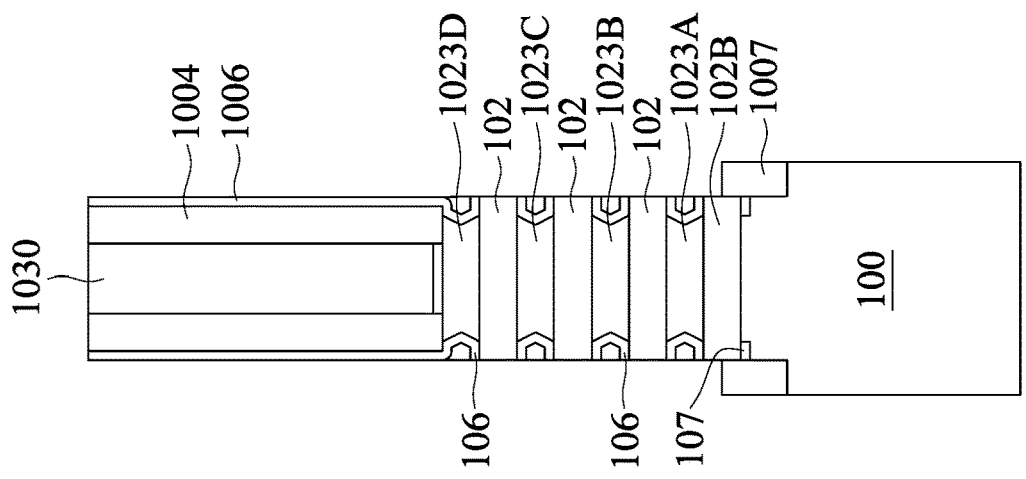
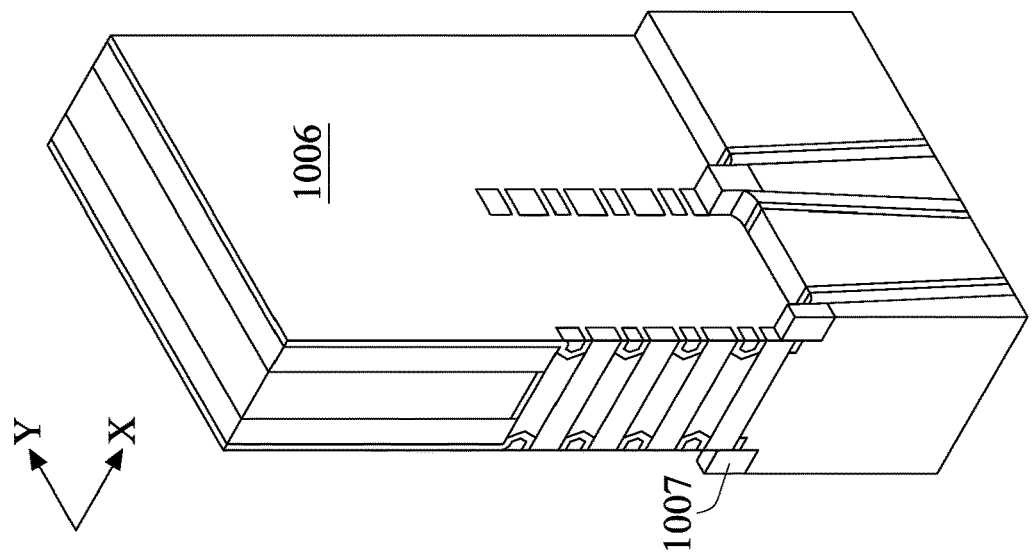

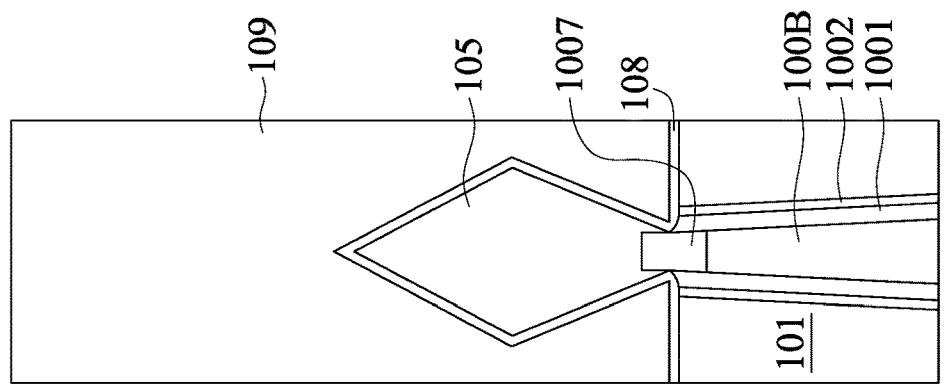
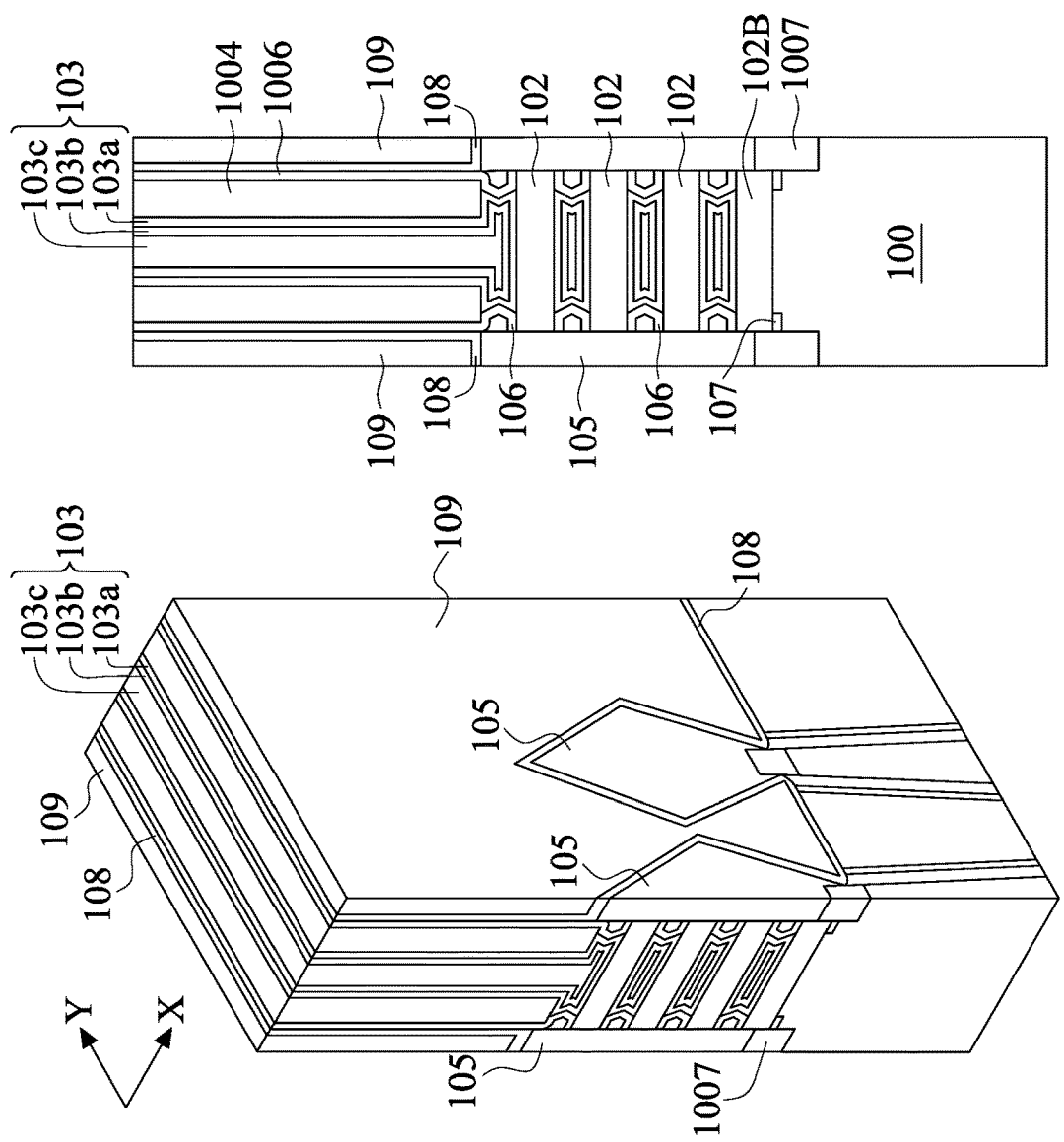
FIG. 36C
FIG. 36B
FIG. 36A

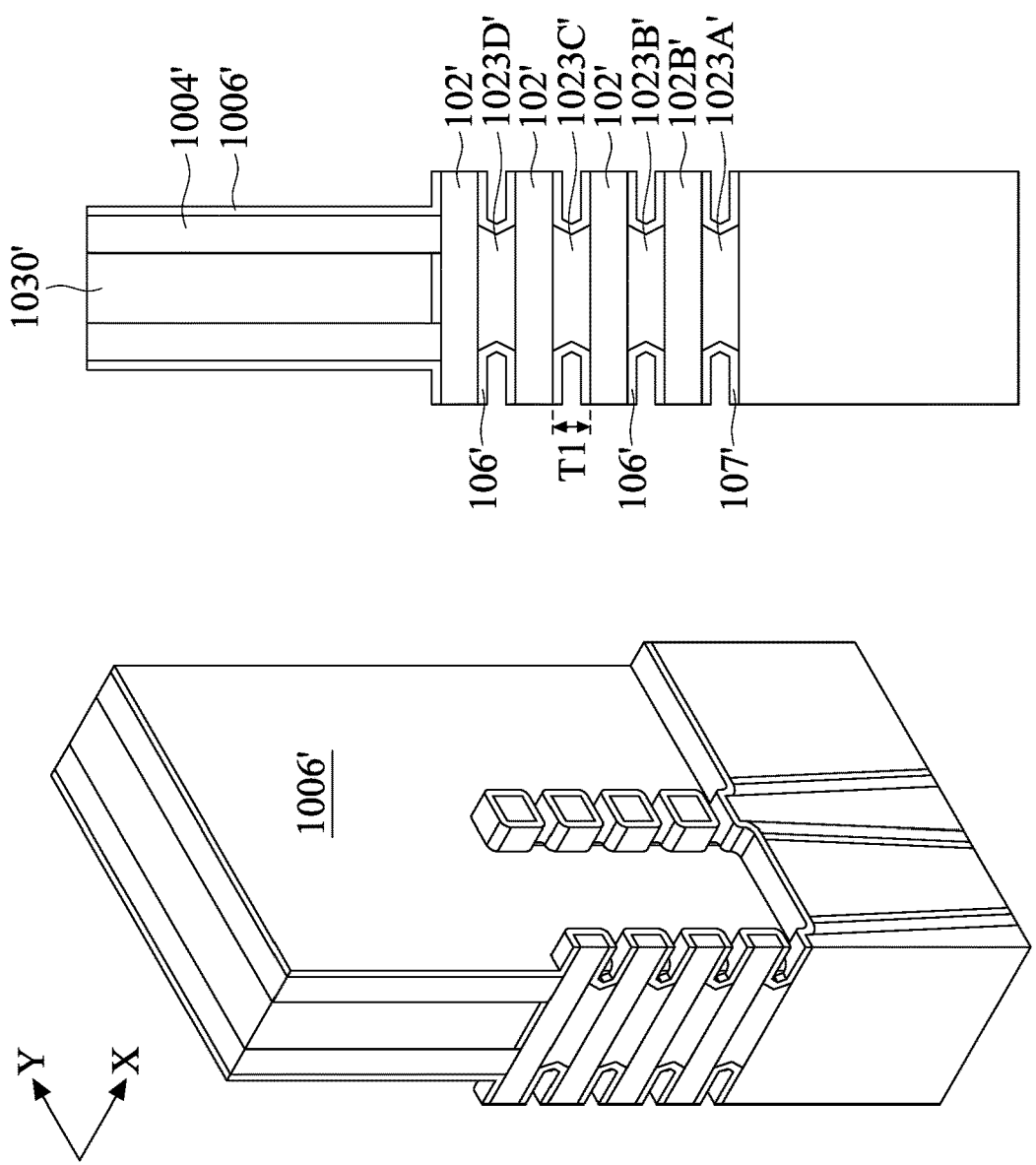

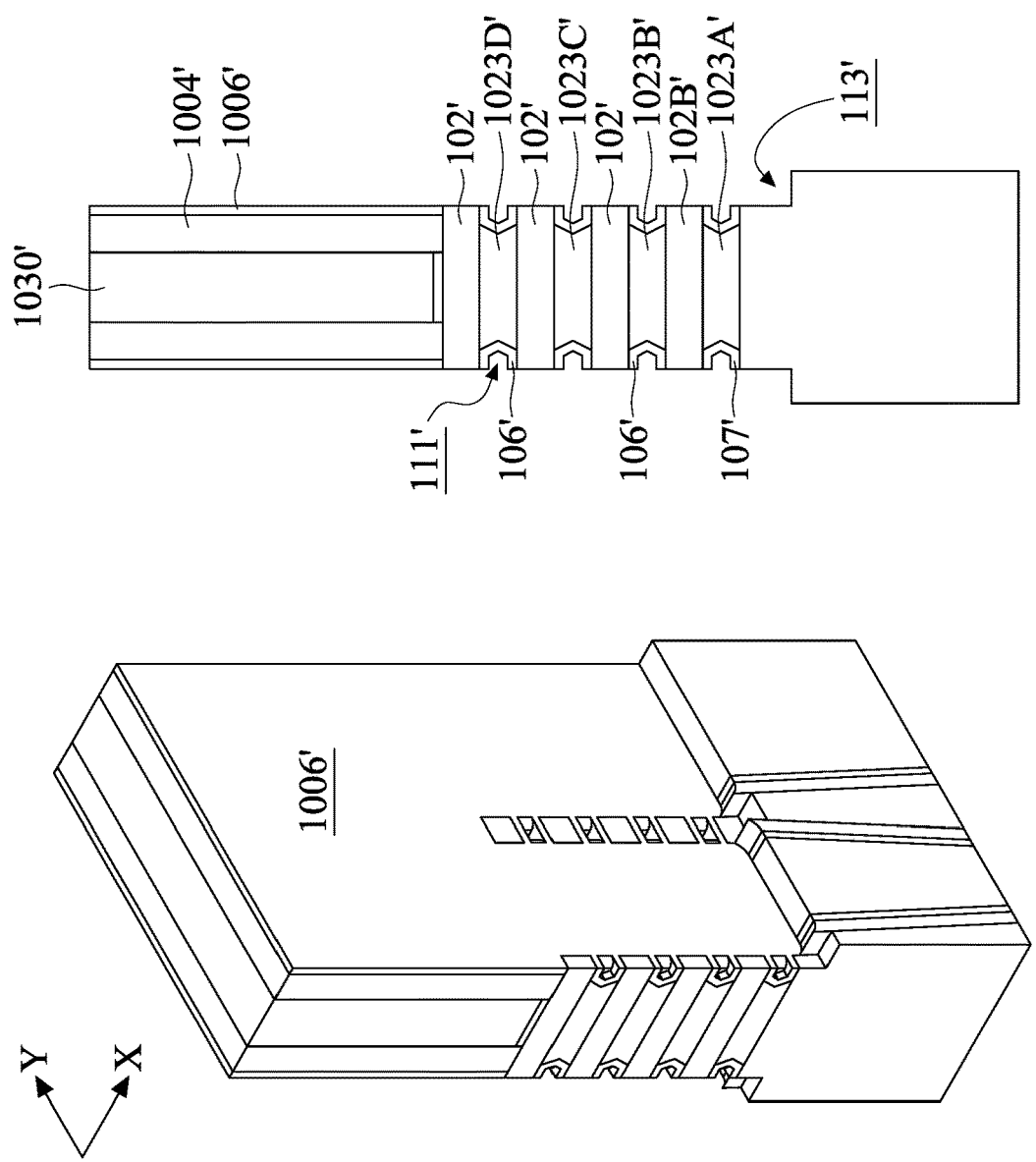

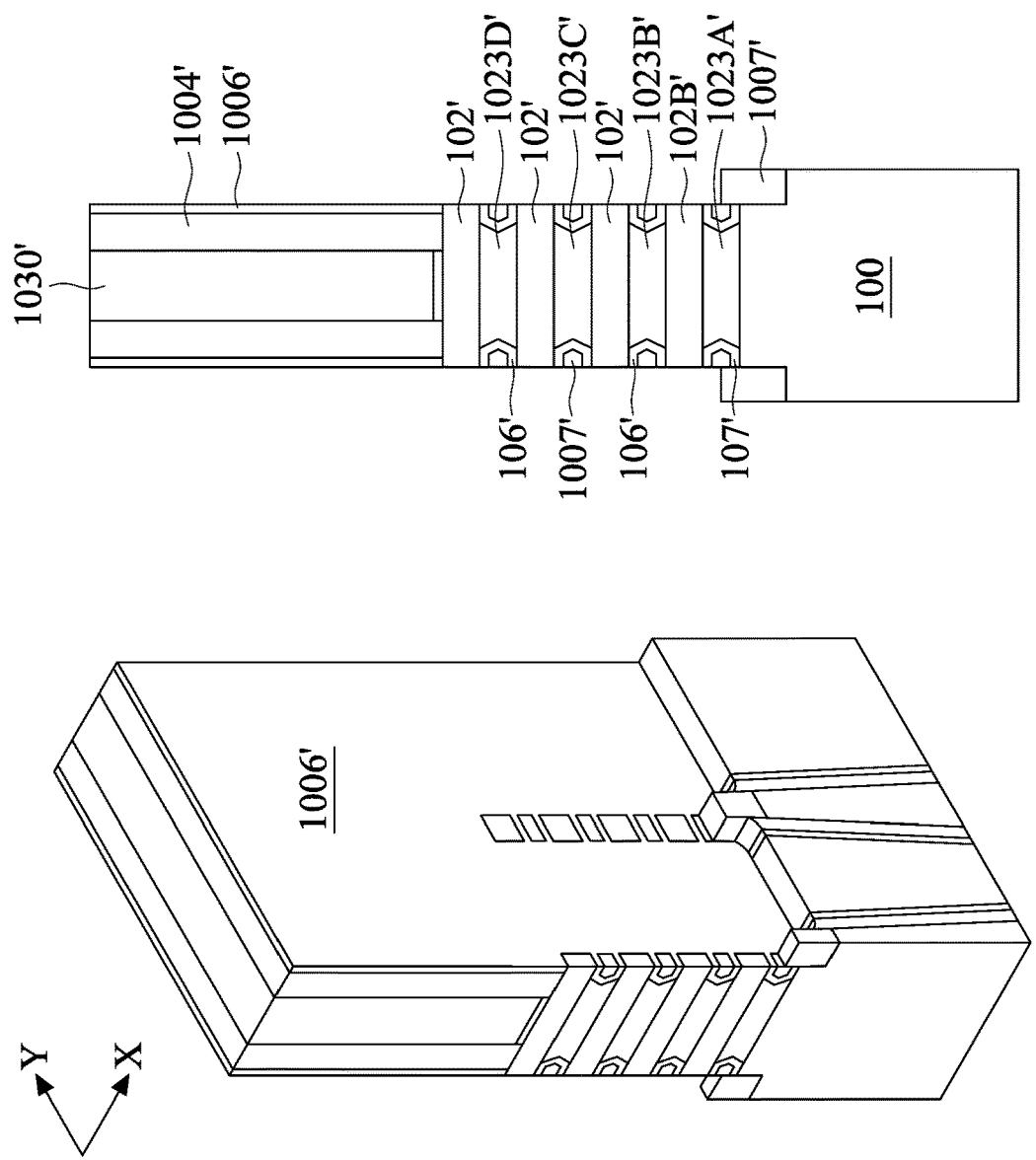
FIG. 40A
FIG. 40B
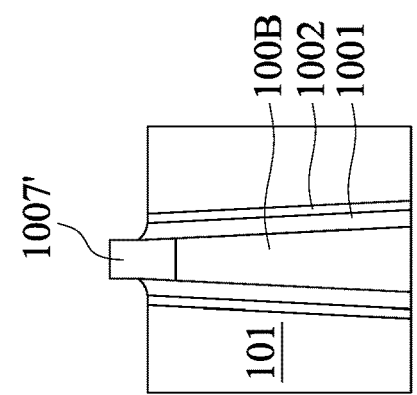
FIG. 40C

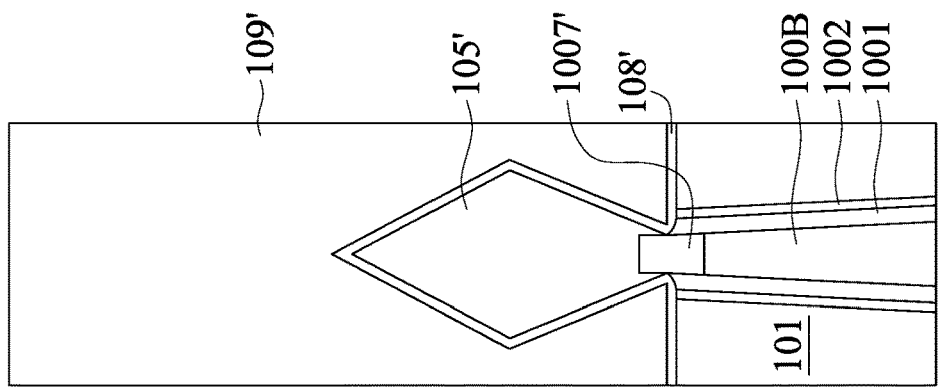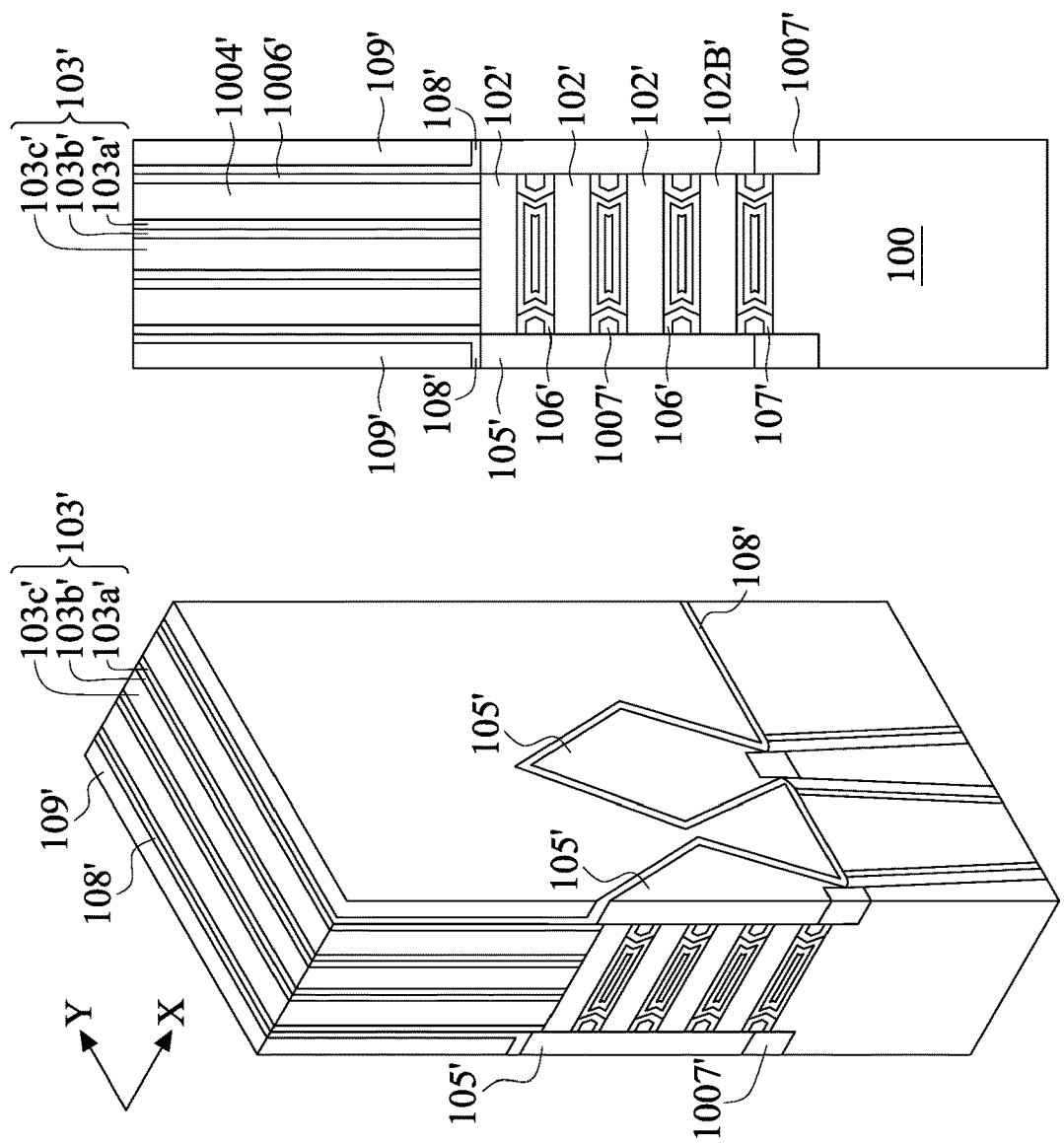

SEMICONDUCTOR DEVICE STRUCTURE AND METHOD FOR FORMING THE SAME

PRIORITY CLAIM AND CROSS-REFERENCE

The present application is a Continuation-In-Part application of U.S. Ser. No. 15/798,228, filed Oct. 30, 2017, the entirety of which are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs.

Although existing semiconductor devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 6A to FIG. 17C are a p-type gate-all-around structure or a PFET during intermediate stages of manufacturing operations, in accordance with some embodiments of the present disclosure.

FIG. 18A to FIG. 25C are an n-type gate-all-around structure or an NFET during intermediate stages of manufacturing operations, in accordance with some embodiments of the present disclosure.

FIGS. 26A-33C show perspective representations of various stages of forming a semiconductor device structure, in accordance with some embodiments of the disclosure.

FIGS. 34A-36C show perspective representations of various stages of forming a semiconductor device structure, in accordance with some embodiments of the disclosure.

FIGS. 37A-42C show perspective representations of various stages of forming a semiconductor device structure, in accordance with some embodiments of the disclosure.

DETAILED DESCRIPTION

Figure 1:
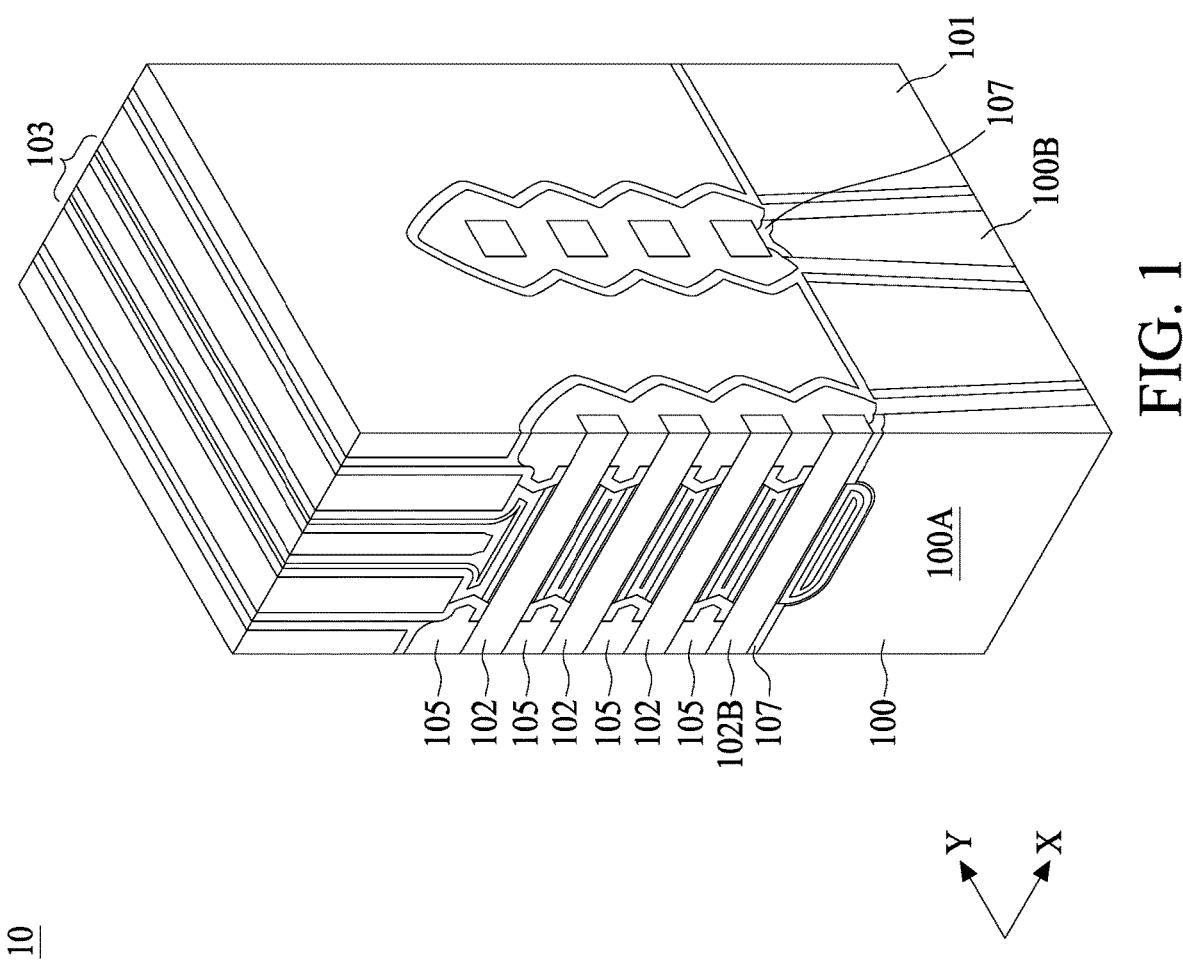
FIG. 1 is a 3D perspective view showing a semiconductor structure, in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

As the dimensions of MOSFETS (Metal Oxide Semiconductor Field-Effect Transistors) continue to shrink, the reduced length of the channel between source and drain causes unwanted side-effects (short-channel effects) due to the increased electric field intensity therein. Large off-state leakage current is often generated, for example, channel punch-through leakage current and reverse bias p-n junction leakage, and degrading device standby performance. Because ion implantation is a damage-producing technique due to the physical impact of energetic ions, thermal annealing of implanted crystalline silicon is critically important to providing good electrical characteristics of finished devices.

Any remaining, or residual, implant damage when made electrically active can enhance the reverse bias junction leakage current if the damage lies near the junction depletion regions. Channel punch-through is a condition in which the depletion layers of the source and the drain connect to each other through the substrate even at equilibrium. At low gate voltages, the punch-through current is injected through the saddle point of the intrinsic potential into the drain region by the electric field from the drain. The effect is premature breakdown of the MOSFETS.

Normally an anti-punch through (APT) implantation is applied to alleviate the channel punch-through leakage current and reverse bias p-n junction leakage, however, as the scale of device shrinkage, the efficiency of APT implantation is challenged from efficiency and manufacturing point of views. Moreover, APT implantation is applied in a region immediately next to channel region, therefore, structural integrity of the channel region is susceptible to be damaged. Gate-all-around MOSFET structure features a 3D gate area with multiple nanowire channels. Instead of having an APT implantation apply close to the channel region, present disclosure provides a structure and manufacturing method of forming an isolation layer at the source/drain and the well/substrate interface, thereby suppressing the punch-through leakage current and reverse bias p-n junction leakage in the gate-all-around MOSFET structure.

The structure provided in the present disclosure eliminate the normally applied APT implantation during manufacturing operations by forming an extra isolation layer at the substrate/well and cladded source/drain interface. The additional isolation layer can be easily integrated into current gate-all-around MOSFET without extra masking operation, which effectively reduces the punch-through leakage current and reverse bias p-n junction leakage in a cost-effective manner.

In the art of gate-all-around MOSFET, several material systems including Group III and Group V materials are currently known and shall be encompassed within the contemplated scope of present disclosure. For example, on a silicon substrate, Si nanowire for NFET and SiGe nanowire for PFET are normally adopted. On a GaAs substrate, GaAs nanowire for NFET and InGaAs nanowire for PFET are normally adopted. On a Ge/GaAs substrate, Ge nanowire for NFET and GaAs nanowire for PFET are normally adopted. For brevity purpose, present disclosure provides illustration and detailed description in Si nanowire and SiGe nanowire material system only. The same inventive concept can be applied on different semiconductor material systems are addressed.

Referring to FIG. 1, FIG. 1 is a 3D perspective view showing a semiconductor structure 10, in accordance with some embodiments of the present disclosure. In some embodiments, the semiconductor structure 10 is a p-type FinFET having SiGe nanowires or nanostructures. The semiconductor structure 10 includes a substrate 100 or a portion of the semiconductor fin. In some embodiments, the substrate 100 includes silicon, and the substrate 100 is formed according to a FinFET arrangement including one or more silicon fins separated by isolation structures 101, such as shallow trench isolation (STI). For example, a first fin 100A and a second fin 100B are formed from on the substrate 100. In an example, an isolation structure 101 has a depth between about 60 nm to about 120 nm. The semiconductor structure 10 further includes a plurality of SiGe nanowires (or nanostructures) 102 along a longitudinal direction (X-direction) of the first fin 100A, connecting the source/drain 105 at both sides of the SiGe nanowire 102. A gate 103 is over the first fin 100A, the second fin 100B, and the SiGe nanowires 102, along a transversal direction (Y-direction) of the first fin 100A. In some embodiments, the gate 103 is orthogonally crossing over the first fin 100A, the second fin 100B, and the corresponding SiGe nanowires thereof. In further detail, the gate 103 is filled between adjacent SiGe nanowires 102, as shown in semiconductor structure 10 of FIG. 1. On a cross section dissecting along the longitudinal direction of the first fin 100A, or along the X-direction, an isolation layer 107 is shown between the substrate 100 or semiconductor fin and the bottom of the plurality of the SiGe nanowires 102. On a cross section dissecting along the transversal direction of the first fin 100A, or along the Y-direction, at the source/drain 105 location, an isolation layer 107 is shown between the substrate 100 or semiconductor fin and the bottom of the plurality of the SiGe nanowires 102. Although in this embodiment the isolation layer 107 is in contact with a bottom surface of the bottom SiGe nanowire 102B, the proposed isolation layer 107 of the present disclosure, however, does not have to be in contact with the bottom surface of the bottom SiGe nanowire 102, and can be in contact with the source/drain 105 instead. Further details can be found in FIG. 4A of present disclosure.

Figure 2:
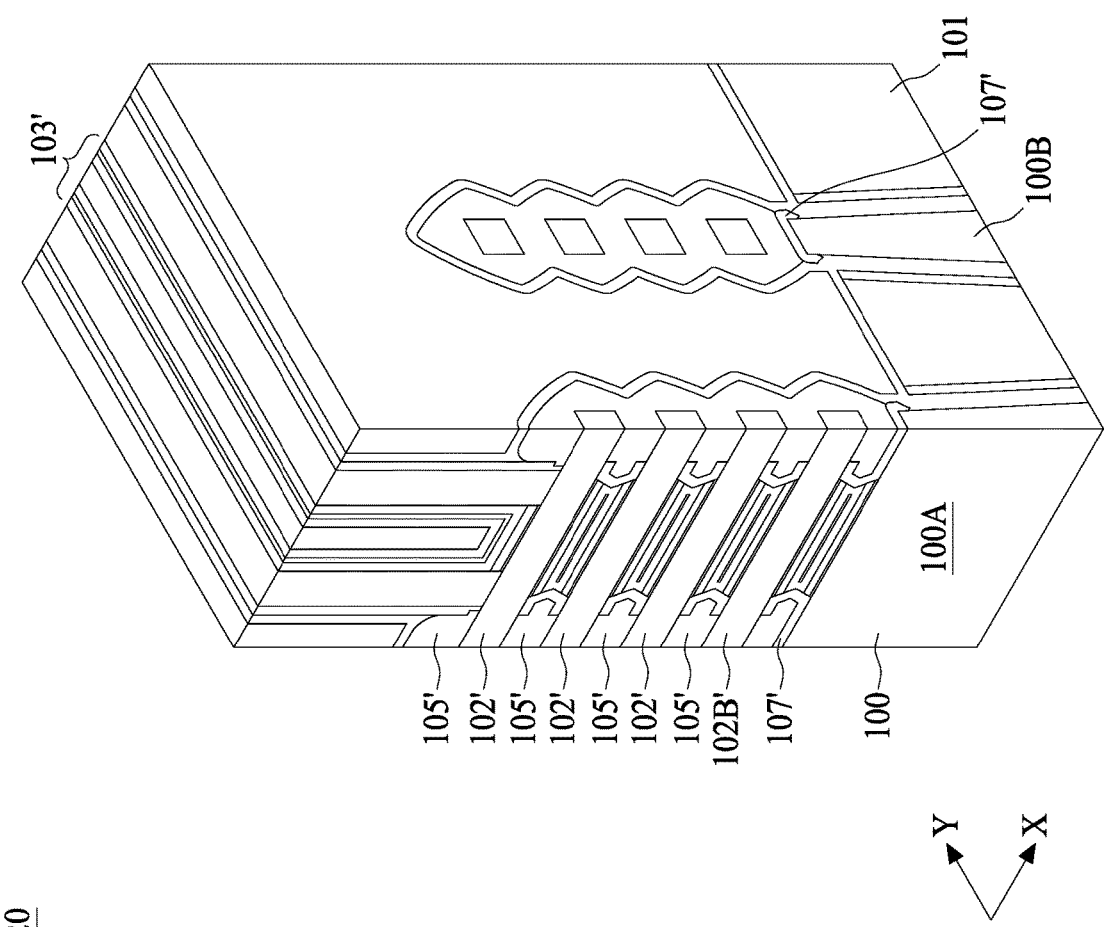
FIG. 2 is a 3D perspective view showing a semiconductor structure, in accordance with some embodiments of the present disclosure.

Referring to FIG. 2, FIG. 2 is a 3D perspective view showing a semiconductor structure 20, in accordance with some embodiments of the present disclosure. In some embodiments, the semiconductor structure 20 is an n-type FinFET having Si nanowires. The semiconductor structure 20 includes a substrate 100 or a portion of the semiconductor fin. In some embodiments, the substrate 100 includes silicon, and the substrate 100 is formed according to a FinFET arrangement including one or more silicon fins separated by isolation structures 101, such as shallow trench isolation (STI). For example, a first fin 100A and a second fin 100B are formed from on the substrate 100. In an example, an isolation structure 101 has a depth between about 60 nm to about 120 nm. The semiconductor structure 20 further includes a plurality of Si nanowires 102' along a longitudinal direction (X-direction) of the first fin 100A, connecting the source/drain 105' at both sides of the Si nanowire 102'. A gate 103' is over the first fin 100A, the second fin 100B, and the Si nanowires 102', along a transversal direction (Y-direction) of the first fin 100A. In some embodiments, the gate 103' is orthogonally crossing over the first fin 100A, the second fin 100B, and the corresponding Si nanowires thereof. In further detail, the gate 103' is filled between adjacent Si nanowires 102', as shown in semiconductor structure 20 of FIG. 2. On a cross section dissecting along the longitudinal direction of the first fin 100A, or along the X-direction, an isolation layer 107' is shown between the substrate 100 or semiconductor fin and the bottom of the plurality of the Si nanowires 102. On a cross section dissecting along the transversal direction of the first fin 100A, or along the Y-direction, at the source/drain 105' location, an isolation layer 107' is shown between the substrate 100 or semiconductor fin and the bottom of the plurality of the Si nanowires 102'. In present semiconductor structure 20, the proposed isolation layer 107' is not in contact with the bottom surface of the bottom Si nanowire 102B', and is in contact with the source/drain 105'. Further details can be found in FIG. 4B of present disclosure.

Figure 3B:
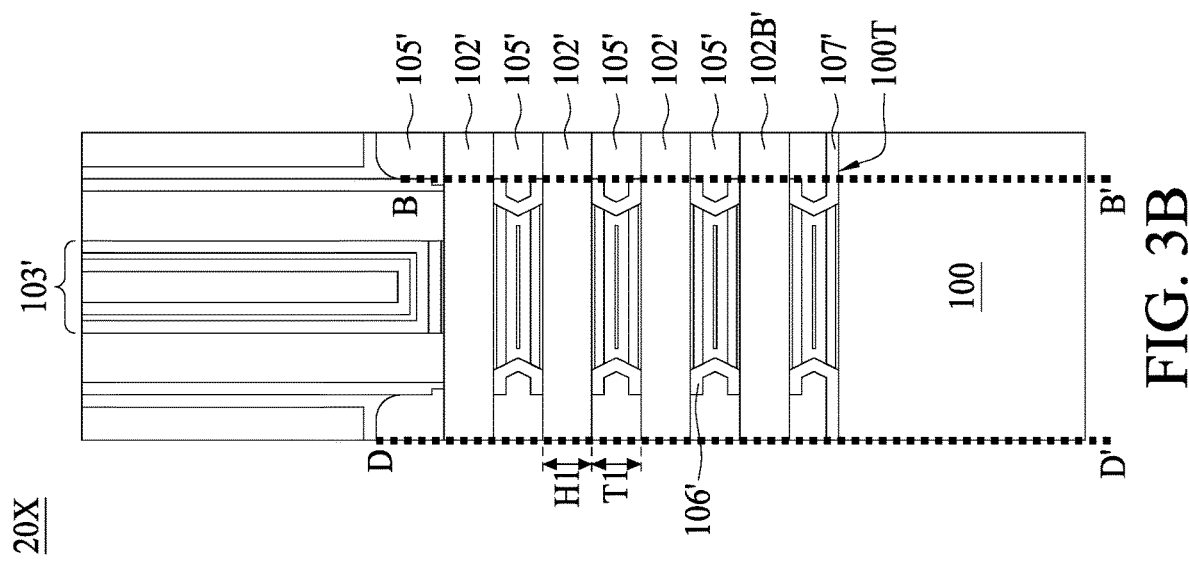
FIG. 3A and FIG. 3B are cross sectional views in an X direction of a PFET and an NFET, respectively, in accordance with some embodiments of the present disclosure.
Figure 3A:
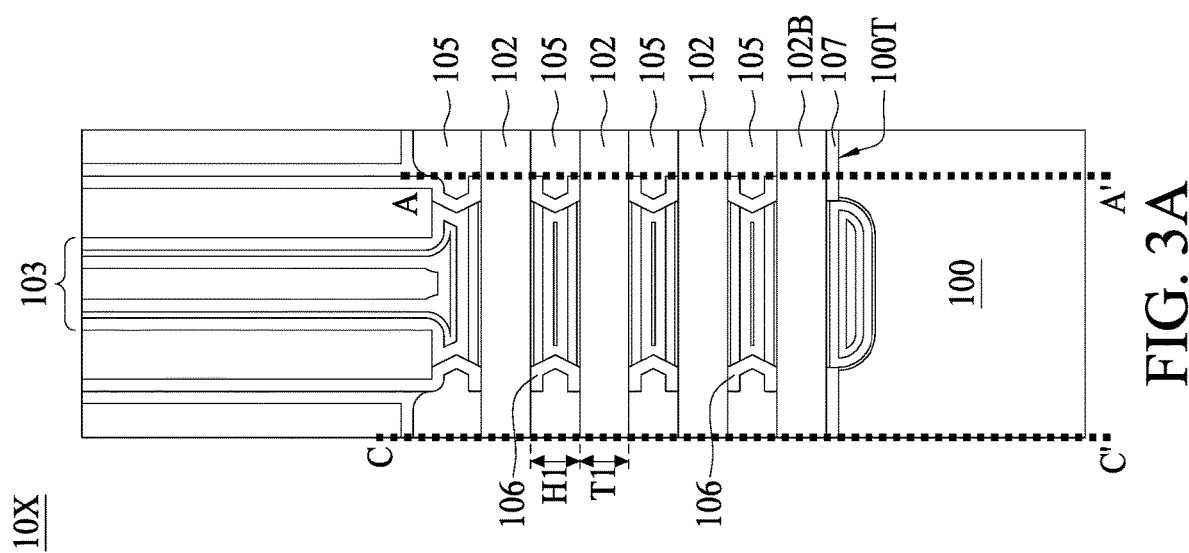

Referring to FIG. 3A, FIG. 3A is a cross sectional view dissecting along an X direction on a semiconductor fin of a PFET. FIG. 3A shows a gate-all-around structure 10X as a portion of a first transistor. The gate-all-around structure 10X includes a semiconductor substrate 100 and a plurality of SiGe nanowires 102 over the semiconductor substrate 100. Among the plurality of SiGe nanowires 102, the bottom of which is designated as a bottom SiGe nanowire 102B that is the closest to a top surface 100T of the semiconductor substrate 100. The plurality of SiGe nanowires 102 access the source/drain 105 at both sides. A gate 103 is having a portion over all the SiGe nanowires 102 and another portion filled between vertically adjacent SiGe nanowires 102. An inner spacer 106 composed of isolation material separates the source/drain 105 and the portion of gate 103 filled between SiGe nanowires 102. As shown in FIG. 3A, the inner spacer 106 is having a C-shape by conforming to a sidewall of the portion of gate 103 filled between SiGe nanowires 102 and to a top and bottom surface of the adjacent SiGe nanowires 102. Also shown in FIG. 3A, an isolation layer 107 is formed between the source/drain 105 and the top surface 100T of the substrate. In some embodiments, the isolation layer 107 is formed between the bottom SiGe nanowire 102B and the top surface 100T of the substrate. In some embodiments, the isolation layer 107 is in physical contact with the bottom SiGe nanowire 102B and the top surface 100T of the substrate. In other embodiments, the isolation layer 107 is in physical contact with the top surface 100T of the substrate but not with the bottom SiGe nanowire 102B. In some embodiments, the isolation layer 107 and the inner spacer 106 are composed of substantially identical materials that provide isolation function, such as nitride materials.

In some embodiments, a thickness T1 of the SiGe nanowire 102 is in a range of from about 3 nm to about 13 nm. In some embodiments, a thickness H1 of the portion of the gate 103 filled between vertically adjacent SiGe nanowires 102 is comparable to the thickness T1 of the SiGe nanowire 102, for example, in a range of from about 3 nm to about 13 nm.

Referring to FIG. 3B, FIG. 3B is a cross sectional view dissecting along an X direction on a semiconductor fin of an NFET. FIG. 3B shows a gate-all-around structure 20X as a portion of a second transistor formed on a same substrate with the first transistor. The gate-all-around structure 20X includes a semiconductor substrate 100 and a plurality of Si nanowires 102' over the semiconductor substrate 100. Among the plurality of Si nanowires 102', the bottom of which is designated as a bottom Si nanowire 102B' that is the closest to a top surface 100T of the semiconductor substrate 100. The plurality of Si nanowires 102' access the source/drain 105' at both sides. A gate 103' is having a portion over all the Si nanowires 102' and another portion filled between vertically adjacent Si nanowires 102'. An inner spacer 106' composed of isolation material separates the source/drain 105' and the portion of gate 103' filled between Si nanowires 102'. As shown in FIG. 3B, the inner spacer 106' is having a C-shape by conforming to a sidewall of the portion of gate 103' filled between Si nanowires 102' and to a top and bottom surface of the adjacent Si nanowires 102'. Also shown in FIG. 3B, an isolation layer 107' is formed between the source/drain 105' and the top surface 100T of the substrate. In some embodiments, the isolation layer 107' is in physical contact with the top surface 100T of the substrate 100 and the source/drain 105'. In other embodiments, the isolation layer 107 is in physical contact with the inner spacer 106' surrounding the bottom Si nanowire 102B', for example, the isolation layer 107' is an extension of the bottom leg of the C-shape of the inner spacer 106'. In some embodiments, the isolation layer 107' and the inner spacer 106' are composed of substantially identical materials that provide isolation function, such as nitride materials.

In some embodiments, a thickness T1' of the Si nanowire 102' is in a range of from about 3 nm to about 13 nm. In some embodiments, a thickness H1' of the portion of the gate 103' filled between vertically adjacent Si nanowires 102' is comparable to the thickness T1' of the Si nanowire 102', for example, in a range of from about 3 nm to about 13 nm.

Figure 4A:
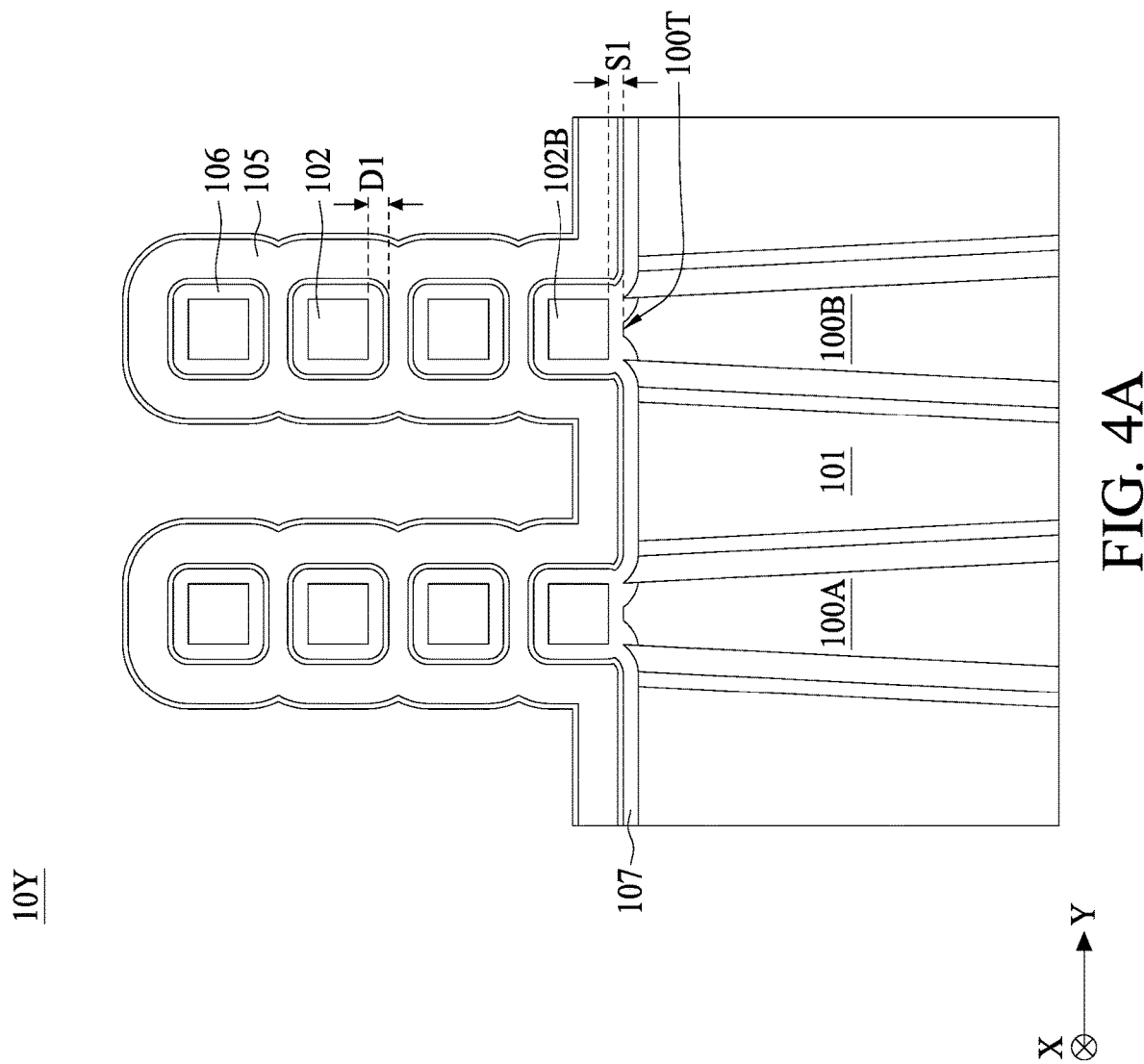
FIG. 4A is a cross sectional views in a Y direction a PFET, in accordance with some embodiments of the present disclosure.

Referring to FIG. 4A, FIG. 4A is a cross sectional view dissecting along a Y direction of a PFET along dotted lines AA' of FIG. 3A. Dotted lines AA' is illustrated aligning to a C-shape terminal of the inner spacer 106. FIG. 3A illustrates a semiconductor structure 10Y having a plurality of SiGe nanowires 102 vertically stacked over the semiconductor substrate 100 or semiconductor fin 100A or 100B. A periphery of each of the SiGe nanowires 102 is surrounded by an inner spacer 106. The inner spacer 106 surrounding a bottom surface of the bottom SiGe nanowire 102B is in contact with the isolation layer 107 over a top surface 100T of the semiconductor fin 100B. In some embodiments, a space S1 between the top surface 100T of the semiconductor fin 100B and a bottom surface of the bottom SiGe nanowire 102B is greater than a thickness D1 of the inner spacer 106 surrounding the SiGe nanowires 102. In some embodiments, the thickness D1 is substantially the same as the thickness of the isolation layer 107. The space S1 is determined to be greater than the thickness D1 in order to allow the inner spacer 106 and the isolation layer 107 to completely deposited or formed in the space S1 with target thickness D1. Although not illustrated in FIG. 4A, in some embodiments, if the space S1 is greater than 2 times of the thickness D1, source/drain 105 may be formed between the top surface 100T of the semiconductor fin 100B and the bottom surface of the bottom SiGe nanowire 102B.

Figure 4B:
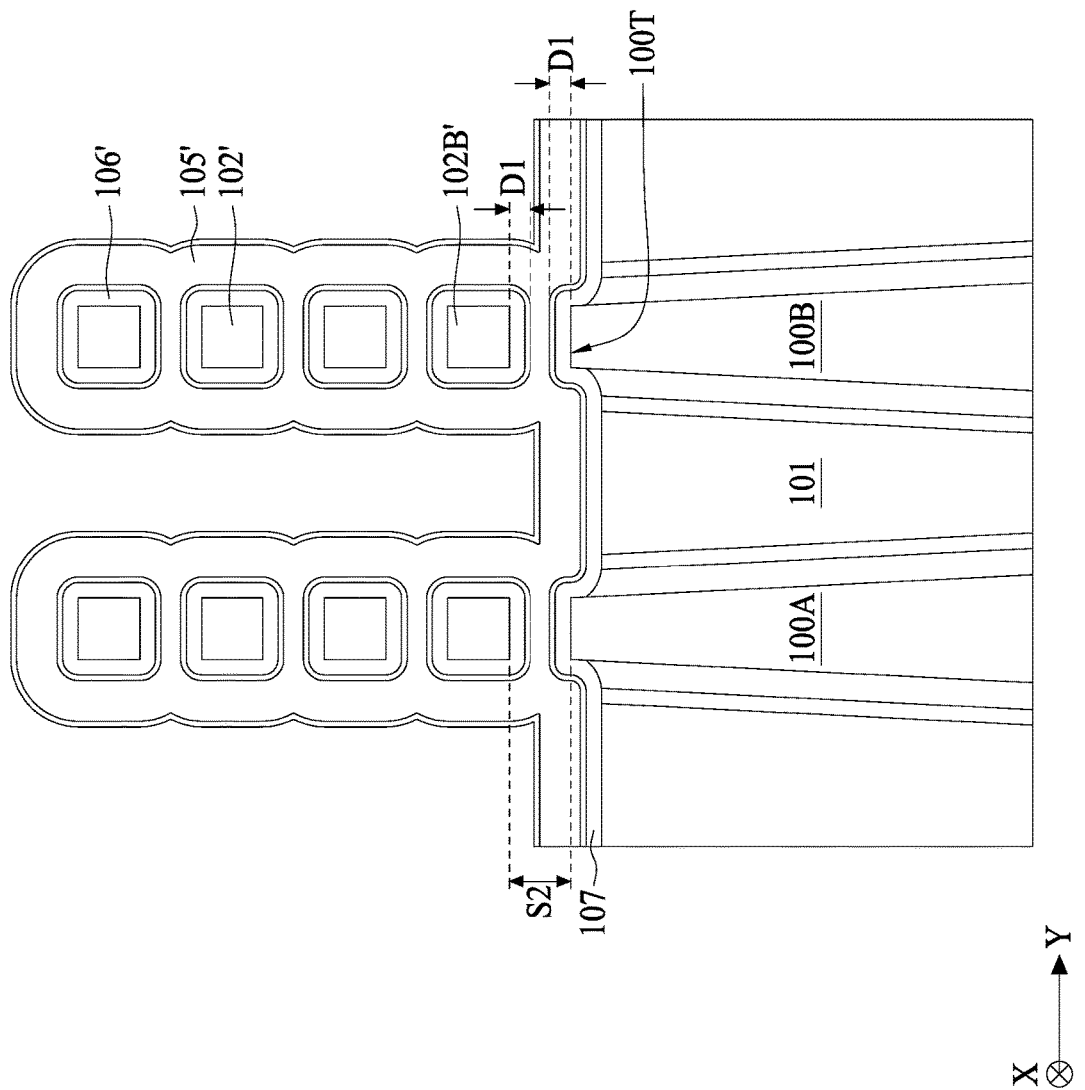
FIG. 4B is a cross sectional views in a Y direction an NFET, in accordance with some embodiments of the present disclosure.

Referring to FIG. 4B, FIG. 4B is a cross sectional view dissecting along a Y direction of an NFET along dotted lines BB' of FIG. 3B. Dotted liens BB' is illustrated aligning to a C-shape terminal of the inner spacer 106'. FIG. 3B illustrates a semiconductor structure 20Y having a plurality of Si nanowires 102' vertically stacked over the semiconductor substrate 100 or semiconductor fin 100A or 100B. A periphery of each of the Si nanowires 102' is surrounded by an inner spacer 106'. The inner spacer 106' surrounding a bottom surface of the bottom Si nanowire 102B' is not in contact with the isolation layer 107 over a top surface 100T of the semiconductor fin 100B. In some embodiments, a space S2 between the top surface 100T of the semiconductor fin 100B and a bottom surface of the bottom Si nanowire 102B' is greater than two times of the thickness D2 of the inner spacer 106' surrounding the Si nanowires 102'. In some embodiments, the thickness D2 is substantially the same as the thickness of the isolation layer 107. The space S2 is determined to be at least greater than two times of the thickness D2 in order to allow an oxide layer subsequently deposited but removed in the final product to enter the space between the inner spacer-coated bottom Si nanowire 102B' and the isolation layer-coated top surface 100T of the semiconductor fin 100B. The successful entrance of the oxide layer is essential to the desired final structure since said oxide layer functions as a hard mask preventing the isolation layer 107 over the top surface 100T to be removed during a subsequent wet etch operation. Details of the manufacturing operation are further discussed in FIG. 20A to FIG. 23C of present disclosure.

Figure 5B:
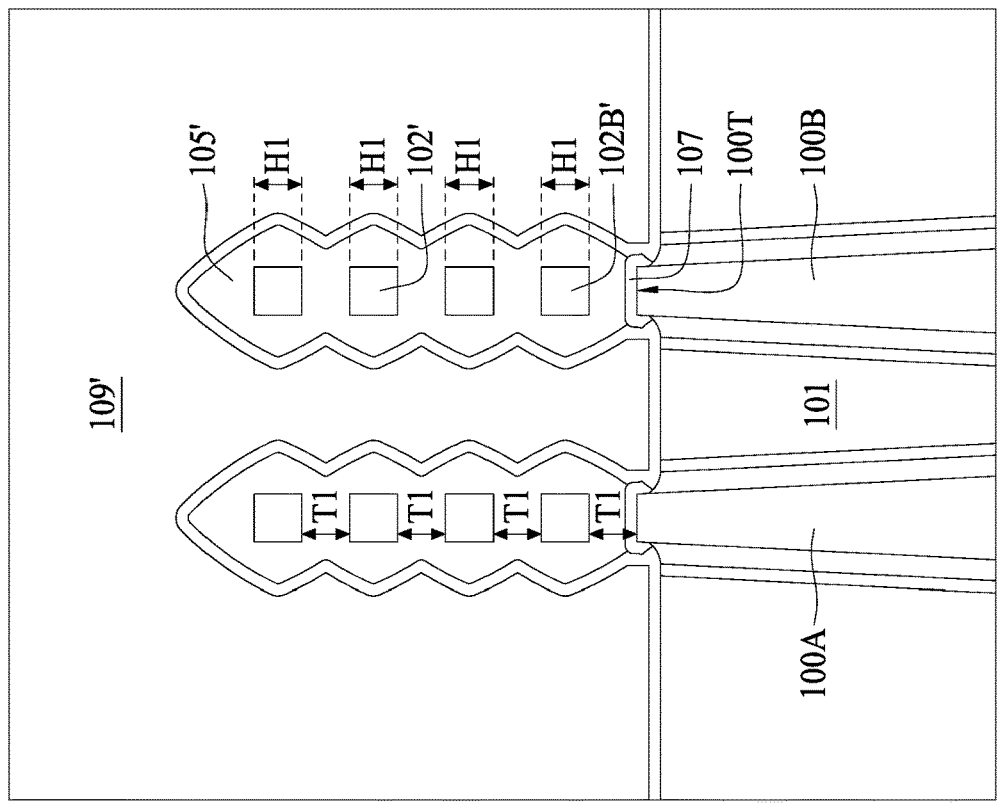
FIG. 5A and FIG. 5B are cross sectional views in a Y direction of a PFET and an NFET, respectively, in accordance with some embodiments of the present disclosure.
Figure 5A:
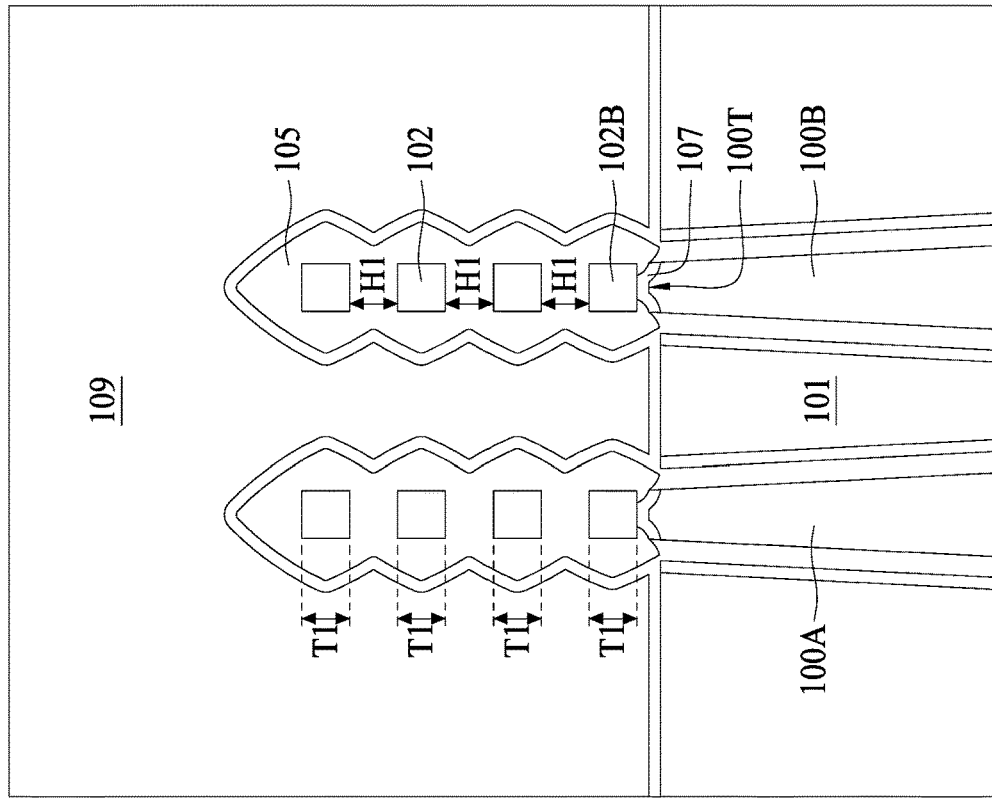

Referring to FIG. 5A, FIG. 5A is a cross sectional view dissecting along a Y direction of a PFET along dotted lines CC' of FIG. 3A. Dotted lines CC' is illustrated aligning to a portion of source/drain 105 overlapped by the ILD 109. FIG. 5A illustrates a semiconductor structure 10Y' having a plurality of SiGe nanowires 102 vertically stacked over the semiconductor substrate 100 or semiconductor fin 100A or 100B. Because the dissecting line does not pass through the inner spacer 106, a periphery of each of the SiGe nanowires 102 is directly surrounded by source/drain 105. The source/drain 105 shown in FIG. 5A is having faceted boundaries as a result of limiting epitaxial growth rate in certain particular crystal directions. In some embodiments where the space S1 between the top surface 100T of the semiconductor fin 100B and a bottom surface of the bottom SiGe nanowire 102B is equal to a thickness D1 of the isolation layer 107, the isolation layer 107 may be in contact with the bottom of the bottom SiGe nanowire 102B. In other embodiments where the space S1 between the top surface 100T of the semiconductor fin 100B and a bottom surface of the bottom SiGe nanowire 102B is greater than a thickness D1 of the isolation layer 107, the isolation layer 107 may not be in contact with the bottom of the bottom SiGe nanowire 102B. Instead, the source/drain 105 is spacing between the isolation layer 107 and the bottom of the bottom SiGe nanowire 102B.

Referring to FIG. 5B, FIG. 5B is a cross sectional view dissecting along a Y direction of an NFET along dotted lines DD' of FIG. 3B. Dotted lines DD' is illustrated aligning to a portion of source/drain 105 overlapped by the ILD 109. FIG. 5B illustrates a semiconductor structure 20Y' having a plurality of Si nanowires 102' vertically stacked over the semiconductor substrate 100 or semiconductor fin 100A or 100B. Because the dissecting line does not pass through the inner spacer 106, a periphery of each of the Si nanowires 102' is directly surrounded by source/drain 105'. The source/drain 105' shown in FIG. 5B is having faceted boundaries as a result of limiting epitaxial growth rate in certain particular crystal directions. In some embodiments where the space S1 between the top surface 100T of the semiconductor fin 100B and a bottom surface of the bottom Si nanowire 102B' is e greater than two times of the thickens D1 of the isolation layer 107', the isolation layer 107' is not in contact with the bottom of the bottom Si nanowire 102B', instead, the isolation layer 107' is in contact with the source/drain 105' under the bottom Si nanowire 102B'.

FIG. 6A to FIG. 17C are a p-type gate-all-around structure or a PFET during intermediate stages of manufacturing operations, in accordance with some embodiments of the present disclosure. Each intermediate stage is represented by three perspectives: a 3D perspective view, a cross sectional view dissecting along an X direction on a semiconductor fin of the PFET, and a cross sectional view dissecting in a Y direction of the PFET along dotted lines CC' of FIG. 6A.

In FIG. 6A to FIG. 6C, a silicon and silicon germanium stack 1023 is formed over the substrate 100. For example, a first silicon and silicon germanium stack 1023 is formed over the substrate 100. The first silicon and silicon germanium stack 1023 includes one or more silicon layers and one or more silicon germanium layers. For example, the first silicon and silicon germanium stack 1023 includes a first silicon layer 1023A, a first silicon germanium layer 1023A', a second silicon layer 1023B, a second silicon germanium layer 1023B', a third silicon layer 1023C, a third silicon germanium layer 1023C', a fourth silicon layer 1023D, and a fourth silicon germanium layer 1023D'. It is appreciated that any number of silicon layers or silicon germanium layers can be formed. In an example, a silicon germanium layer comprises between about 20% to about 50% germanium. The silicon and silicon germanium stack 1023 is then patterned to form semiconductor fins 100A and 100B, separated by an STI 101, a first liner layer 1001, and a second liner layer 1002. An input/output (I/O) oxide layer 1003 is conformably formed over the portion of the fins 100A, 100B protruding from the STI 101 as well as over the top surface of the STI 101. A dummy gate 1030 is orthogonally formed, by a subsequent patterning operation, across the first and second fins 100A, 100B after the formation of the I/O oxide layer 1003. The dummy gate 1030 is a sacrificial gate, such as a polygate, formed by a patterning technique. As shown in FIG. 6B, the dummy gate 1030 is not directly contacting the patterned first silicon and silicon germanium stack 1023 but is in direct contact with the I/O oxide layer 1003. Since FIG. 6C is dissecting along the dotted lines CC' of FIG. 6A, no dummy gate 1030 is shown in FIG. 6C.

Figure 7A:
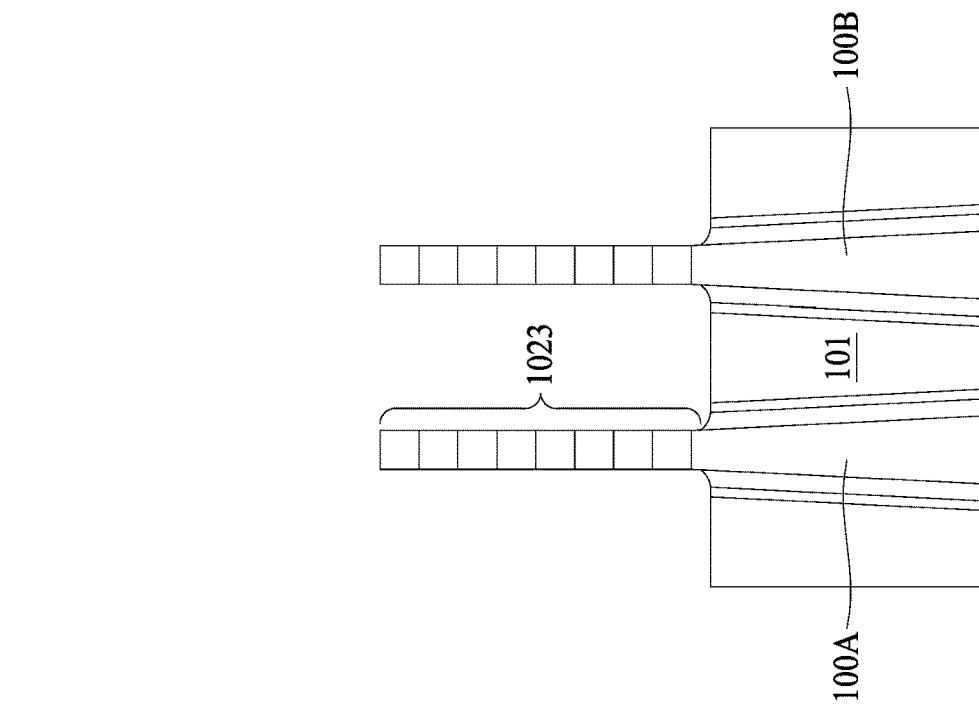
Figure 7B:
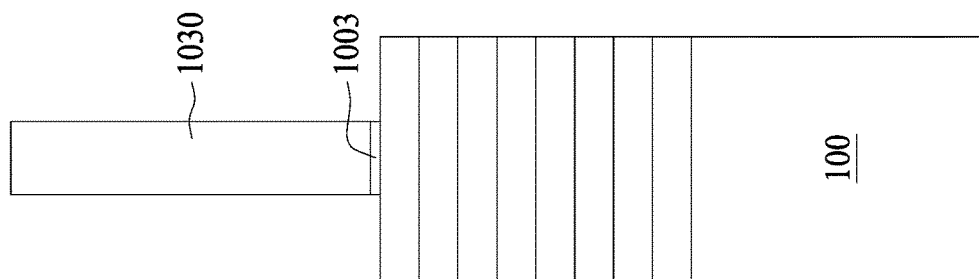
Figure 7C:
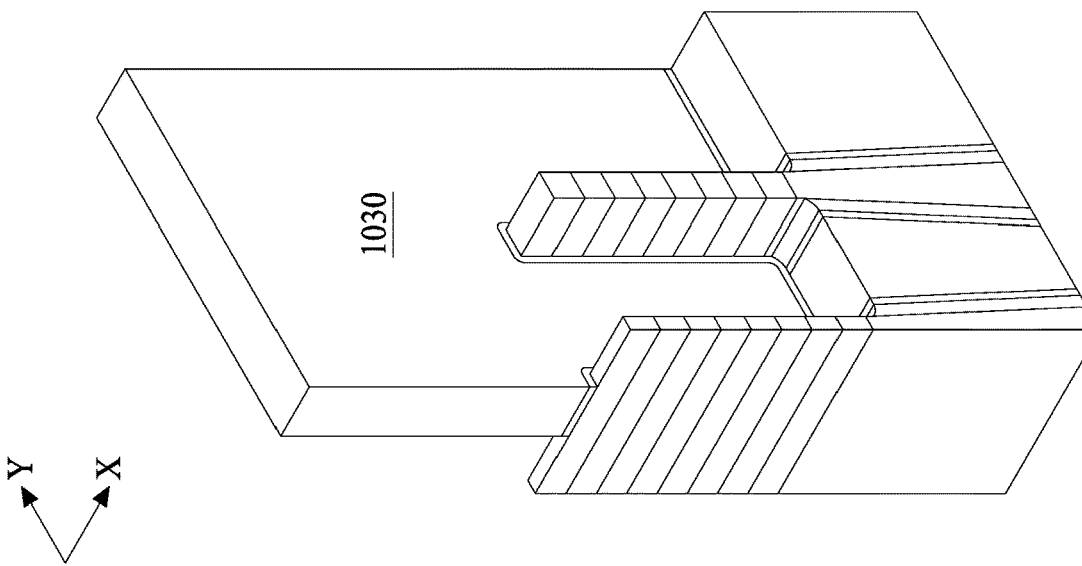

In FIG. 7A to FIG. 7C, the I/O oxide layer 1003 not masked by the dummy gate 1030 is removed. As shown in FIG. 7B, only the portion of the I/O oxide layer 1003 under the dummy gate 103 is remained after current oxide etching operation. In FIG. 8A to FIG. 8C, a seal spacer 1004 is conformably deposited over the fins 100A and 100B not masked by the dummy gate 1030. The seal spacer 1004 also deposited to surround the sidewall of the dummy gate 1030. In FIG. 9A to FIG. 9C, a masked etch is performed in order to remove the seal spacer 1004 from a portion of the patterned first silicon and silicon germanium stack 1023 that is not covered by the photoresist 1005. As shown in FIG. 9B, a portion of the top surface of the first silicon and silicon germanium stack 1023 is exposed from the seal spacer 1004. This masked etch also removes the seal spacer 1004 over the STI surface. In FIG. 9C, a top surface of the STI 101 and a sidewall of the first silicon and silicon germanium stack 1023 are exposed from the seal spacer 1004 previously deposited thereon.

In FIG. 10A to FIG. 10C, a selective etch is performed to laterally remove the patterned silicon stacks 1023A, 1023B, 1023C, and 1023D while maintaining little to no removal of the patterned silicon germanium stacks 1023A', 1023B', 1023C', and 1023D' or the SiGe nanowire 102 in the final structure. In some embodiments, the selective etch stops upon the showing of faceted crystal surfaces (111) of the patterned silicon stacks. As shown in FIG. 10C, a plurality of vertically stacked SiGe nanowires 102 are released from the patterned silicon stacks 1023A, 1023B, 1023C, and 1023D and are free standing with respect to etch other. A bottom surface of the bottom SiGe nanowire 102B shows a separation S1 with the top surface 100T of the fin 100B.

Figures 11A, 11B, 11C:
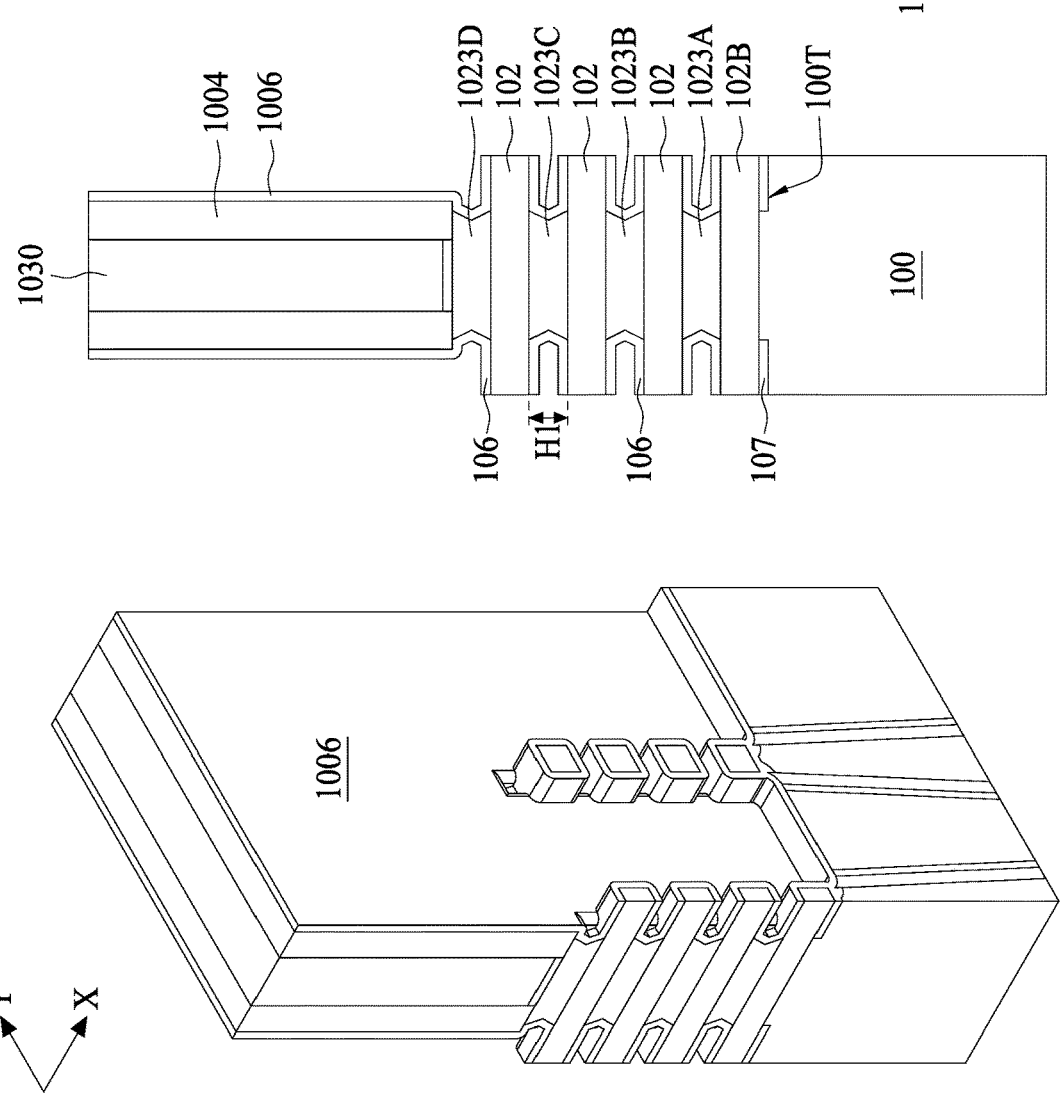

In FIG. 11A to FIG. 11C, a dielectric layer 1006 is conformably formed over the sidewall of the seal spacer 1004, the sidewall of the faceted crystal surfaces (111) of the patterned silicon stacks 1023A, 1023B, 1023C, and 1023D, and surrounding the plurality of SiGe nanowires 102. In some embodiments, the dielectric layer 1006 includes isolation materials, for example, low-k dielectric or silicon nitrides. The portion of the dielectric layer 1006 formed at the sidewall of the faceted crystal surfaces (111) of the patterned silicon stacks 1023A, 1023B, 1023C, 1023D is called inner spacer 106 in the present disclosure. The portion of the dielectric layer 1006 formed at the top surface 100T of the fins 100A, 100B or substrate 100 is called isolation layer 107 in the present disclosure. As shown in FIG. 11C, a thickness D1 of the dielectric layer 1006 initially deposited can be determined according to a spacing or thickness H1 between adjacent free standing SiGe nanowires 102. In some embodiments, the thickness D1 of the dielectric layer 1006 is selected to be half of the spacing or thickness H1 in order to accommodate itself into the spacing or thickness H1. In some embodiments, the separation S1 shall be designed to be greater than the thickens D1 of the dielectric layer 1006 so as to allow the dielectric layer 1006 to enter the separation S1 and evenly cover the top surface 100T of the semiconductor fins 100A, 100B.

In FIG. 12A to FIG. 12C, an oxide layer 1007 is conformably formed to surround the sidewall of the dummy gate 1030, the seal spacer 1004, and the dielectric layer 1006. The oxide layer 1007 also fills the spacing or thickness H1 between adjacent free standing SiGe nanowires 102. As shown in FIG. 12C, the oxide layer 1007 surrounds the plurality of the free standing SiGe nanowires 102 as well as the dielectric layer 1006 cover thereon in the previous operation. Although not illustrated in FIG. 12C, in the case where separation S1 is greater than 2 times of the thickness D1 of the dielectric layer 1006, the oxide layer 1007 could enter the separation S1 between the top surface 100T of the semiconductor fins 100A, 100B and the bottom of the bottom SiGe nanowire 102B because the separation S1 is spacious enough to accommodate 2 layers of dielectric layer 1006, one at the bottom of the bottom SiGe nanowire 102B, the other at the top surface 100T of the semiconductor fin 100A, 100B, as well as an extra oxide layer 1007.

Figure 13C:
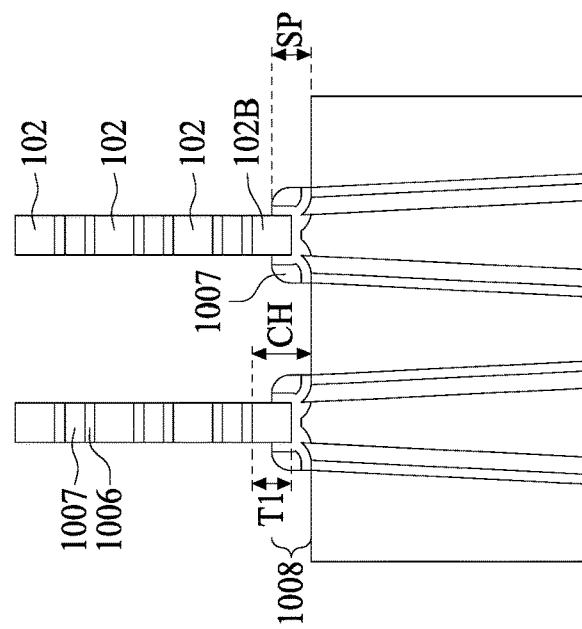
Figure 13B:
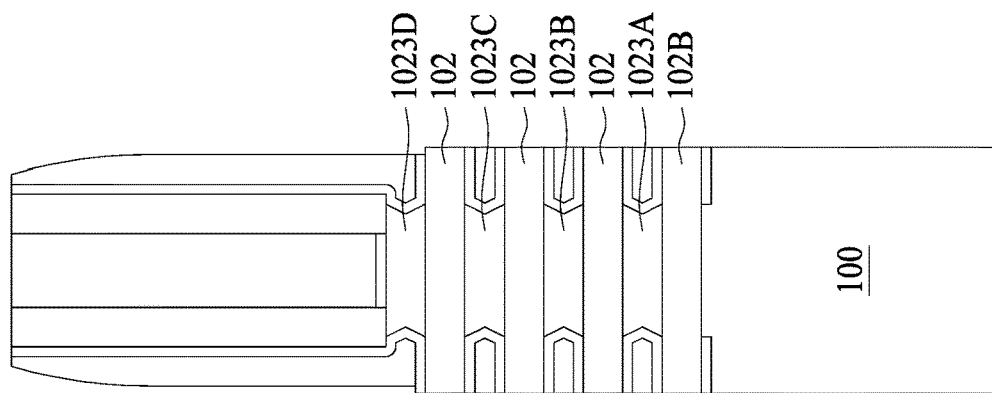
Figure 13A:
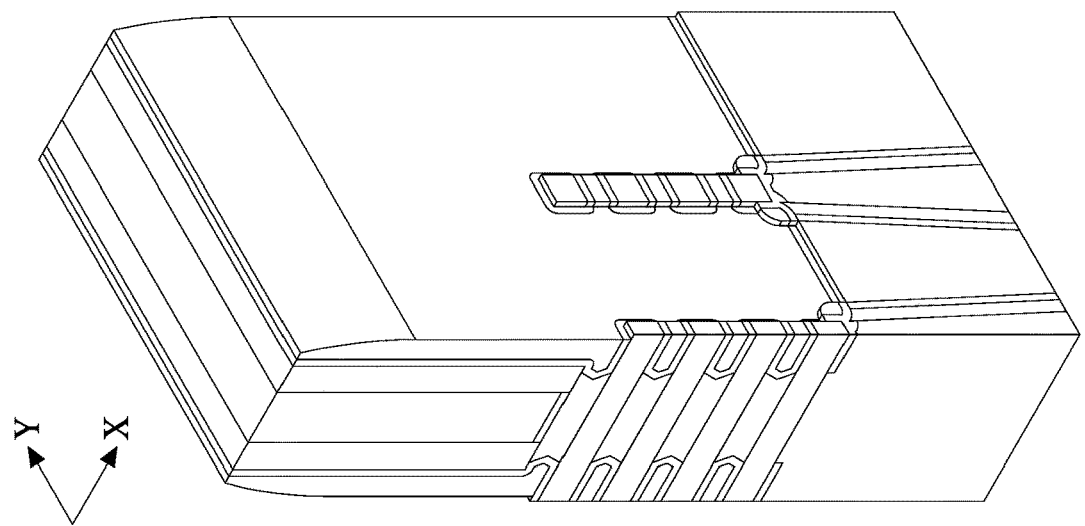

In FIG. 13A to FIG. 13C, an anisotropic etch is performed on the dielectric layer 1006 and the oxide layer 1007. As shown in FIG. 13B, the sidewall of the oxide layer 1007 is partially rounded after the anisotropic etch. In FIG. 13C, the anisotropic etch is controlled to remove the oxide layer 1007 and the dielectric layer 1006 surrounding at the sidewalls of the SiGe nanowire 102 to an extent that a bottom spacer 1008 forms as a residual of the isotropic etch operation. The bottom spacer 1008 is composed of remaining dielectric layer 1006 between the remaining oxide layer 1007 and a sidewall of the bottom SiGe nanowire 102B. A height SP of the bottom spacer 1008 is measured from an STI 101 top to the spacer 1008 top. In some embodiments, the bottom spacer 1008 is controlled to at least partially surround the bottom SiGe nanowire 102B. Alternatively stated, if the distance CH is measured from the STI 101 top to the bottom SiGe nanowire 102B top, a difference between the distance CH and the height SP shall be a positive number smaller than a thickness T1 of the bottom SiGe nanowire 102B.

In FIG. 14A to FIG. 14C, an isotropic etch is performed to remove a portion of the dielectric layer 1006 not in contact with the top surface 100T of the semiconductor fins 100A, 100B. As shown in FIG. 14B, the dielectric layer 1006 surrounding the SiGe nanowires 102, excluding the bottom SiGe nanowire 102B, is removed by the isotropic etch, for example, a wet etch operation which removes low-k or nitride materials. Only the dielectric layer 1006 between the top surface 100T and the bottom of the bottom SiGe nanowire 102B is not removed by the isotropic etch. The aforesaid portion of the dielectric layer 1006 turns in to the isolation layer 107 in the final structure. As previously stated, the bottom spacer 1008 is controlled to at least partially surround the bottom SiGe nanowire 102B. The oxide layer 1007 of the bottom spacer 1008 functions as a hardmask to the isolation layer 107 so as to prevent the complete removal of the remaining dielectric layer 1006 during the isotropic etch operation.

Figure 15C:
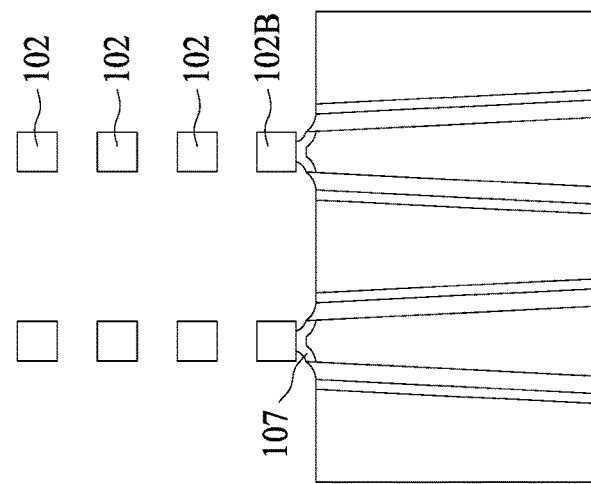
Figure 15B:
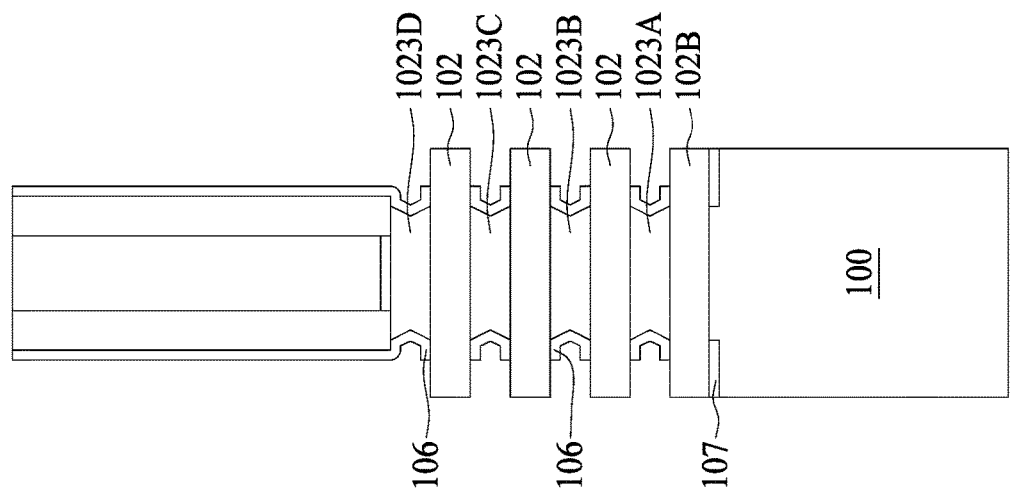
Figure 15A:
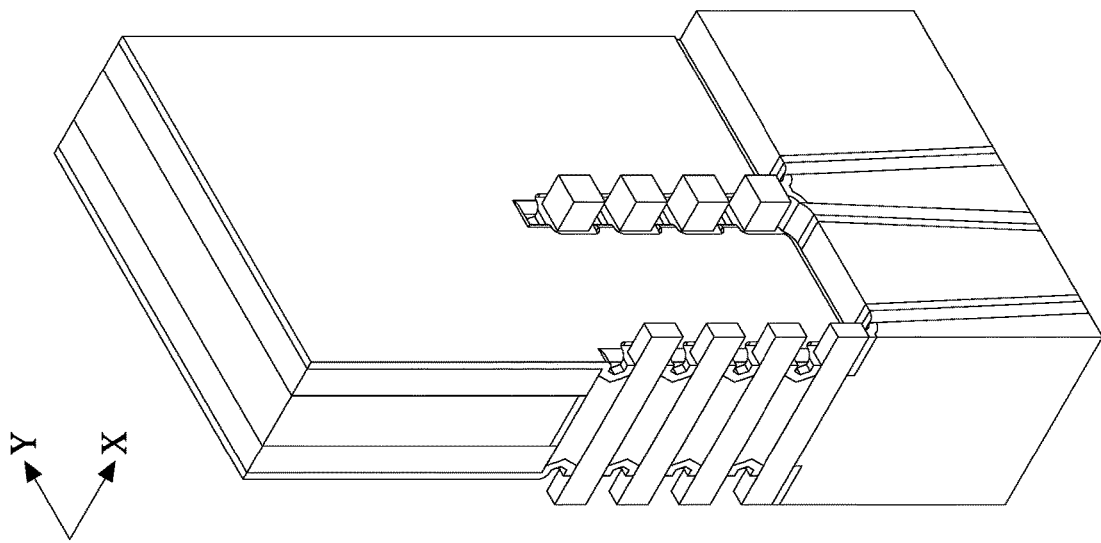
Figure 16C:
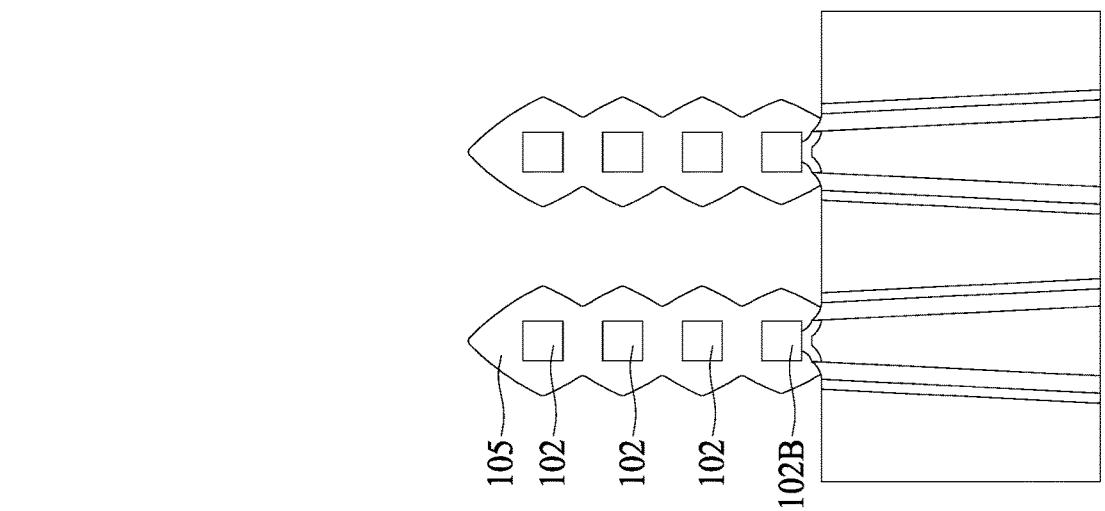
Figure 16B:
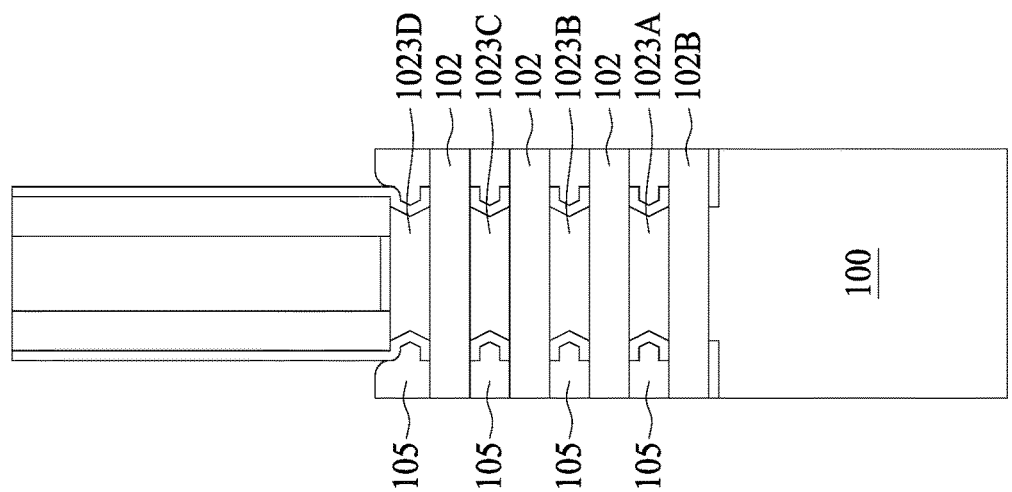
Figure 16A:
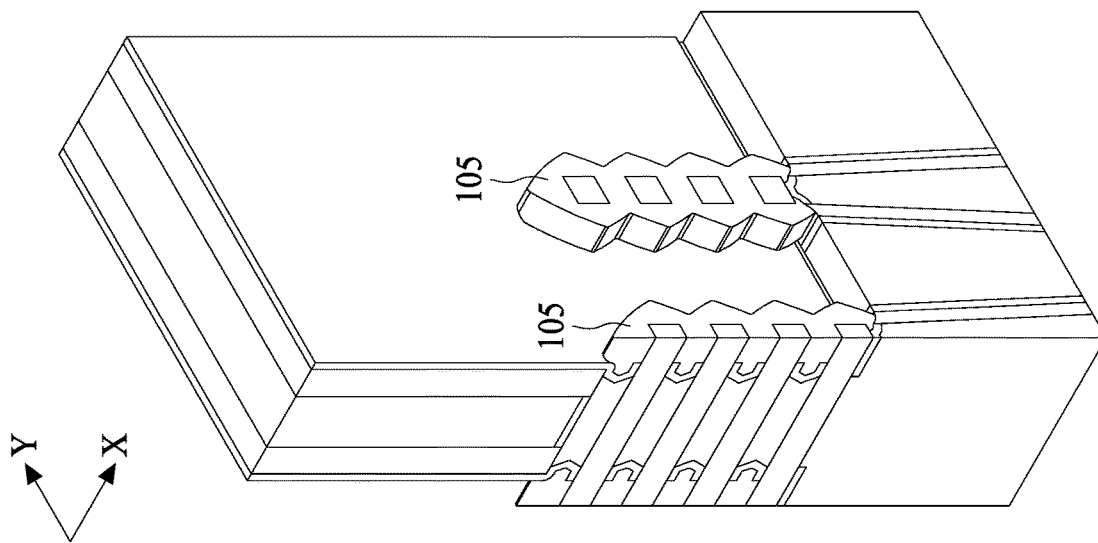

In FIG. 15A to FIG. 15C, the remaining oxide layer 1007 at the bottom spacer 1008 and at the sidewall of the dummy gate 1030 are removed by an oxide wet etch operation. In FIG. 16A to FIG. 16C, a source/drain 105 is formed within a first source region and a first drain region, such as through an epitaxial growth technique, to create a first source and a first drain for the silicon germanium nanowire PFET. In some embodiments, the source/drain 105 is composed of SiGeB. As shown in FIG. 16C, the source/drain 105 possesses faceted boundaries as a result of limiting epitaxial growth rate in certain particular crystal directions. In FIG. 17A to FIG. 17C, a replacement gate 103 is formed to complete the PFET. After removal of the dummy gate 1030 and the patterned silicon stacks 1023A, 1023B, 1023C, and 1023D, an interfacial layer material, a high-k dielectric layer, a titanium nitride capping layer, a work function metal layer, and tungsten gate metal can be formed around as well as over the plurality of SiGe nanowire 102. An etch stop layer 108 and an interlayer dialectic (ILD) 109 is further formed to cover the source/drain 105 and the seal spacer 1004 of the replacement gate 103.

In some embodiments, one or more NFET is formed within the semiconductor structure before, during, and/or after formation of the one or more PFET as a single fabrication process because formation of NFET and formation of P FET both utilize silicon and silicon germanium stacks. For example, during at least some of the processes of forming the PFET, NFET portion of the semiconductor structure are protected by a hard mask. During at least some of the processes of forming the NFET, PFET of the semiconductor are protected by a hard mask.

FIG. 18A to FIG. 25C are an n-type gate-all-around structure or an NFET during intermediate stages of manufacturing operations, in accordance with some embodiments of the present disclosure. Each intermediate stage is represented by three perspectives: a 3D perspective view, a cross sectional view dissecting along an X direction on a semiconductor fin of the NFET, and a cross sectional view dissecting in a Y direction of the NFET along dotted lines DD' of FIG. 18A. The first four operation in manufacturing the NFET is substantially identical to those in the PFET and is not repeated here for brevity.

Figure 18C:
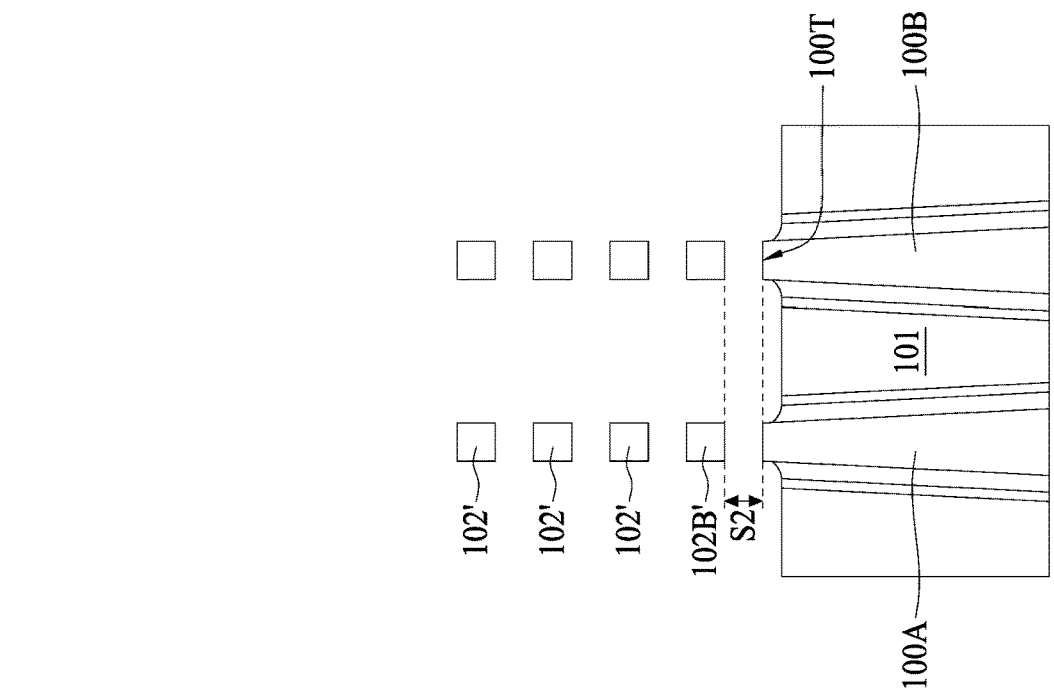
Figure 18B:
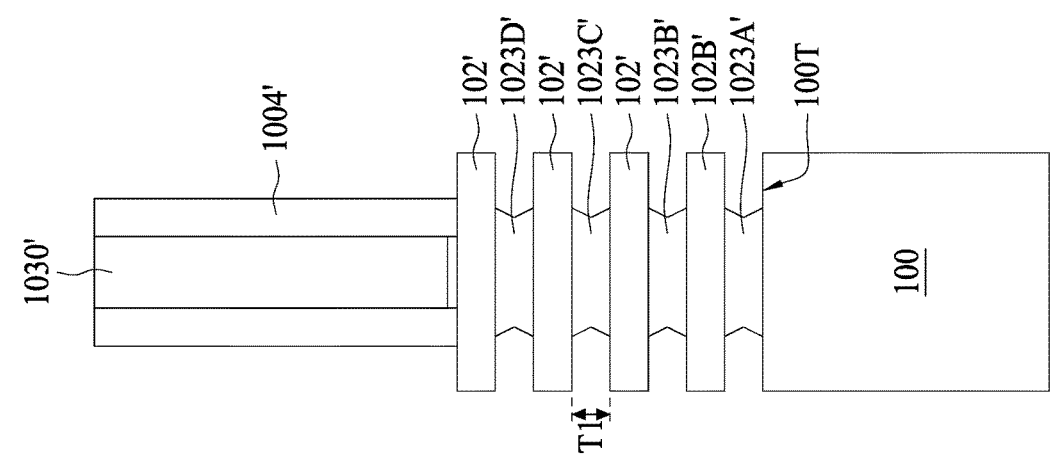
Figure 18A:
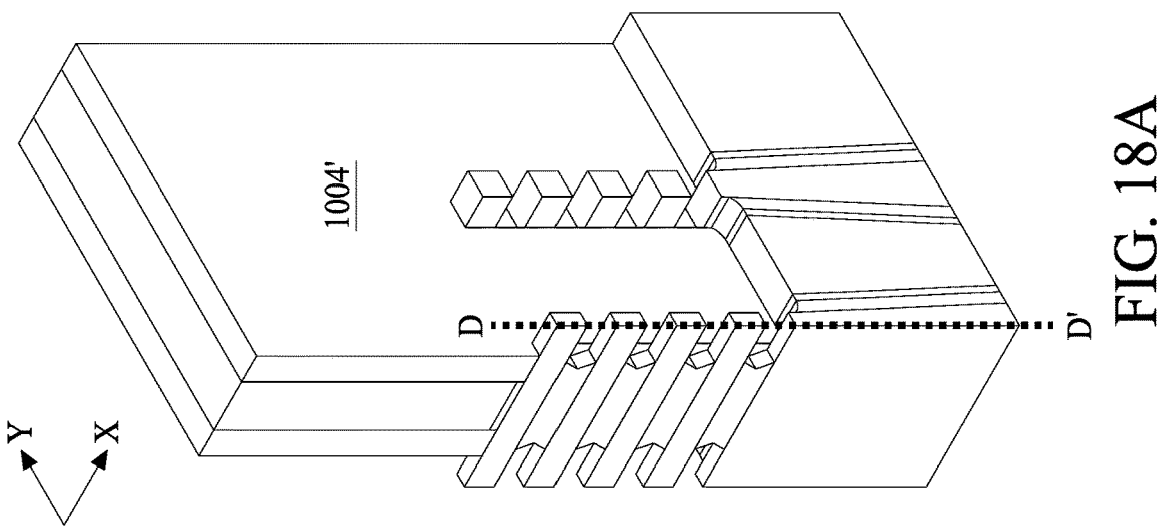

In FIG. 18A to FIG. 18C, a selective etch is performed to laterally remove the patterned silicon germanium stacks 1023A', 1023B', 1023C', and 1023D' while maintaining little to no removal of the patterned silicon stacks 1023A, 1023B, 1023C, and 1023D or the Si nanowire 102' in the final structure. In some embodiments, the selective etch stops upon the showing of faceted crystal surfaces (111) of the patterned silicon germanium stacks. As shown in FIG. 18C, a plurality of vertically stacked Si nanowires 102' are released from the patterned silicon germanium stacks 1023A', 1023B', 1023C', and 1023D' and are free standing with respect to etch other. A bottom surface of the bottom Si nanowire 102B' shows a separation S2 with the top surface 100T of the fin 100B.

Figure 19C:
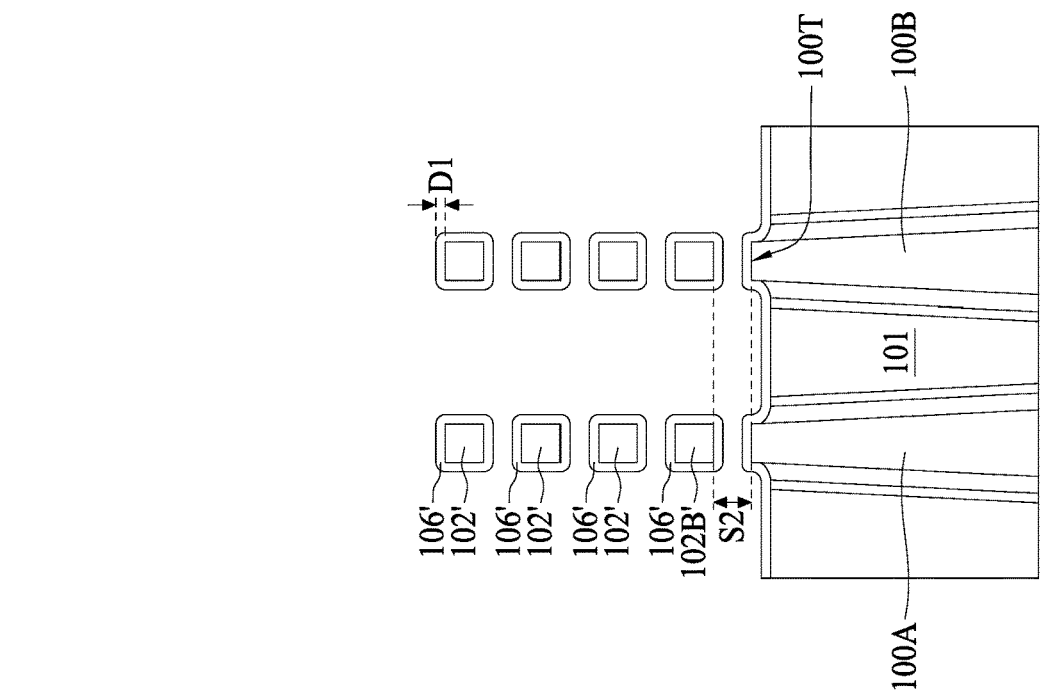
Figure 19B:
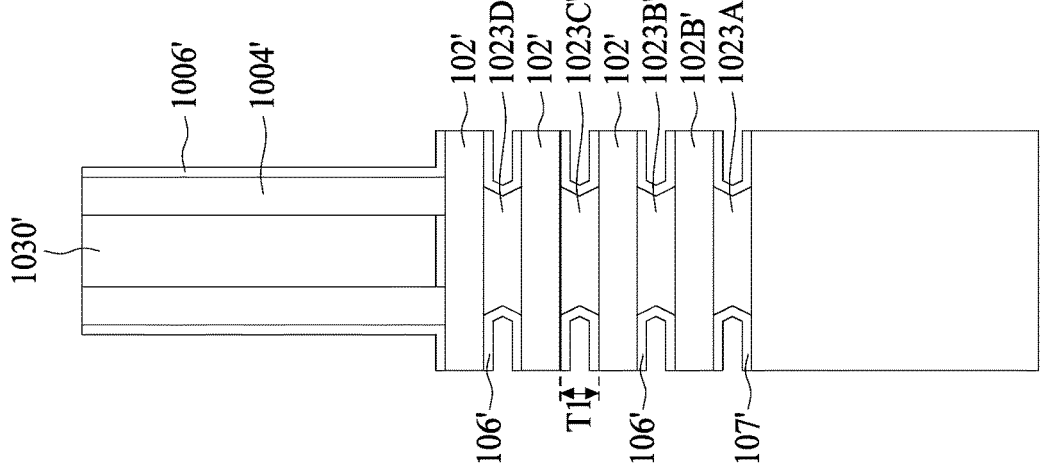
Figure 19A:
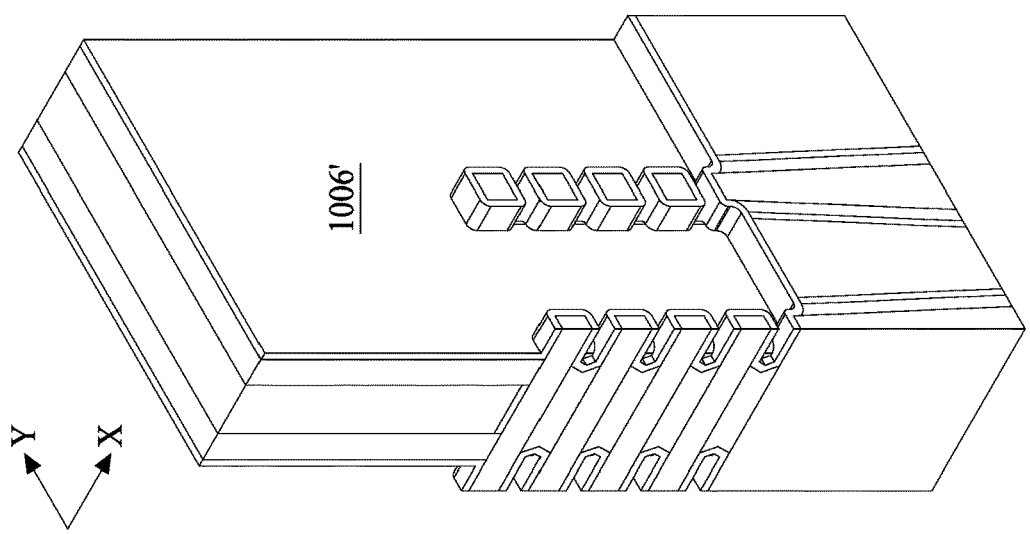

In FIG. 19A to FIG. 19C, a dielectric layer 1006' is conformably formed over the sidewall of the seal spacer 1004', the sidewall of the faceted crystal surfaces (111) of the patterned silicon germanium stacks 1023A', 1023B', 1023C', and 1023D', and surrounding the plurality of Si nanowires 102'. In some embodiments, the dielectric layer 1006 includes isolation materials, for example, low-k dielectric or silicon nitrides. The portion of the dielectric layer 1006 formed at the sidewall of the faceted crystal surfaces (111) of the patterned germanium stacks 1023A', 1023B', 1023C', and 1023D' is called inner spacer 106' in the present disclosure. The portion of the dielectric layer 1006' formed at the top surface 100T of the fins 100A, 100B or substrate 100 is called isolation layer 107' in the present disclosure. As shown in FIG. 19C, a thickness D1 of the dielectric layer 1006' initially deposited can be determined according to a spacing or thickness T1 between adjacent free standing Si nanowires 102'. In some embodiments, the thickness T1 of the dielectric layer 1006' is selected to be half of the spacing or thickness T1 in order to accommodate itself into the spacing or thickness T1. In some embodiments, the separation S2 shall be designed to be greater than the thickness T1 of the dielectric layer 1006' so as to allow the dielectric layer 1006' to enter the separation S2 and evenly cover the top surface 100T of the semiconductor fins 100A, 100B.

Figure 20C:
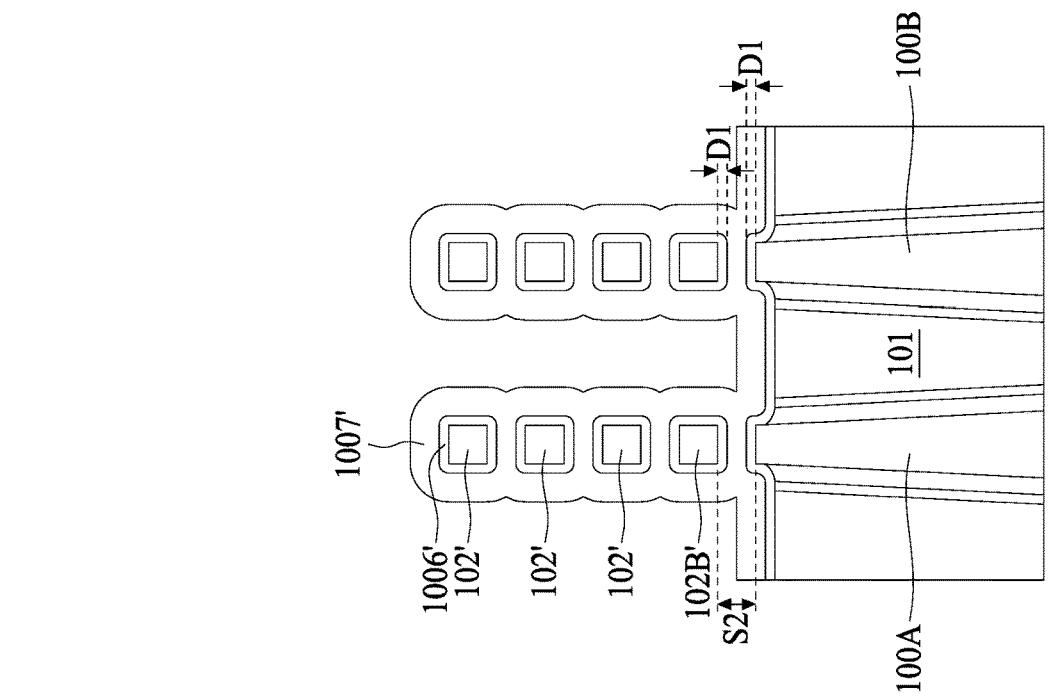
Figure 20B:
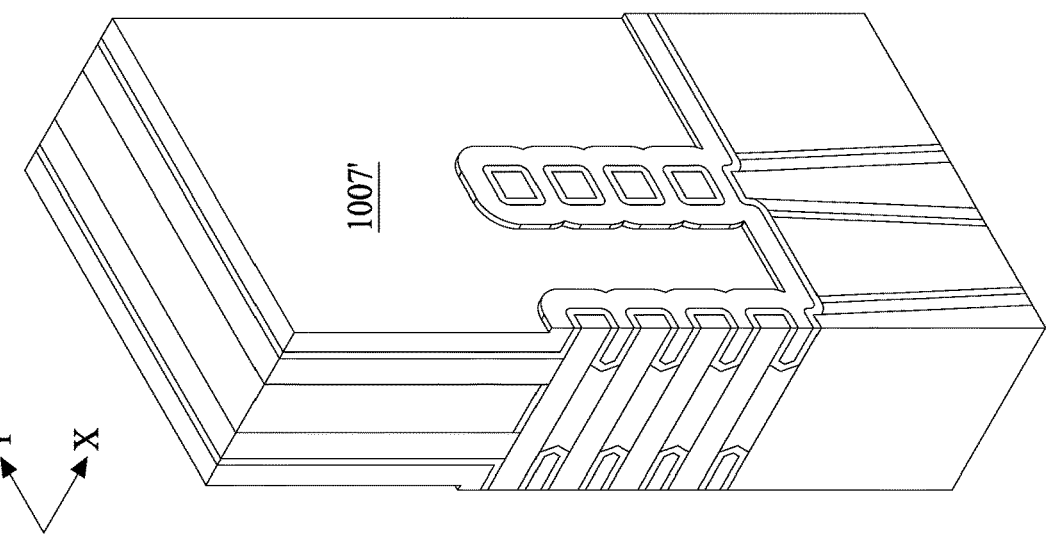
Figure 20A:
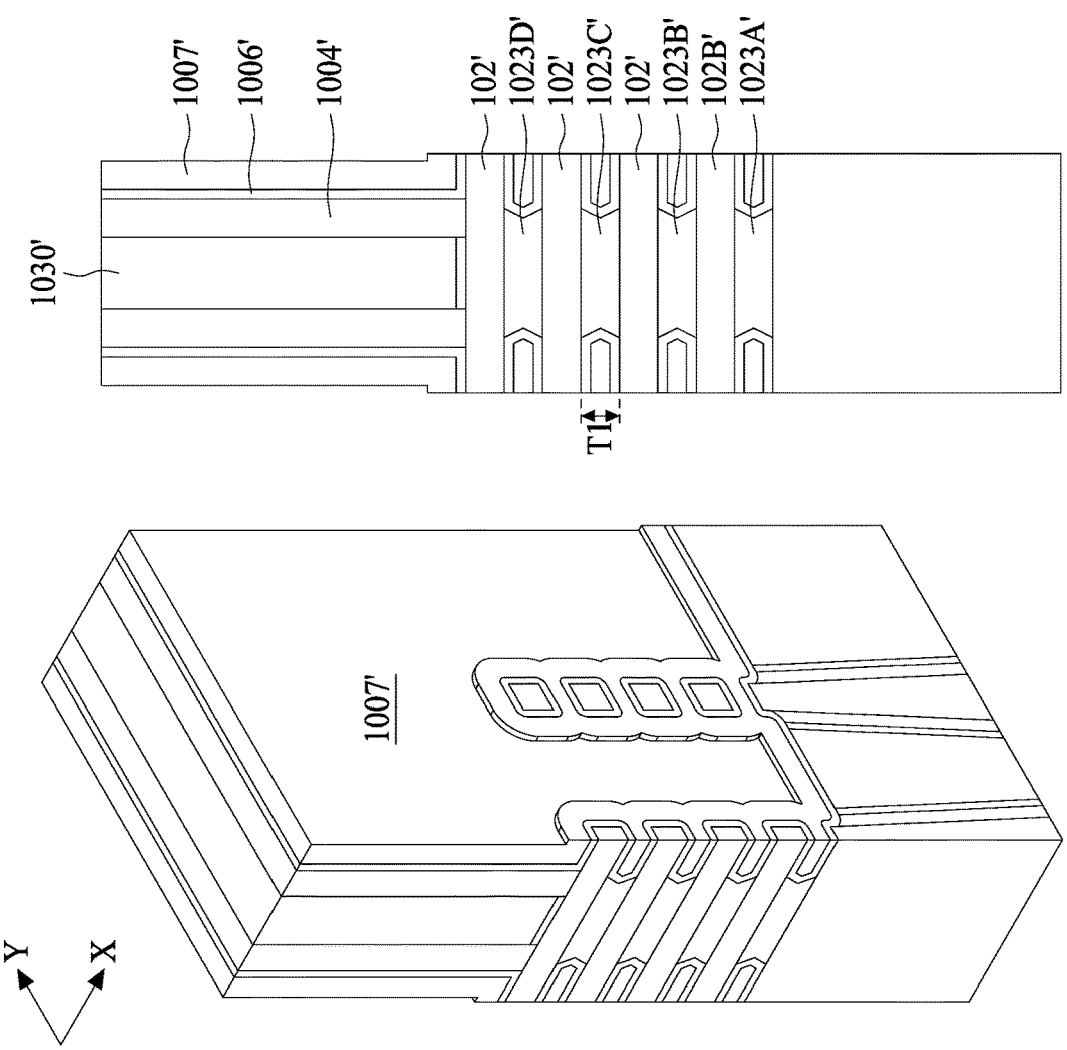

In FIG. 20A to FIG. 20C, an oxide layer 1007' is conformably formed to surround the sidewall of the dummy gate 1030', the seal spacer 1004', and the dielectric layer 1006. The oxide layer 1007' also fills the spacing or thickness T1 between adjacent free standing Si nanowires 102'. As shown in FIG. 20C, the oxide layer 1007' surrounds the plurality of the free standing Si nanowires 102' as well as the dielectric layer 1006' cover thereon in the previous operation. In some embodiments, the separation S2 is greater than 2 times of the thickness D1 of the dielectric layer 1006', as a result, the oxide layer 1007' enters the separation S2 between the top surface 100T of the semiconductor fins 100A, 100B and the bottom of the bottom Si nanowire 102B' because the separation S2 is spacious enough to accommodate 2 layers of dielectric layer 1006', one at the bottom of the bottom silicon germanium nanowire 102B', the other at the top surface 100T of the semiconductor fin 100A, 100B, as well as an extra oxide layer 1007'. Since silicon germanium is the material at the bottom of the silicon and silicon germanium stack 1023, the separation S2 of the NFET is greater than the separation S1 of the PFET counterpart previously discussed.

In FIG. 21A to FIG. 21C, an anisotropic etch is performed on the dielectric layer 1006' and the oxide layer 1007'. As shown in FIG. 21B, the sidewall of the oxide layer 1007' is partially rounded after the anisotropic etch. In FIG. 21C, the anisotropic etch is controlled to remove the oxide layer 1007' and the dielectric layer 1006' surrounding at the sidewalls of the Si nanowire 102' to an extent that a bottom spacer 1008' forms as a residual of the isotropic etch operation. The bottom spacer 1008' is composed of remaining dielectric layer 1006' between the remaining oxide layer 1007' and a sidewall of the bottom Si nanowire 102B'. A height SP' of the bottom spacer 1008B' is measured from an STI 101 top to the bottom spacer 1008B' top. In some embodiments, the bottom spacer 1008' is controlled to at least partially surround the bottom Si nanowire 102B'. Alternatively stated, if the distance CH' is measured from the STI 101 top to the bottom Si nanowire 102B' top, a difference between the distance CH' and the height SP' shall be a positive number smaller than a thickness H1 of the bottom Si nanowire 102B'.

Figures 22A, 22B, 22C:
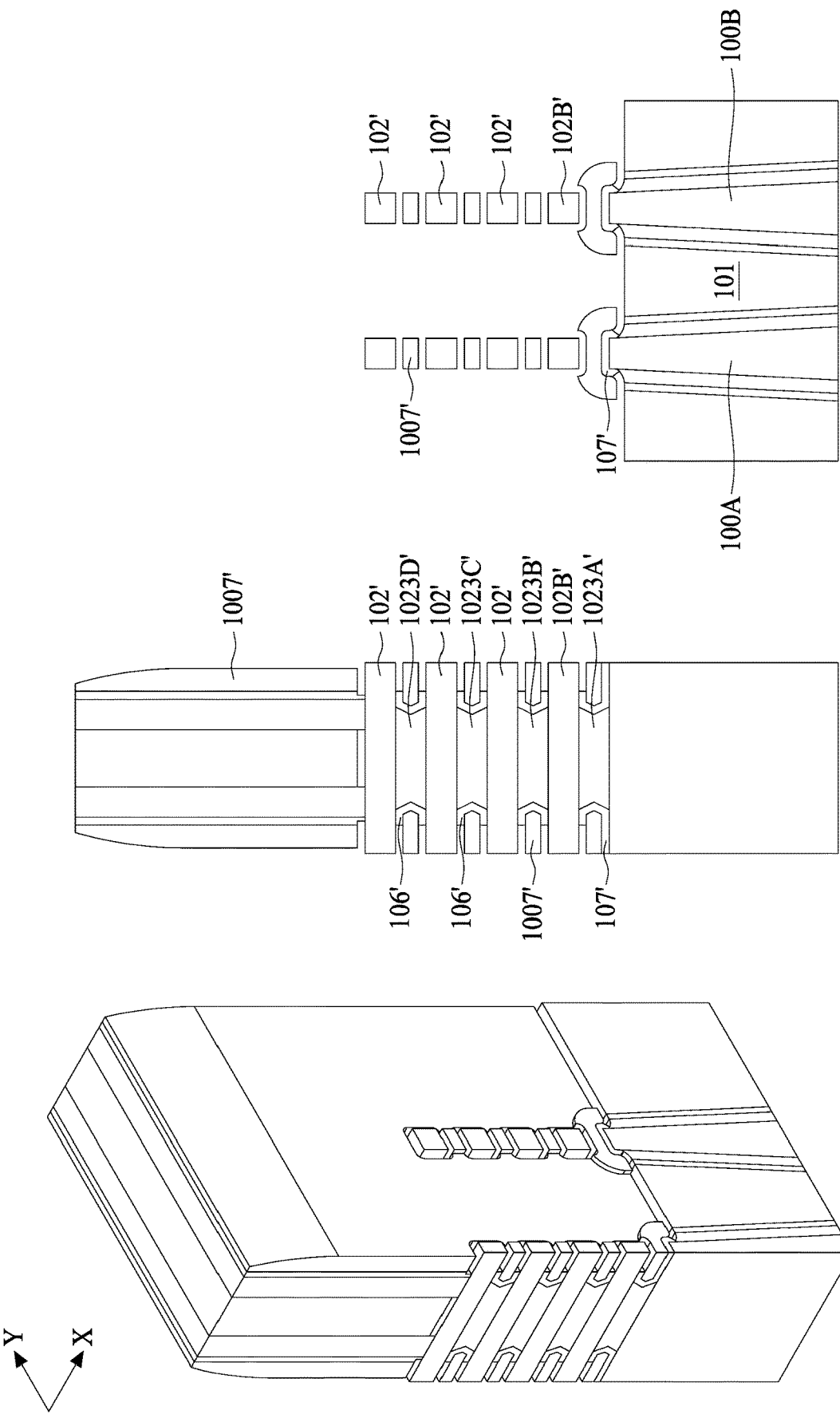

In FIG. 22A to FIG. 22C, an isotropic etch is performed to remove a portion of the dielectric layer 1006' not in contact with the top surface 100T of the semiconductor fins 100A, 100B. As shown in FIG. 22B, the dielectric layer 1006' surrounding the Si nanowires 102', excluding the bottom Si nanowire 102B', is removed by the isotropic etch, for example, a wet etch operation which removes low-k or nitride materials. Only the dielectric layer 1006' between the top surface 100T and the bottom of the bottom Si nanowire 102B' is not removed by the isotropic etch. The aforesaid portion of the dielectric layer 1006' turns in to the isolation layer 107' in the final structure. As previously stated, the bottom spacer 1008' is controlled to at least partially surround the bottom Si nanowire 102B'. The oxide layer 1007' of the bottom spacer 1008' functions as a hardmask to the isolation layer 107' so as to prevent the complete removal of the remaining dielectric layer 1006' during the isotropic etch operation.

In FIG. 23A to FIG. 23C, the remaining oxide layer 1007' at the bottom spacer 1008' and at the sidewall of the dummy gate 1030' are removed by an oxide wet etch operation. In FIG. 24A to FIG. 24C, a source/drain 105' is formed within a first source region and a first drain region, such as through an epitaxial growth technique, to create a first source and a first drain for the silicon nanowire NFET. In some embodiments, the source/drain 105' is composed of SiP. As shown in FIG. 24C, the source/drain 105' possesses faceted boundaries as a result of limiting epitaxial growth rate in certain particular crystal directions. In FIG. 25A to FIG. 25C, a replacement gate 103' is formed to complete the NFET. After removal of the dummy gate 1030' and the patterned silicon germanium stacks 1023A', 1023B', 1023C', and 1023D', an interfacial layer material, a high-k dielectric layer, a titanium nitride capping layer, a work function metal layer, and tungsten gate metal can be formed around as well as over the plurality of Si nanowires 102'. An etch stop layer 108' and an interlayer dialectic (ILD) 109' is further formed to cover the source/drain 105' and the seal spacer 1004' of the replacement gate 103'.

Some embodiments provide a gate-all-around structure having a first transistor. The first transistor includes a semiconductor substrate having a top surface, and a first nanostructure over the top surface of the semiconductor substrate and between a first source and a first drain. The first transistor also includes a first gate structure around the first nanostructure, and an inner spacer between the first gate structure and the first source, wherein an interface between the inner spacer and the first gate structure is non-flat. The first transistor includes an isolation layer between the top surface of the semiconductor substrate and the first source and the first drain.

Some embodiments provide a semiconductor structure including a fin extended above a semiconductor substrate. The semiconductor structure includes a plurality of first nanostructures over the fin, and a first source wrapping around the plurality of first nanostructure. The semiconductor structure includes an isolation layer in contact with an extended top surface of the fin, and the isolation layer is separating a bottom nanostructure of the plurality of first nanostructures from the top surface of the semiconductor substrate.

Some embodiments provide a semiconductor structure. The semiconductor structure includes a plurality of nanostructures formed over a substrate, and a source wrapping around the plurality of nanostructures at a longitudinal end of the plurality of nanostructures. The semiconductor structure includes a gate structure around the plurality of nanostructures, and an inner spacer between the gate structure and the source. The inner spacer has a C-shaped structure with a recessed central portion, and a portion of the source is embedded in the recessed central portion.

FIGS. 26A-33C show perspective representations of various stages of forming a semiconductor device structure, in accordance with some embodiments of the disclosure. The semiconductor device structure is a gate all around (GAA) transistor structure. In some embodiments, the semiconductor device structure is a p-type gate-all-around structure a PFET. FIG. 26B-33B show cross-sectional views of the semiconductor device structure along B-B' line in an X-direction, in accordance with some embodiments of the disclosure. FIGS. 26C-33C show cross-sectional views of the semiconductor device structure along C-C' line in a Y-direction, in accordance with some embodiments of the disclosure. Some processes and materials used to form the semiconductor device structure in FIG. 26A-33C are similar to, or the same as, those used to form the semiconductor device structure in FIGS. 11A-17C and are not repeated herein.

As shown in FIGS. 26A, 26B and 26C, the semiconductor device structure of FIG. 26A is similar to the semiconductor device structure of FIG. 11A. The dielectric layer 1006 is formed on the sidewalls of the seal spacer 1004, and sidewalls of the faceted crystal surfaces (111) of the patterned silicon stacks 1023A, 1023B, 1023C, and 1023D, and surrounding the plurality of SiGe nanowires (nanostructures) 102.

The portion of the dielectric layer 1006 formed at the sidewall of the faceted crystal surfaces (111) of the patterned silicon stacks 1023A, 1023B, 1023C, 1023D is called the inner spacer 106. The portion of the dielectric layer 1006 formed at the top surface 100T of the fins 100A, 100B or substrate 100 is called the isolation layer 107. In some embodiments, the inner spacer 106 has a C-shaped structure. The isolation layer 107 is directly below the inner spacer 106.

Each of the SiGe nanowires 102 is surrounded by the inner spacer 106. The inner spacer 106 surrounds the bottom SiGe nanowire 102B. In addition, the bottom SiGe nanowire 102B is in contact with the isolation layer 107 over the top surface 100T of the semiconductor fins 100A, 100B.

Figure 27C:
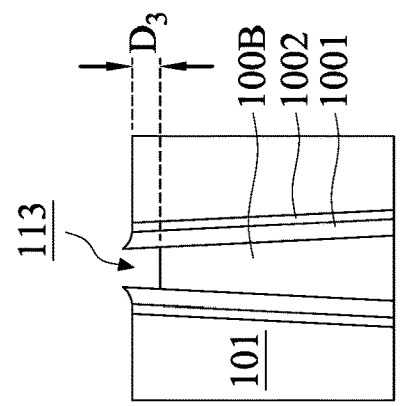
Figure 27B:
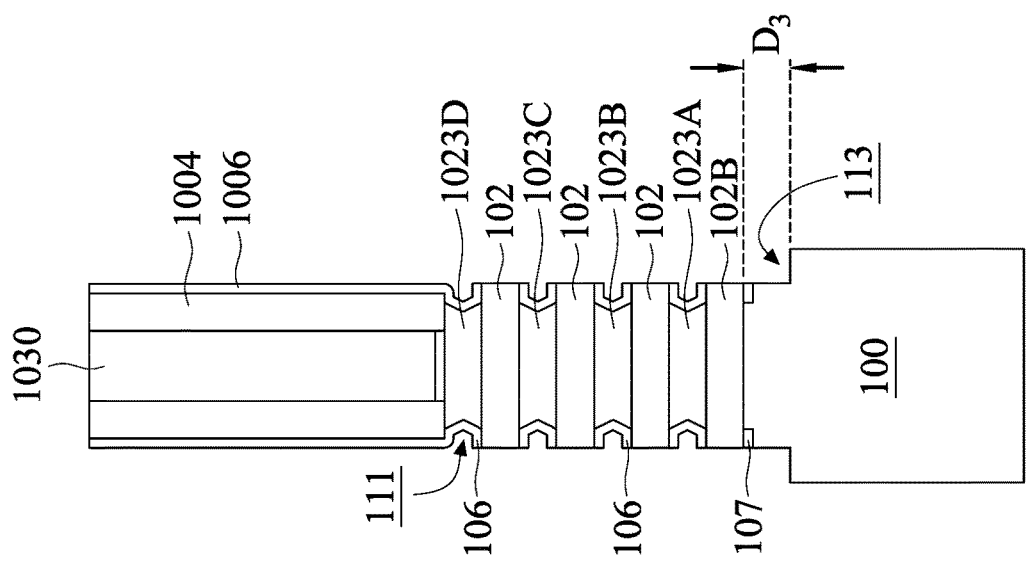
Figure 27A:
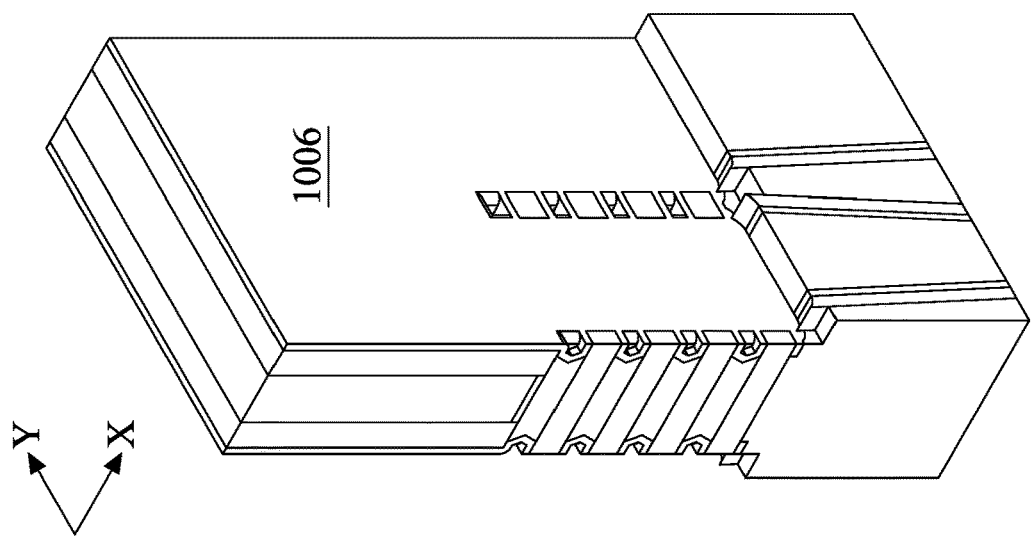

Afterwards, as shown in FIGS. 27A, 27B and 27C, a portion of the SiGe nanowires 102, a portion of the inner spacer 106, and a portion of the semiconductor fins 100A, 100B are sequentially removed, in accordance with some embodiments of the disclosure.

In some embodiments, the portion of the SiGe nanowires 102, the portion of the inner spacer 106, and the portion of the semiconductor fins 100A, 100B are removed by performing multiple etching processes. In some embodiments, a first etching process is performed to remove the portion of the SiGe nanowires 102. A second etching process is then performed to remove the portion of the inner spacer 106. A third etching process is performed to remove the portion of the semiconductor fins 100A, 100B. As such, a recess 111 is formed in a center of the C-shaped inner spacer 106. A recess 113 is formed below the bottom surface of the bottom SiGe nanowire 102B, and above the etched top surface of the semiconductor fins 100A, 100B. In some embodiments, the recess 113 has a depth $D_3$ in a range from about 10 nm to about 20 nm.

Figure 28C:
Figure 28B:
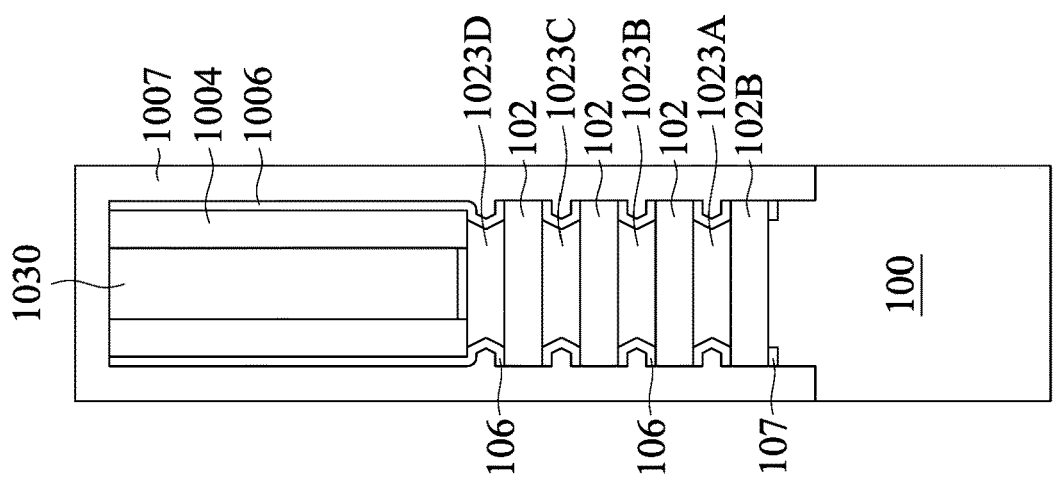
Figure 28A:
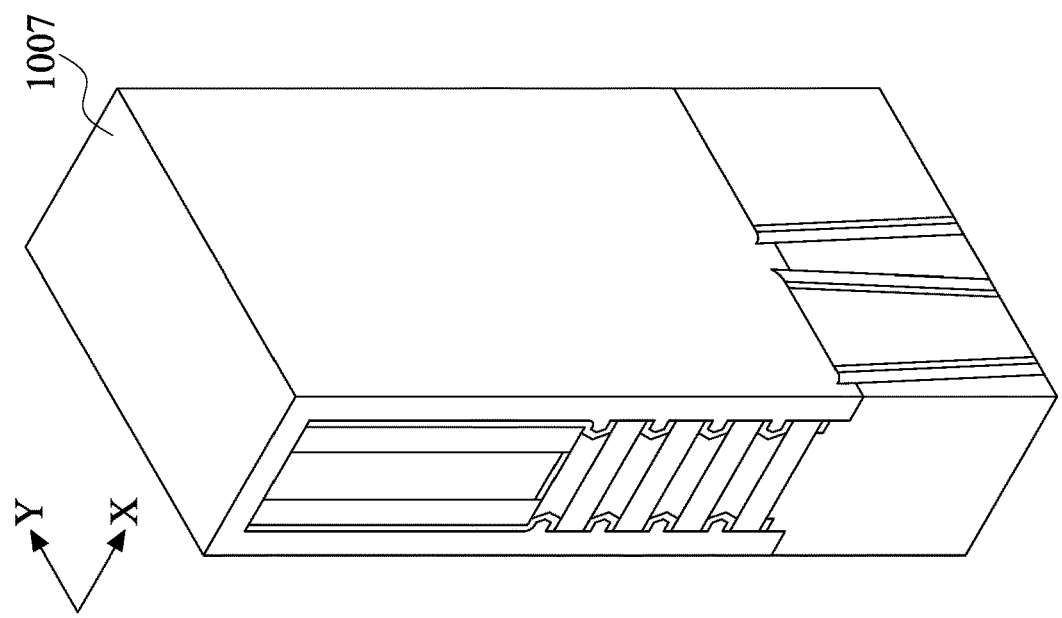

Afterwards, as shown in FIGS. 28A, 28B and 28C, the oxide layer 1007 is formed on the dielectric layer 1006 and on the semiconductor fins 100A, 100B, in accordance with some embodiments of the disclosure. In addition, the oxide layer 1007 fills into the recess 111 and recess 113. More specifically, the oxide layer 1007 is formed in the recess 111 between two adjacent SiGe nanowires 102. The bottom surface of the oxide layer 1007 is lower than the bottom surface of the isolation layer 107. In some embodiments, the dielectric layer 1006 and the oxide layer 1007 are made of different materials. In other words, the inner spacer 106 and the oxide layer 1007 are made of different materials. The isolation layer 107 and the oxide layer 1007 are made of different materials. In some embodiments, the oxide layer 1007 is made of silicon oxide, low-k oxide or another applicable material.

Next, as shown in FIGS. 29A, 29B and 29C, a portion of the oxide layer 1007 is removed, in accordance with some embodiments of the disclosure. As a result, the SiGe nanowires 102 are exposed, and a portion of the inner spacer 106 is exposed.

The portion of the oxide layer 1007 outside of the recess 111 is removed, and the remaining portion of the oxide layer 1007 is remaining in the recess 111. In some embodiments, the outer sidewall surface of the remaining oxide layer 1007 is substantially aligned with the outer sidewall surface of the inner spacer 106. In some embodiments, the outer sidewall surface of the remaining oxide layer 1007 is substantially aligned with the outer sidewall surface of the SiGe nanowires 102.

In some embodiments, the top surface of the remaining oxide layer 1007 which is in direct contact with the substrate 100 is substantially level with the top surface of the isolation layer 107. In some other embodiments, the top the top surface of the remaining oxide layer 1007 which is in direct contact with the substrate 100 is higher than the top surface of the isolation layer 107.

Figure 30C:
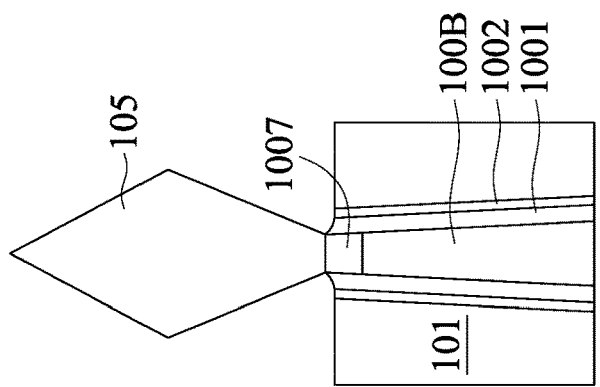
Figure 30B:
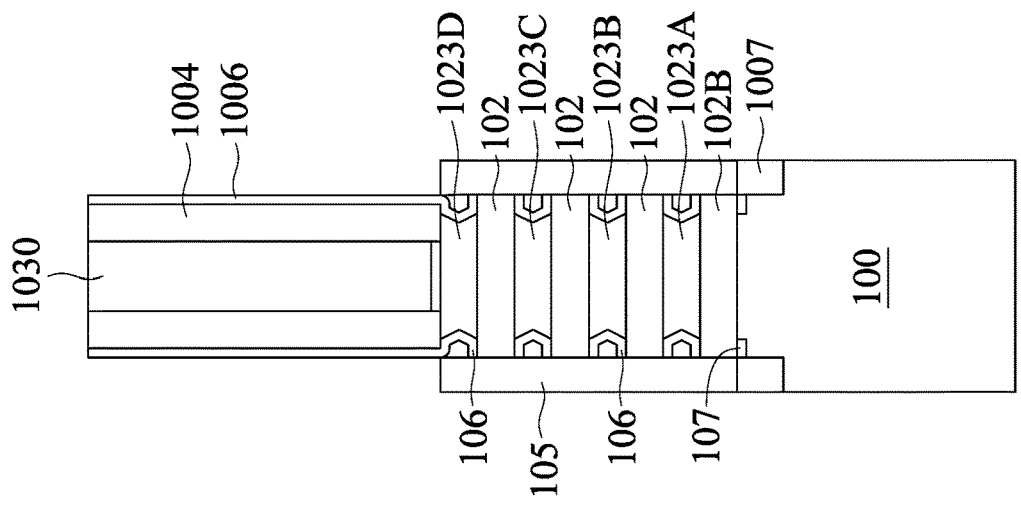
Figure 30A:
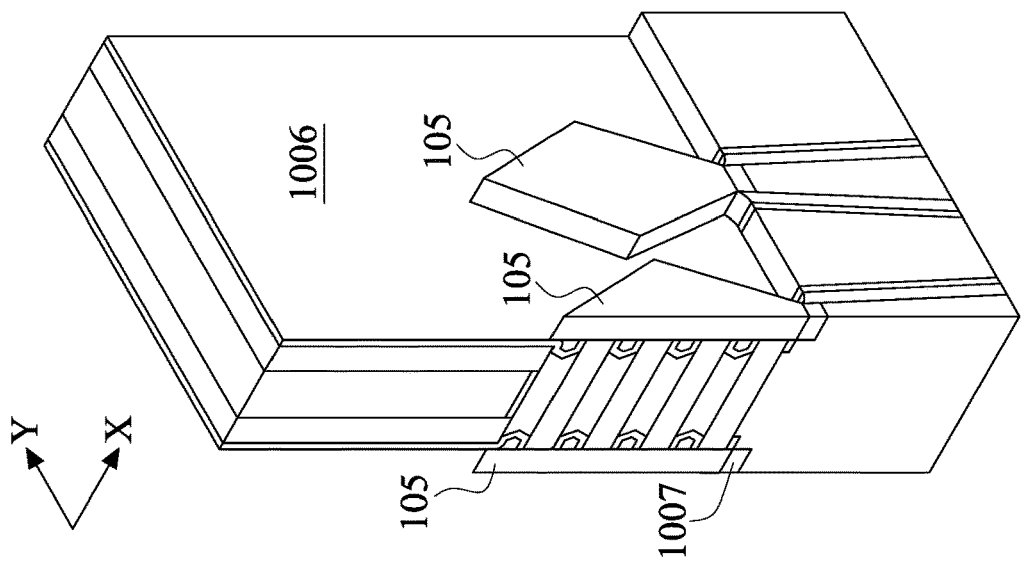

Subsequently, as shown in FIGS. 30A, 30B and 30C, the S/D structure 105 is formed to surround the SiGe nanowire 102, in accordance with some embodiments of the disclosure.

The S/D structure 150 may include silicon germanium (SiGe), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof. The S/D structure 150 may doped with one or more dopants. In some embodiments, the S/D structure 150 is silicon (Si) doped with phosphorus (P), arsenic (As), antimony (Sb), or another applicable dopant. Alternatively, one of the S/D structure 150 is silicon germanium (SiGe) doped with boron (B) or another applicable dopant.

In some embodiments, the S/D structure 150 is formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

Figure 31C:
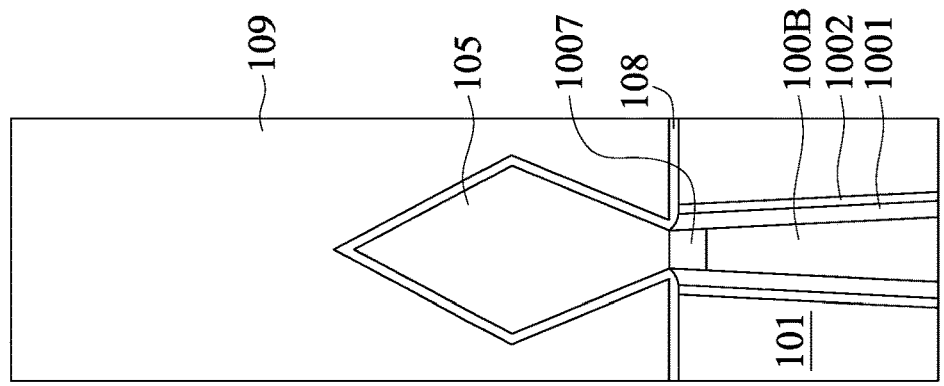
Figure 31B:
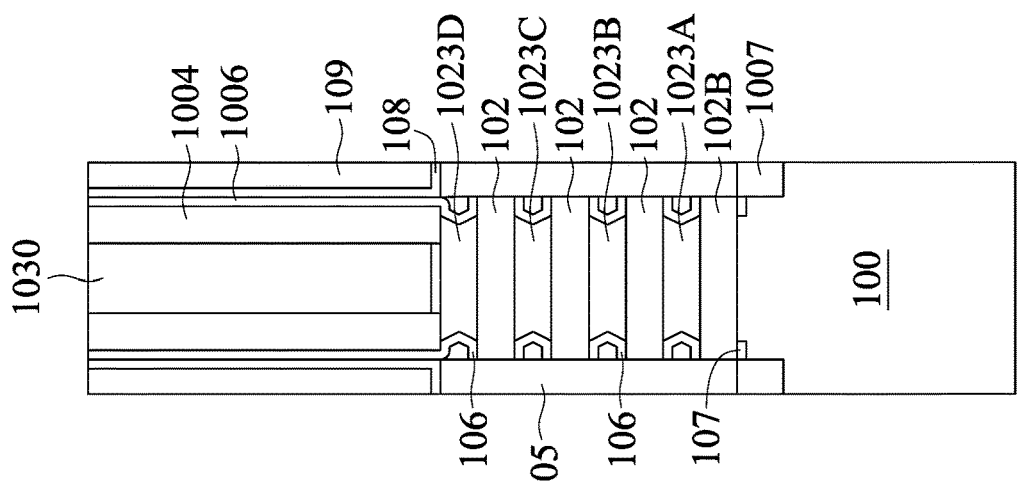
Figure 31A:
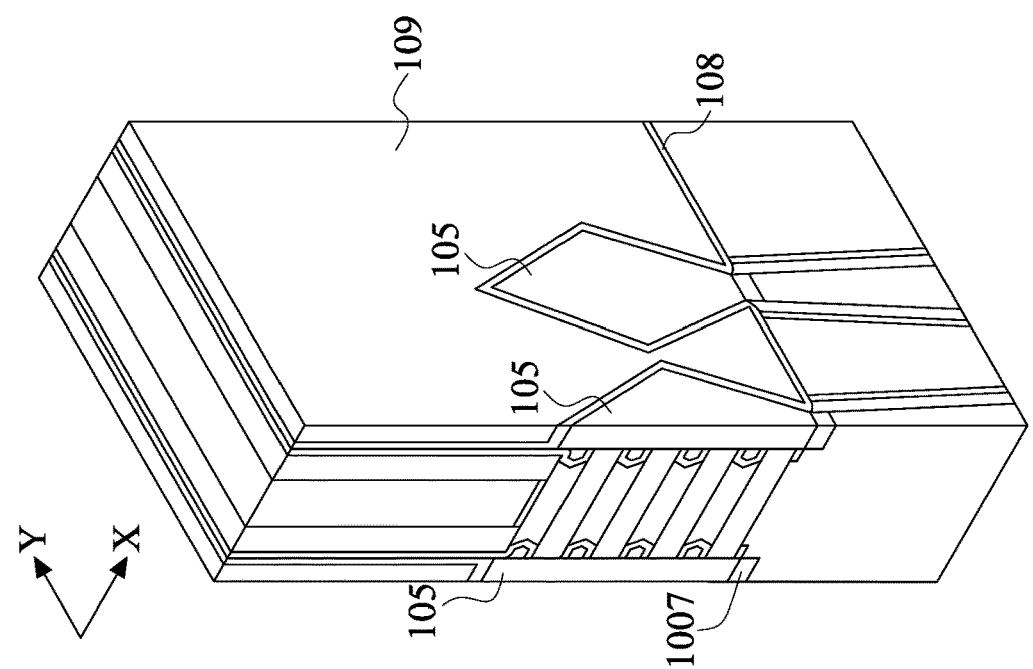

Afterwards, as shown in FIGS. 31A, 31B and 31C, the etch stop layer (ESL) 108 is formed over the S/D structures 105, and the interlayer dielectric (ILD) 109 is formed over the ESL 108, in accordance with some embodiments.

The ESL 108 is between the S/D structures 105 and the ILD 109. In some embodiments, the ESL 108 is made of silicon nitride, silicon oxynitride, and/or other applicable materials. The ESL 108 may be formed by plasma enhanced chemical vapor deposition (CVD) process, low pressure CVD process, atomic layer deposition (ALD) process, or another applicable processes.

The ILD 109 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD 109 may be formed by chemical vapor deposition (CVD), physical vapor deposition, (PVD), atomic layer deposition (ALD), spin-on coating, or other applicable processes.

Afterwards, as shown in FIGS. 32A, 32B and 32C, the dummy gate 1030 and the patterned silicon stacks 1023A, 1023B, 1023C and 1023D are removed to form holes 1031.

Next, as shown in FIGS. 33A, 33B and 33C, the gate 103 is filled into the holes 1031, in accordance with some embodiments of the disclosure.

The gate 103 includes an interfacial layer 103a, a gate dielectric layer 103b and a gate electrode layer 103c. The interfacial layer 103a is conformally formed along the main surfaces of the SiGe nanowires 102 to surround the SiGe nanowires 102. In some embodiments, the interfacial layer 103a is made of a chemically formed silicon oxide.

In some embodiments, the gate dielectric layer 103b is a high-k dielectric layer. In some embodiments, the high-k gate dielectric layer is made of one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the high-k gate dielectric layer 103b is formed using CVD, ALD, another suitable method, or a combination thereof.

The gate electrode layer 103c is formed on the gate dielectric layer 103b. In some embodiments, the gate electrode layer 103c is made of one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layer 103c is formed using CVD, ALD, electroplating, another suitable method, or a combination thereof.

It should be noted that the oxide layer 107 is between the S/D structure 105 and the substrate 100. The oxide layer 107 can suppress leakage from the S/D structure 105 to the substrate 100. In addition, a portion of the oxide layer 107 is formed in the recessed central portion of the C-shaped inner spacer 106, and the portion of the oxide layer 107 can be as a barrier between the S/D structure 105 and the gate 103. The barrier can reduce the parasitic capacitance between the S/D structure 105 and the gate 103. Therefore, the performance of the semiconductor device structure is improved.

FIGS. 34A-36C show perspective representations of various stages of forming a semiconductor device structure, in accordance with some embodiments of the disclosure. Some processes and materials used to form the semiconductor device structure in FIG. 34A-36C are similar to, or the same as, those used to form the semiconductor device structure in FIGS. 11A-17C and are not repeated herein.

The semiconductor device structure of FIG. 34A is similar to the semiconductor device structure of FIG. 29A, the differences between FIG. 34A and FIG. 29A are that the top surface of the oxide layer 1007 is higher than the top surface of the isolation layer 107. In addition, the top surface of the oxide layer 1007 is higher than the bottom surface of the bottom surface of the bottom SiGe nanowire 102B.

Figure 35C:
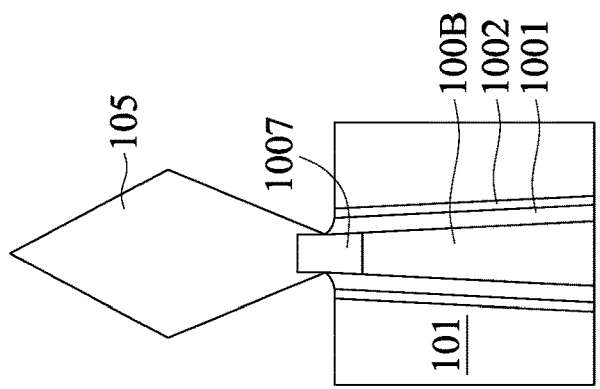
Figure 35B:
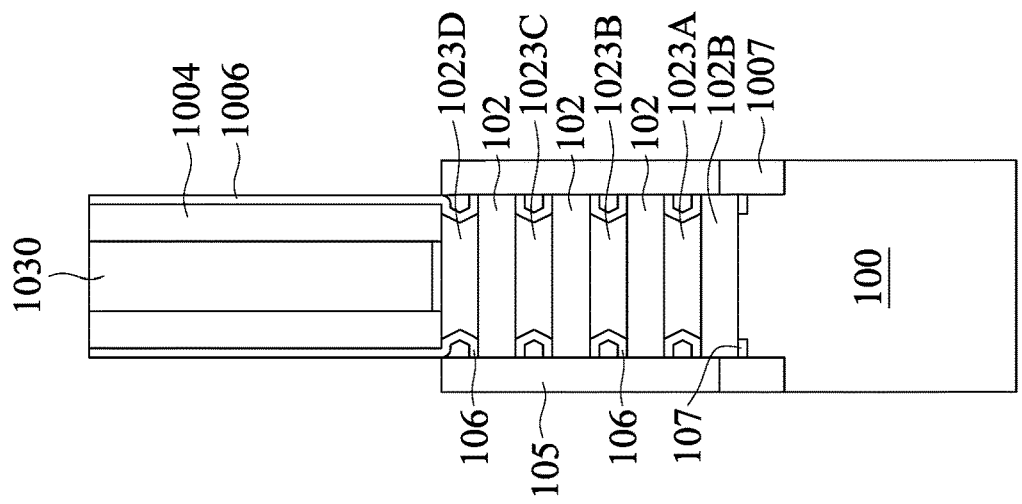
Figure 35A:
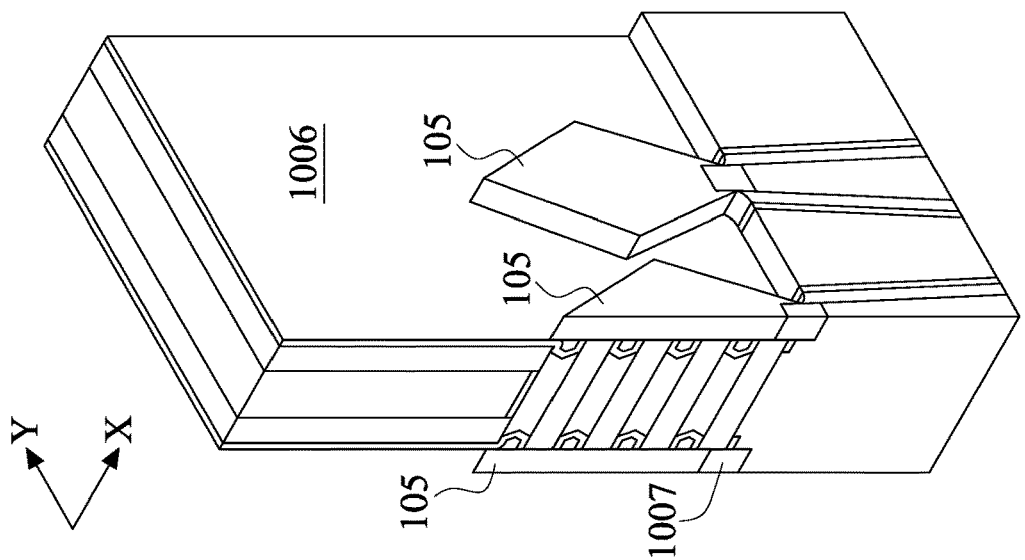

Afterwards, as shown in FIGS. 35A, 35B and 35C, the S/D structure 105 is formed to surround the SiGe nanowire 102, in accordance with some embodiments of the disclosure.

Next, as shown in FIGS. 36A, 36B and 36C, the gate 103 is filled into the holes 1031, in accordance with some embodiments of the disclosure. The top surface of the oxide layer 1007 is higher than the bottommost surface of the bottom SiGe nanowire (or nanostructure) 102B. In other embodiments, the top surface of the oxide layer 1007 is higher than the bottommost surface of the gate 103.

FIGS. 37A-42C show perspective representations of various stages of forming a semiconductor device structure, in accordance with some embodiments of the disclosure. The semiconductor device structure is a gate all around (GAA) transistor structure. In some embodiments, the semiconductor device structure is a n-type gate-all-around structure a NFET. Some processes and materials used to form the semiconductor device structure in FIG. 37A-42C are similar to, or the same as, those used to form the semiconductor device structure in FIGS. 18A-25C and are not repeated herein.

The semiconductor device structure of FIG. 37A is similar to the semiconductor device structure of FIG. 19A. As shown in FIG. 37A, the dielectric layer 1006' is conformably formed over the sidewall of the seal spacer 1004', the sidewall of the faceted crystal surfaces (111) of the patterned silicon germanium (SiGe) stacks 1023A', 1023B', 1023C', and 1023D', and surrounding the plurality of Si nanowires 102'. In some embodiments, the dielectric layer 1006' includes isolation materials, for example, low-k dielectric or silicon nitrides. The portion of the dielectric layer 1006' formed at the sidewall of the faceted crystal surfaces (111) of the patterned germanium stacks 1023A', 1023B', 1023C', and 1023D' is called inner spacer 106'. The portion of the dielectric layer 1006' formed at the top surface 100T of the fins 100A, 100B or substrate 100 is called isolation layer 107'.

As shown in FIG. 38A, a portion of the Si nanowires 102', a portion of the inner spacer 106', and a portion of the semiconductor fins 100A, 100B are sequentially removed, in accordance with some embodiments of the disclosure.

In some embodiments, the portion of the Si nanowires 102', the portion of the inner spacer 106', and the portion of the semiconductor fins 100A, 100B are removed by performing multiple etching processes. In some embodiments, a first etching process is performed to remove the portion of the Si nanowires 102'. A second etching process is then performed to remove the portion of the inner spacer 106'. A third etching process is performed to remove the portion of the semiconductor fins 100A, 100B. As such, a recess 111' is formed in a center of the C-shaped inner spacer 106. A recess 113' is formed below the bottom surface of the bottom Si nanowire 102B', and above the etched top surface of the semiconductor fins 100A, 100B.

Figure 39C:
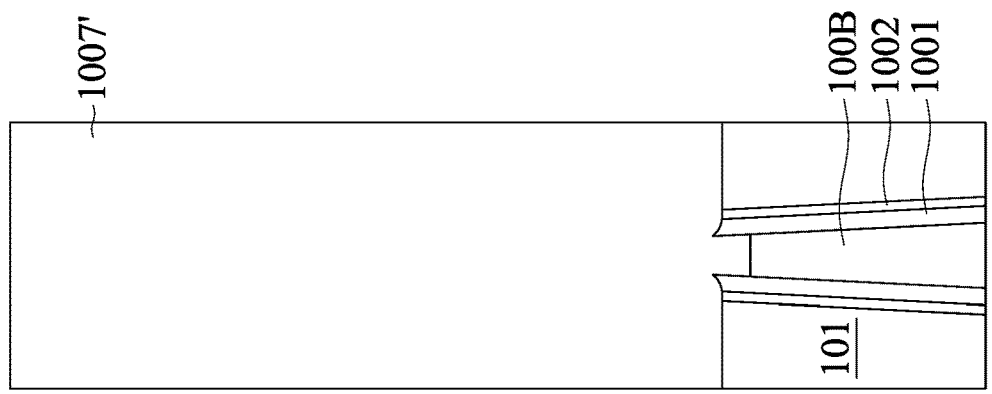
Figure 39B:
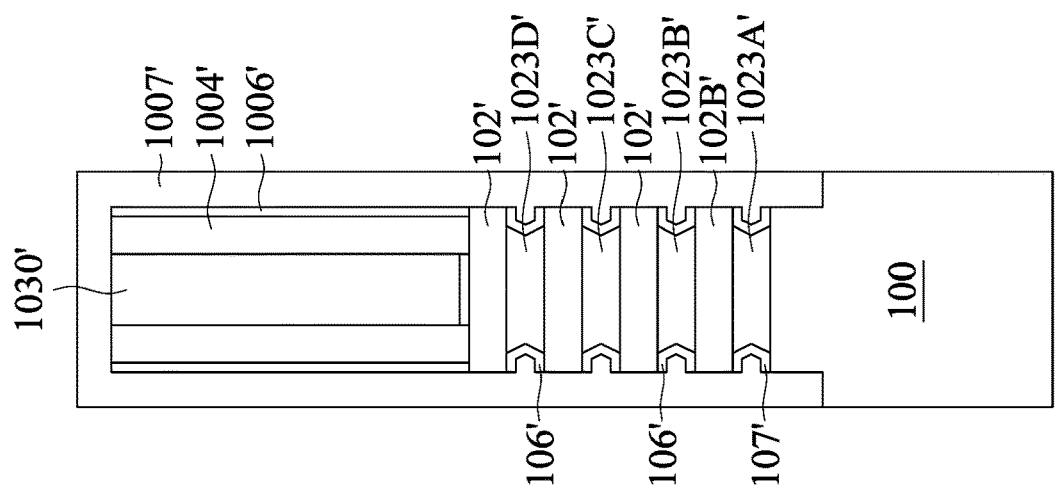
Figure 39A:
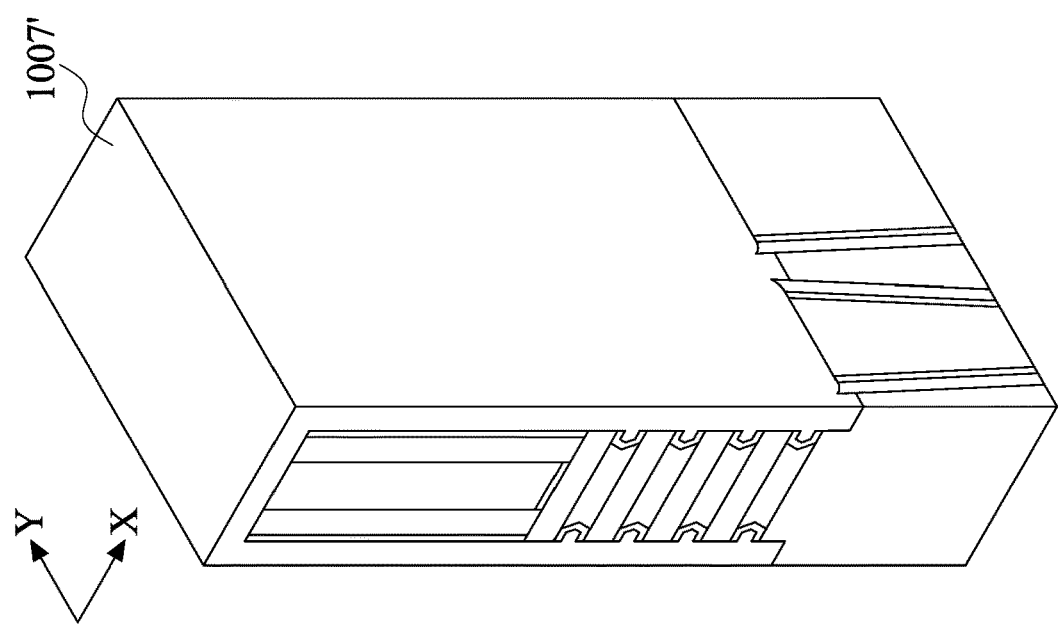

Afterwards, as shown in FIGS. 39A, 39B and 39C, an oxide layer 1007' is formed on the dielectric layer 1006' and on the semiconductor fins 100A, 100B, in accordance with some embodiments of the disclosure. In addition, the oxide layer 1007' fills into the recess 111' and recess 113'. More specifically, the oxide layer 1007' is formed in the recess 111' between two adjacent Si nanowires 102'. The bottom surface of the oxide layer 1007' is lower than the bottom surface of the isolation layer 107. In some embodiments, the dielectric layer 1006' and the oxide layer 1007' are made of different materials. In other words, the inner spacer 106' and the oxide layer 1007' are made of different materials. The isolation layer 107' and the oxide layer 1007' are made of different materials. In some embodiments, the oxide layer 1007' is made of silicon oxide, low-k oxide or another applicable material.

Next, as shown in FIGS. 40A, 40B and 40C, a portion of the oxide layer 1007' is removed, in accordance with some embodiments of the disclosure. As a result, the Si nanowires 102' are exposed, and a portion of the inner spacer 106 is exposed.

The portion of the oxide layer 1007' outside of the recess 111' is removed, and the remaining portion of the oxide layer 1007' is remaining in the recess 111'. In some embodiments, the outer sidewall surface of the remaining oxide layer 1007' is substantially aligned with the outer sidewall surface of the inner spacer 106'. In some embodiments, the outer sidewall surface of the remaining oxide layer 1007' is substantially aligned with the outer sidewall surface of the Si nanowire 102B'.

In some embodiments, the top surface of the remaining oxide layer 1007' which is in direct contact with the substrate 100 is higher than the bottommost surface of the isolation layer 107'. In some embodiments, the top surface of the remaining oxide layer 1007' which is in direct contact with the substrate 100 is higher than the bottommost surface of the patterned SiGe stacks 1023A', 1023B', 1023C' and 1023D'.

Figure 41C:
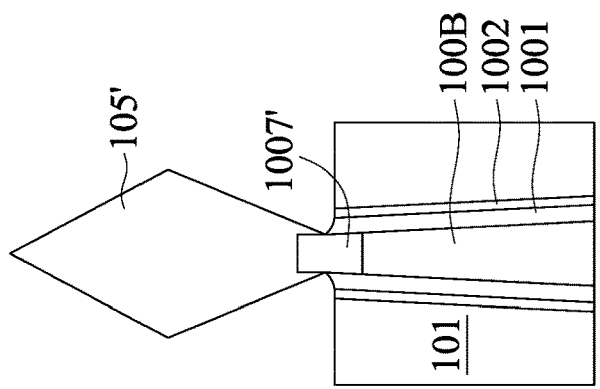
Figure 41B:
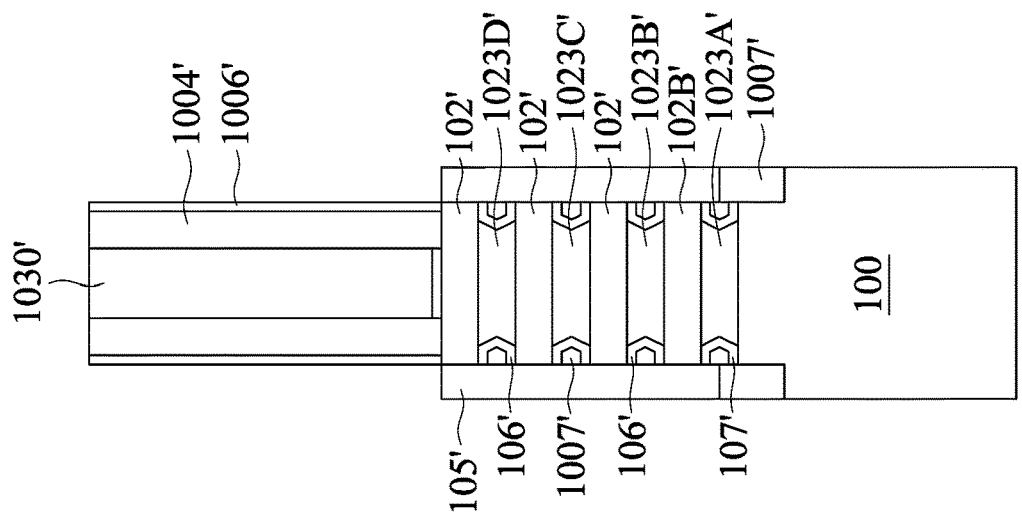
Figure 41A:
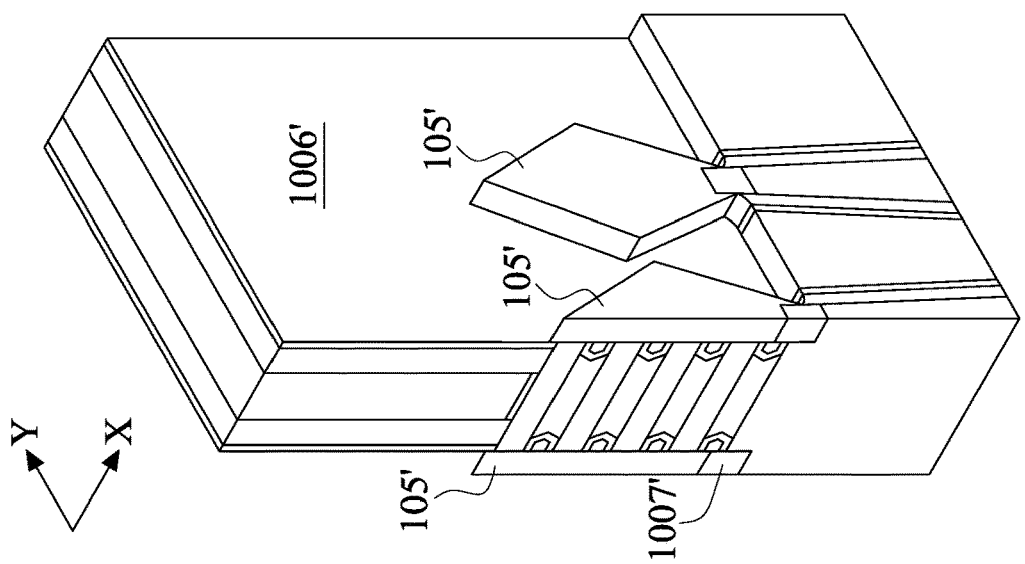

Subsequently, as shown in FIGS. 41A, 41B and 41C, the S/D structure 105' is formed to surround the Si nanowires 102, in accordance with some embodiments of the disclosure.

Afterwards, as shown in FIGS. 42A, 42B and 42C, the gate 103' is formed to replace the dummy gate 1030 and the patterned SiGe stacks 1023A', 1023B', 1023C' and 1023D', in accordance with some embodiments of the disclosure. The top surface of the oxide layer 1007' is higher than the bottommost surface of the gate 103'.

Embodiments for forming a semiconductor device structure and method for formation the same are provided. The semiconductor device structure includes an oxide layer between the S/D structure and the substrate. The oxide layer can suppress leakage from the S/D structure to the substrate. In addition, a portion of the oxide layer is formed in the recessed central portion of the C-shaped inner spacer, and the portion of the oxide layer can be as a barrier between the S/D structure and the replacement gate. The barrier can reduce the parasitic capacitance between the S/D structure and the replacement gate. Therefore, the performance of the semiconductor device structure is improved.

In some embodiments, a semiconductor device structure is provided. The semiconductor device structure includes an isolation layer formed over a substrate, and a plurality of nanostructures formed over the isolation layer. The semiconductor device structure includes a gate structure wrapped around the nanostructures, and an S/D structure wrapped around the nanostructures. The semiconductor device structure includes a first oxide layer between the substrate and the S/D structure, the first oxide layer and the isolation layer are made of different materials, and the first oxide layer is in direct contact with the isolation layer.

In some embodiments, a semiconductor device structure is provided. The semiconductor device structure includes an isolation layer formed over a substrate, and a plurality of nanostructures formed over the isolation layer. The semiconductor device structure includes a gate structure wrapped around the nanostructure, and an S/D structure wrapped around the nanostructure. The semiconductor device structure also includes an inner spacer between the gate structure and the S/D structure, and the inner spacer comprises a recessed portion. The semiconductor device structure includes a first oxide layer formed in the recessed portion of the inner spacer, and the first oxide layer and the inner spacer are made of different materials.

In some embodiments, a method for forming a semiconductor device structure is provided. The method includes forming a stack structure over a substrate, and the stack structure includes a plurality of first semiconductor layers and a plurality of second semiconductor layers stacked in a vertical direction. The method includes removing a portion of the second semiconductor layers to form a plurality of recesses, and forming a plurality of inner spacers in the recesses. The method also includes removing a portion of the inner spacers and a portion of the first semiconductor layers, and forming an oxide layer on the inner spacers and on sidewall surfaces of the first semiconductor layers. The method also includes removing a portion of the oxide layer to form exposed sidewall surfaces of the first semiconductor layers, and forming an S/D structure on the exposed sidewall surfaces of the first semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   an isolation layer formed over a substrate;
   a plurality of nanostructures formed over the isolation layer;
   a gate structure wrapped around the nanostructures;
   an S/D structure wrapped around the nanostructures; and
   a first oxide layer between the substrate and the S/D structure, wherein the first oxide layer and the isolation layer are made of different materials, and the first oxide layer is in direct contact with the isolation layer, and a top surface of the first oxide layer is higher than a bottommost surface of the nanostructures.

2. The semiconductor device structure as claimed in claim 1, further comprising:
   an inner spacer between the gate structure and the S/D structure, wherein the inner spacer and the isolation layer are made of the same material.

3. The semiconductor device structure as claimed in claim 2, wherein the inner spacer has a C-shaped structure with a recessed central portion, and a second oxide layer is formed in the recessed central portion.

4. The semiconductor device structure as claimed in claim 3, wherein the second oxide layer is in direct contact with the S/D structure.

5. The semiconductor device structure as claimed in claim 1, wherein the first oxide layer is in direct contact with one of the nanostructures.

6. The semiconductor device structure as claimed in claim 1, wherein an interface between the first oxide layer and the S/D structure is substantially level with or higher than a top surface of the isolation layer.

7. The semiconductor device structure as claimed in claim 1, wherein a top surface of the first oxide layer is higher than a bottommost surface of the gate structure.

8. A semiconductor device structure, comprising:
   an isolation layer formed over a substrate;
   a plurality of nanostructures formed over the isolation layer;
   a gate structure wrapped around the nanostructure;
   an S/D structure wrapped around the nanostructure;
   an inner spacer between the gate structure and the S/D structure, wherein the inner spacer comprises a recessed portion; and
   a first oxide layer formed in the recessed portion of the inner spacer, wherein the first oxide layer and the inner spacer are made of different materials.

9. The semiconductor device structure as claimed in claim 8, wherein the first oxide layer is in direct contact with the S/D structure.

10. The semiconductor device structure as claimed in claim 8, wherein the first oxide layer is between the S/D structure and the inner spacer.

11. The semiconductor device structure as claimed in claim 8, further comprising:
 a second oxide layer between the substrate and the S/D structure, wherein the second oxide layer and the isolation layer are made of different materials, and the second oxide layer is in direct contact with the isolation layer.

12. The semiconductor device structure as claimed in claim 11, wherein the second oxide layer is between one of the nanostructures and the substrate.

13. The semiconductor device structure as claimed in claim 11, wherein an interface between the second oxide layer and the S/D structure is higher than a bottom surface of the gate structure.

14. The semiconductor device structure as claimed in claim 8, wherein the isolation layer and inner spacer are made of the same material, and the isolation layer is directly below the inner spacer.

15. A semiconductor device structure, comprising:
 an isolation layer formed over a substrate;
 a fin structure formed over an isolation structure;
 a plurality of nanostructures formed over the fin structure;
 a gate structure wrapped around the nanostructure;
 an inner spacer adjacent to the gate structure;
 an S/D structure adjacent to the inner spacer; and
 a first oxide layer directly below the S/D structure, wherein an interface between the S/D structure and the first oxide layer is in direct contact with a bottommost nanostructure, and a portion of the S/D structure is lower than a top surface of the first oxide layer.

16. The semiconductor device structure as claimed in claim 15, wherein the inner spacer has a recessed portion, a second oxide layer is formed in the recessed portion, and the first oxide layer and the second oxide layer are made of the same material.

17. The semiconductor device structure as claimed in claim 15, further comprising:
 a liner layer formed on a sidewall of the fin structure, wherein the liner layer is in direct contact with the first oxide layer.

18. The semiconductor device structure as claimed in claim 15, further comprising:
 a seal spacer adjacent to the gate structure; and
 a dielectric layer adjacent to the seal spacer, wherein the dielectric layer is in direct contact with the inner spacer.

19. The semiconductor device structure as claimed in claim 15, wherein a top surface of the first oxide layer is higher than a top surface of the isolation layer.

20. The semiconductor device structure as claimed in claim 1, wherein a portion of the S/D structure is lower than a top surface of the first oxide layer.

* * * * *